United States Patent
Licausi et al.

(10) Patent No.: US 10,002,786 B1
(45) Date of Patent: Jun. 19, 2018

(54) INTERCONNECTION CELLS HAVING VARIABLE WIDTH METAL LINES AND FULLY-SELF ALIGNED VARIABLE LENGTH CONTINUITY CUTS

(71) Applicant: GLOBALFOUNDRIES Inc., Grand Cayman (KY)

(72) Inventors: Nicholas Vincent Licausi, Watervliet, NY (US); Guillaume Bouche, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/379,707

(22) Filed: Dec. 15, 2016

(51) Int. Cl.
*H01L 21/768* (2006.01)
*H01L 21/033* (2006.01)
*H01L 23/532* (2006.01)
*H01L 23/528* (2006.01)
*H01L 23/522* (2006.01)

(52) U.S. Cl.
CPC .. *H01L 21/76816* (2013.01); *H01L 21/76877* (2013.01); *H01L 23/528* (2013.01); *H01L 23/5226* (2013.01); *H01L 23/5286* (2013.01); *H01L 23/53209* (2013.01); *H01L 23/53228* (2013.01); *H01L 23/53242* (2013.01); *H01L 23/53257* (2013.01)

(58) Field of Classification Search
CPC ......... H01L 21/76816; H01L 21/76877; H01L 21/76897; H01L 21/768; H01L 21/202; H01L 21/208; H01L 21/0337; H01L 21/30625; H01L 23/53242; H01L 23/53209; H01L 23/53228; H01L 23/53257; H01L 23/5226; H01L 23/5286; H01L 23/528

USPC ............... 438/283, 618, 669, 692, 696, 703; 257/622, 758, 774, E21.215, E21.24, 257/E21.249, E21.259, E21.295, E21.579, 257/E23.01, E23.145

See application file for complete search history.

(56) References Cited

U.S. PATENT DOCUMENTS

| | | |
|---|---|---|
| 2,016,026 A | 10/1935 | Shinkle |
| 6,455,436 B1 | 9/2002 | Ueda et al. |
| 7,183,142 B2 | 2/2007 | Anderson et al. |

(Continued)

OTHER PUBLICATIONS

U.S. Appl. No. 15/077,384, filed Mar. 22, 2016.

(Continued)

*Primary Examiner* — Dao H Nguyen
(74) *Attorney, Agent, or Firm* — Heslin Rothenberg Farley & Mesiti P.C.; Stephen Scuderi

(57) ABSTRACT

A method includes providing a semiconductor structure having a mandrel layer and a hardmask layer disposed above a dielectric layer. A mandrel cell is patterned into the mandrel layer. An opening is etched into the hardmask layer. The opening is self-aligned with a sidewall of the mandrel. A refill layer is disposed over the structure and recessed down to a level that is below a top surface of the hardmask layer to form an opening plug that covers a bottom of the opening. The mandrel cell is utilized to form a metal line cell into the dielectric layer, the metal line cell having metal lines and a minimum line cell pitch. The opening plug is utilized to form a continuity cut in a metal line of the metal line cell. The continuity cut has a length that is larger than the minimum line cell pitch.

18 Claims, 38 Drawing Sheets

(56) References Cited

U.S. PATENT DOCUMENTS

| | | |
|---|---|---|
| 8,298,943 B1 | 10/2012 | Arnold et al. |
| 8,518,824 B2 | 8/2013 | Arnold et al. |
| 8,999,848 B2 | 4/2015 | Lee et al. |
| 9,012,287 B2 | 4/2015 | Liaw |
| 9,123,656 B1 | 9/2015 | Hsieh et al. |
| 9,136,106 B2 | 9/2015 | Wu et al. |
| 9,209,279 B1 | 12/2015 | Zhang et al. |
| 9,406,775 B1 | 8/2016 | Bouche et al. |
| 9,786,554 B1* | 10/2017 | Burns ............... H01L 21/76877 |
| 9,812,351 B1* | 11/2017 | Licausi ............. H01L 21/76816 |
| 9,852,986 B1* | 12/2017 | Stephens ............... H01L 23/528 |
| 9,881,794 B1* | 1/2018 | Su ....................... H01L 21/0338 |
| 2005/0215040 A1 | 9/2005 | Doyle |
| 2006/0055045 A1 | 3/2006 | Park et al. |
| 2008/0193658 A1 | 8/2008 | Millward |
| 2008/0227298 A1 | 9/2008 | Hirota |
| 2011/0240596 A1 | 10/2011 | Millward |
| 2011/0256723 A1 | 10/2011 | Lee et al. |
| 2011/0316125 A1 | 12/2011 | Thomas |
| 2012/0118854 A1 | 5/2012 | Smayling et al. |
| 2012/0132988 A1 | 5/2012 | Lui et al. |
| 2013/0196517 A1 | 8/2013 | Tsujita et al. |
| 2013/0244344 A1 | 9/2013 | Malmhall et al. |
| 2013/0329486 A1 | 12/2013 | Juengling |
| 2014/0024219 A1* | 1/2014 | Jung .................. H01L 21/0337 438/703 |
| 2014/0038428 A1 | 2/2014 | Huang et al. |
| 2014/0054534 A1 | 2/2014 | Pellizzer et al. |
| 2014/0170853 A1 | 6/2014 | Shamma et al. |
| 2014/0258961 A1 | 9/2014 | Ke et al. |
| 2014/0273363 A1 | 9/2014 | Chiu et al. |
| 2014/0273464 A1 | 9/2014 | Shieh et al. |
| 2015/0056800 A1 | 2/2015 | Mebarki et al. |
| 2015/0072527 A1 | 3/2015 | Ng et al. |
| 2015/0087149 A1 | 3/2015 | He et al. |
| 2015/0093899 A1* | 4/2015 | Huang ............... H01L 21/0337 438/692 |
| 2015/0108087 A1 | 4/2015 | Somervell et al. |
| 2015/0140811 A1 | 5/2015 | Huang et al. |
| 2015/0147882 A1* | 5/2015 | Yao ................... H01L 21/76879 438/675 |
| 2015/0179652 A1 | 6/2015 | Wang et al. |
| 2015/0243654 A1 | 8/2015 | Zhong et al. |
| 2015/0318173 A1 | 11/2015 | Shih et al. |
| 2015/0318181 A1 | 11/2015 | Cantone et al. |
| 2015/0339422 A1 | 11/2015 | Greco et al. |
| 2016/0049307 A1 | 2/2016 | Chen |
| 2016/0056075 A1 | 2/2016 | Wei et al. |
| 2016/0056104 A1 | 2/2016 | Bouche et al. |
| 2016/0064248 A1 | 3/2016 | Lee et al. |
| 2016/0086841 A1 | 3/2016 | Song et al. |
| 2016/0099178 A1 | 4/2016 | Zhang et al. |
| 2016/0225634 A1 | 8/2016 | Anderson et al. |
| 2016/0254191 A1 | 9/2016 | Tseng et al. |
| 2016/0307844 A1 | 10/2016 | Oh et al. |
| 2017/0062439 A1 | 3/2017 | Mojumder et al. |
| 2017/0140986 A1* | 5/2017 | Machkaoutsan .. H01L 21/76808 |
| 2017/0200717 A1 | 7/2017 | Huang et al. |
| 2017/0221702 A1* | 8/2017 | Lee ................... H01L 21/02068 |

OTHER PUBLICATIONS

U.S. Appl. No. 15/271,475, filed Sep. 21, 2016.
U.S. Appl. No. 15/271,497, filed Sep. 21, 2016.
U.S. Appl. No. 15/141,087, filed Apr. 28, 2016.
U.S. Appl. No. 15/379,605, filed Dec. 15, 2016.
U.S. Appl. No. 15/379,645, filed Dec. 15, 2016.
U.S. Appl. No. 15/379,740, filed Dec. 15, 2016.
U.S. Appl. No. 15/362,035, filed Nov. 28, 2016.
U.S. Appl. No. 15/271,519, filed Sep. 21, 2016.
U.S. Appl. No. 15/053,818, filed Feb. 25, 2016.
U.S. Appl. No. 15/077,480, filed Mar. 22, 2016.
U.S. Appl. No. 15/077,564, filed Mar. 22, 2016.

* cited by examiner

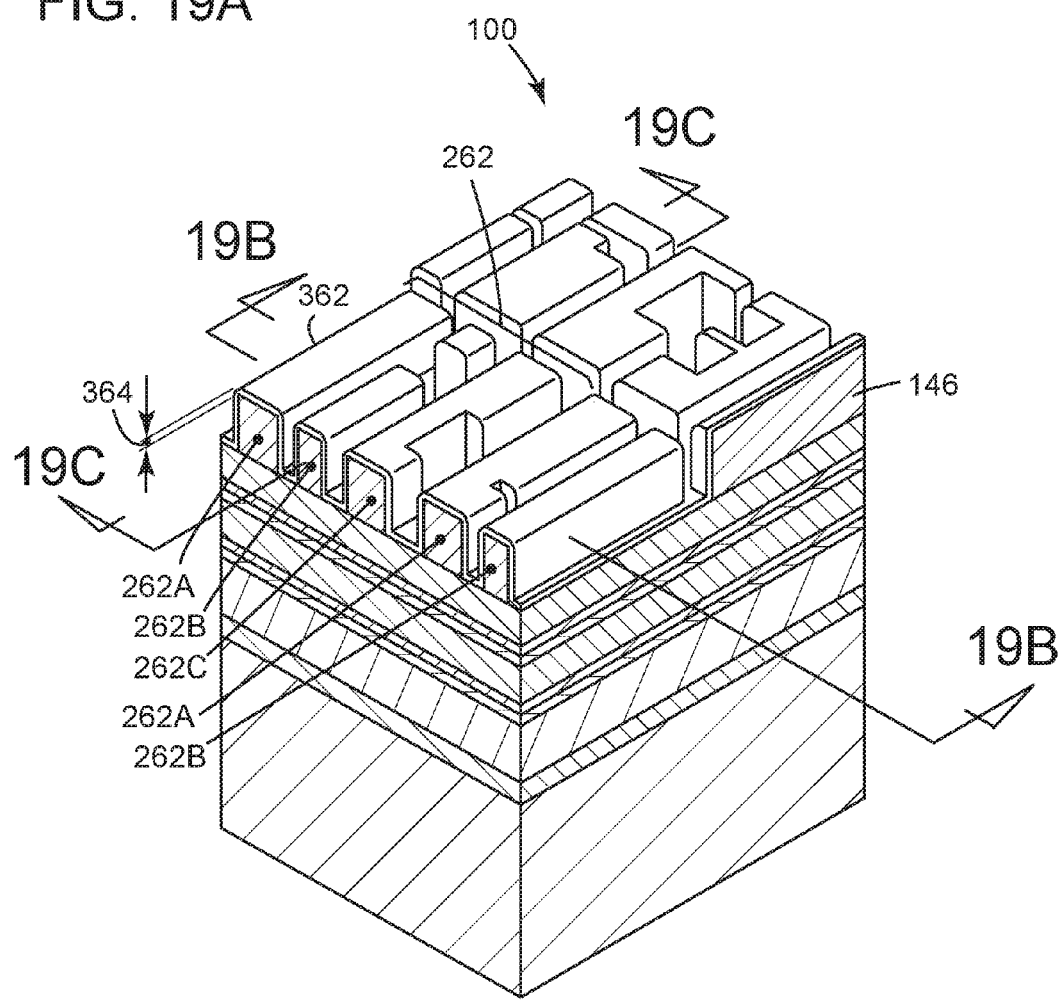

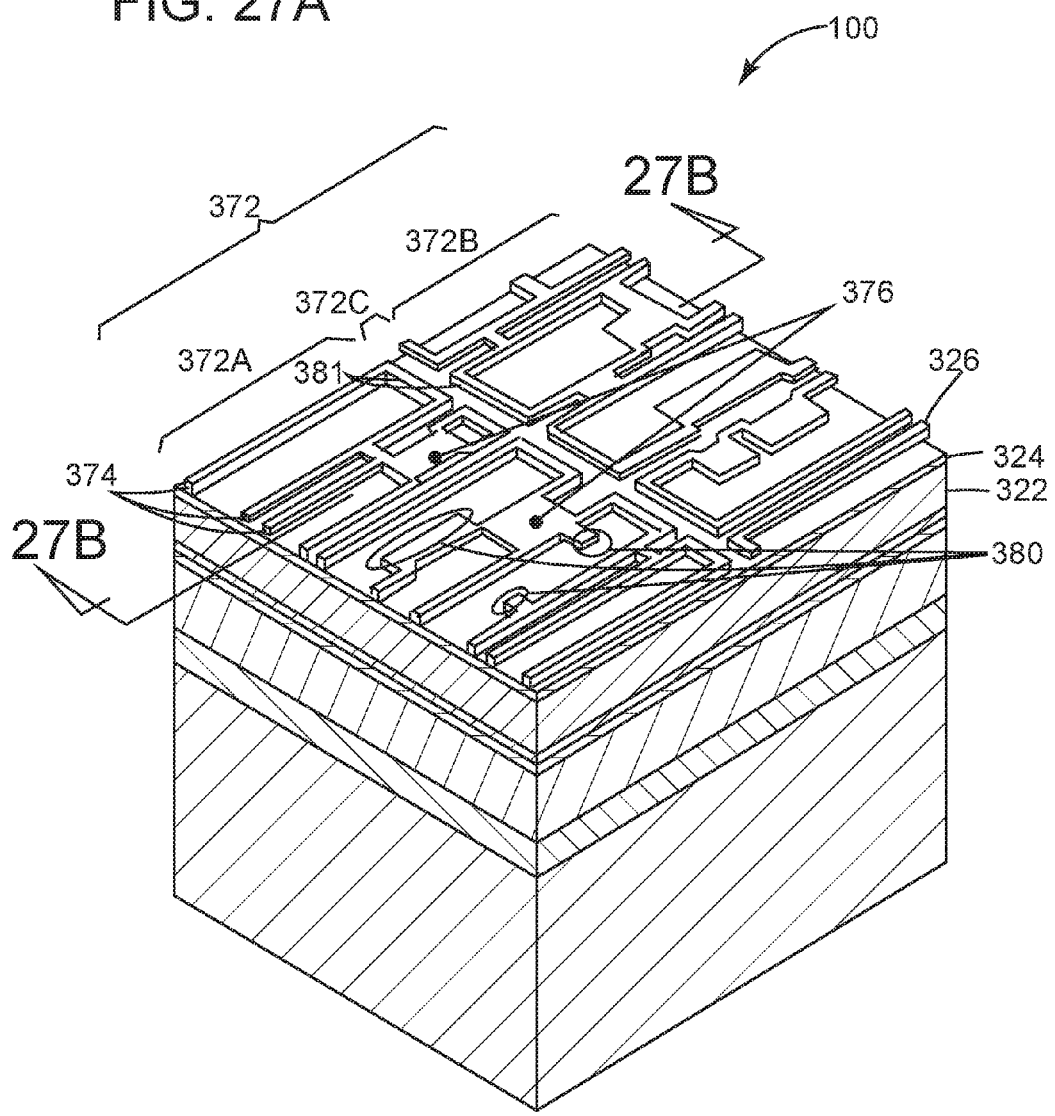

INTERCONNECTION CELLS HAVING VARIABLE WIDTH METAL LINES AND FULLY-SELF ALIGNED VARIABLE LENGTH CONTINUITY CUTS

TECHNICAL FIELD

The present invention relates to semiconductor devices and methods of fabricating the same. More specifically, the invention relates to a method and apparatus of forming interconnection cells which include metal lines having variable line widths and fully-self aligned, variable width and length, continuity cuts for a semiconductor structure, wherein the widths and lengths of the continuity cuts may be larger than the minimum pitch between the metal lines.

BACKGROUND

Self-aligned multiple patterning (SAMP) techniques (such as self-aligned double patterning (SADP) or self-aligned quadruple patterning (SAQP)) are currently used in ultra-high density integrated circuits to provide an electrical interconnection system which includes multiple arrays of parallel metal lines disposed in several levels of dielectric layers. The dielectric layers are typically interconnected through a system of metalized vias. Conventionally, within an array of metal lines, the direction longitudinal, or parallel, to the metal lines is designated the "Y" direction and the direction perpendicular, or lateral, to the metal lines is designated the "X" direction.

However, formation of interconnect systems having large arrays of multiple parallel metal lines in a Back-End-Of-Line (BEOL) process flow for a semiconductor fabrication often require the metal lines to have both variable pitch and variable line widths. This kind of variability in both pitch and line width is very difficult to achieve with a conventional SAMP process. This is particularly the case when the minimum pitch (i.e., the minimum distance between repetitive features in a semiconductor device structure) is less than or equal to 38 nm.

Typically, an interconnect system located in the back end, or BEOL portion, of a semiconductor structure will be composed of many cells of repetitive arrays of lines, wherein the overall cell pitch (or height) of each cell (i.e., the overall X direction distance across the cell) is a multiple of a minimum pitch, or track. The track (or minimum pitch) being equal to the minimum functionally allowable metal line width (in the X direction) plus the minimum space (in the X direction) between the lines. For example, a five track cell in an interconnection system where the minimum pitch is 36 nm would have an overall cell pitch that is five times 36 nm, for a total of 180 nm. By way of another example, a six track cell having a minimum pitch of 28 nm would have an overall cell pitch of six times 28 nm, for a total of 168 nm.

However, within those cells, different lines will have different functions and, therefore, will require different line widths. For example, power lines within a typical cell are primarily used to deliver power to devices (such as transistors) in a semiconductor structure and signal lines within that same cell are used to carry signals to and from the semiconductor devices. Since the power lines must carry much more current than the signal lines, the power lines must be significantly wider than the signal lines and therefore require a larger pitch. This type of variability is difficult to achieve in a conventional SAMP process.

Additionally, if the spaces between metal lines in a cell of a semiconductor interconnect system become too narrow due to, for example, lithographic variability, those unacceptably small spaces can lead to time delayed shorting between the lines. Time delayed shorting, or Time Delayed Dielectric Breakdown (TDDB), can occur when the spaces between lines become so small that the dielectric isolating material between the lines becomes degraded over an extended period of time by the electric fields being generated between the lines.

Additionally, in order to provide functionality between devices, such as transistors, capacitors and the like, in the integrated circuit, a plurality of continuity cuts (also referred to as continuity blocks) must be lithographically patterned into the signal lines and power lines of the cells at specific locations to direct current flow between the dielectric layers and the devices. Problematically however, lithographic misalignment, or overlay, is a significant issue at lower technology node sizes, such as when the technology class size is no greater than 10 nm or when the repetitive minimum pitch distance is no greater than 38 nanometers (nm). Overlay is a measure of how well two lithographic layers (or steps) align. Overlay can be in the X or Y direction and is expressed in units of length.

The lithographically disposed continuity cuts must be large enough to make sure that they cut the signal line or power line they are supposed to without clipping any neighboring lines, taking into account worst case overlay tolerance conditions. However, for a pitch of 38 nm or less, the current state of the art overlay control is not precise enough to reliably prevent continuity cuts from over-extending into neighboring lines. The unwanted over-extension of continuity cuts into neighboring lines can, in the worst case condition, completely interrupt electrical continuity in the wrong line.

Additionally, a line that is inadvertently only partially cut (or notched) may still conduct for a time, but may over heat and prematurely fail over time. This inadvertent cutting and/or notching is particularly problematic for signal lines, which are much smaller in horizontal width than power lines.

There is also a need for continuity cuts to have variable lengths in the Y direction and variable widths in the X direction. For example, design parameters often require continuity cuts within a cell of metal lines, wherein the lines have a variety of widths in the X direction. Additionally design requirements often dictate that continuity cuts have a large variety of lengths in the Y direction, some of those lengths being significantly greater in length than the cell's minimum track pitch. Also it is often desirable to entirely remove dummy metal lines (i.e., lines that are not being used to conduct current), or large portions of those dummy metal lines, in order to reduce parasitic capacitance and enhance performance. Moreover, ANA regions (i.e., non-active regions devoid of components and/or metal lines), which are typically many times wider and longer than any single metal line, may be required to extend in both the X and Y directions to provide isolation regions between interconnections cells. However, achieving variable length and width continuity cuts that are substantially greater than the minimum track pitch in either the X or Y directions becomes increasingly problematic in cell sizes having a pitch of no greater than 38 nm.

Accordingly, there is a need for an apparatus, and method of forming the same, of cells of an interconnect system for a semiconductor structure, wherein the spaces between lines within the cell are not subject to lithographic variability. Additionally, there is a need for the lines within the cells to be variable in width and variable in pitch. There is a need, specifically, for such variable line widths and pitches where the cells have a track (or minimum pitch between lines) of 38 nm or less.

Additionally, there is a need for a method of patterning continuity cuts (or continuity blocks) within lines of the cells that are tolerant of lithographic misalignment and can be made variable in both their width in the X direction and length in the Y direction. More specifically, there is a need for a method that is capable of patterning continuity cuts into the signal lines and power lines of the cells such that the cuts do not inadvertently cut or notch any of the neighboring lines and that can have variable lengths that are substantially larger than the minimum pitch or track size.

BRIEF DESCRIPTION

The present invention offers advantages and alternatives over the prior art by providing an apparatus, and method of forming the same, of cells of an interconnect system for a semiconductor structure, wherein the spaces between metal lines within the cell are not subject to lithographic variability. Additionally, the lines within the cells are variable in width and variable in pitch. Furthermore, the invention includes a method of patterning continuity cuts within the metal lines that are fully self-aligned with the lines and variable in width (perpendicular to the lines) and length (parallel to the lines). The continuity cuts may be large in that they are larger than a minimum line pitch of the cells in both width and length.

A method in accordance with one or more aspects of the present invention includes providing a semiconductor structure having a 1st mandrel layer disposed above a hardmask layer, the hardmask layer being disposed above a dielectric layer. A 1st mandrel cell is patterned into the 1st mandrel layer, the 1st mandrel cell having at least one 1st mandrel. An opening is patterned and etched into the hardmask layer, the opening being self-aligned with a sidewall of the 1st mandrel. A refill layer is disposed over the structure. The refill layer is recessed to a level that is below a top surface of the hardmask layer to form an opening plug that covers a bottom of the opening. The mandrel cell is utilized to form a metal line cell into the dielectric layer, the metal line cell having metal lines, metal line spaces, an overall line cell pitch and a minimum line pitch. The opening plug is utilized to form a continuity cut in a metal line of the metal line cell. The continuity cut has a length parallel to the metal line that is larger than the minimum line pitch.

Another method in accordance with one or more aspects of the present invention includes providing a semiconductor structure having a 1st mandrel layer disposed above a hardmask layer stack, the hardmask layer stack being disposed above a dielectric layer. A plurality of 1st mandrel cells are patterned into the 1st mandrel layer, the 1st mandrel cells each having at least one 1st mandrel and a mandrel cell pitch. A plurality of 1st openings and 2nd openings are etched into the hardmask layer stack, the openings being self-aligned with sidewalls of the 1st mandrels. A 2nd refill layer is disposed over the structure. The refill layer is recessed to a level that is below a top surface of the hardmask layer stack to form 1st and 2nd opening plugs that cover bottoms of the openings. The 1st mandrel cells are utilized to form a plurality of metal line cells into the dielectric layer, the metal line cells each having metal lines, an overall line cell pitch and a minimum line pitch. The 1st and 2nd opening plugs are utilized to form a plurality of 1st and 2nd continuity cuts in metal lines of the metal line cells, the continuity cuts having lengths parallel to the metal lines that are larger than the minimum line pitch.

A semiconductor structure in accordance with one or more aspects of the present invention includes a plurality of metal lines cells disposed in a dielectric layer. The metal line cells have a plurality of parallel metal lines having a minimum line width. A plurality of line spaces are disposed between the metal lines, the line spaces having a minimum line space width. The metal line cells also have an overall line cell pitch defining an overall length of the cells in a direction perpendicular to the metal lines. A minimum line pitch is defined by the combined minimum line width and the minimum line space width. A plurality of continuity cuts are disposed in the metal lines of the metal line cells. The continuity cuts have lengths parallel to the metal lines that are larger than the minimum line pitch.

DRAWINGS

The invention will be more fully understood from the following detailed description taken in conjunction with the accompanying drawings, in which:

FIG. 1 is a cross-sectional side view of an exemplary embodiment of a semiconductor structure of an integrated circuit having a 5 track metal interconnect cell of signal lines and a power line in accordance with the present invention;

FIG. 2 is a cross sectional view of a plurality of the cells of FIG. 1 superimposed over an imaginary 5 track minimum pitch cell, a plurality of yet to be formed first mandrels and their associated 1st mandrel spacers superimposed over the cells of FIG. 1, and a plurality of yet to be formed 2nd mandrels and their associated 2nd mandrel spacers superimposed over the 1st mandrels in accordance with the present invention;

FIG. 3 is a cross-sectional side view of an exemplary embodiment of the semiconductor structure of the integrated circuit having 6 track metal interconnect cells of signal lines and a power lines in accordance with the present invention;

FIG. 4 is a cross sectional view of a plurality of the cells of FIG. 3 superimposed over an imaginary 6 track minimum pitch cell, a plurality of yet to be formed first mandrels and their associated 1st mandrel spacers superimposed over the cells of FIG. 3, and a plurality of yet to be formed 2nd mandrels and their associated 2nd mandrel spacers superimposed over the 1st mandrels in accordance with the present invention;

FIG. 5 is a top view of the plurality of cells of FIG. 4 having the yet to be formed 1st mandrels and 2nd mandrels superimposed thereon, and having yet to be formed 1st, 2nd and 3rd openings also superimposed thereon in accordance with the present invention;

FIG. 6 is a perspective view of an exemplary embodiment of the semiconductor structure of FIGS. 1-5 at an intermediate stage of manufacturing, wherein the structure is composed of a stack of layers including (from top to bottom) a 1st SiON cap layer, a 1st SOH layer, a 1st mandrel layer, 6th, 5th, 4th, 3rd, 2nd and 1st hardmask layers, a dielectric layer, an etch stop layer and buried layers in accordance with the present invention;

FIG. 19A is perspective view of FIG. 18 having a 1st mandrel spacer layer disposed thereon in accordance with the present invention;

FIG. 27A is a perspective full view of FIG. 26, wherein the 1st mandrel spacers and the remainder of the 6th hardmask layer are removed to reveal a 1st pattern portion disposed on the 4th hardmask layer in accordance with the present invention;

Figure 44:
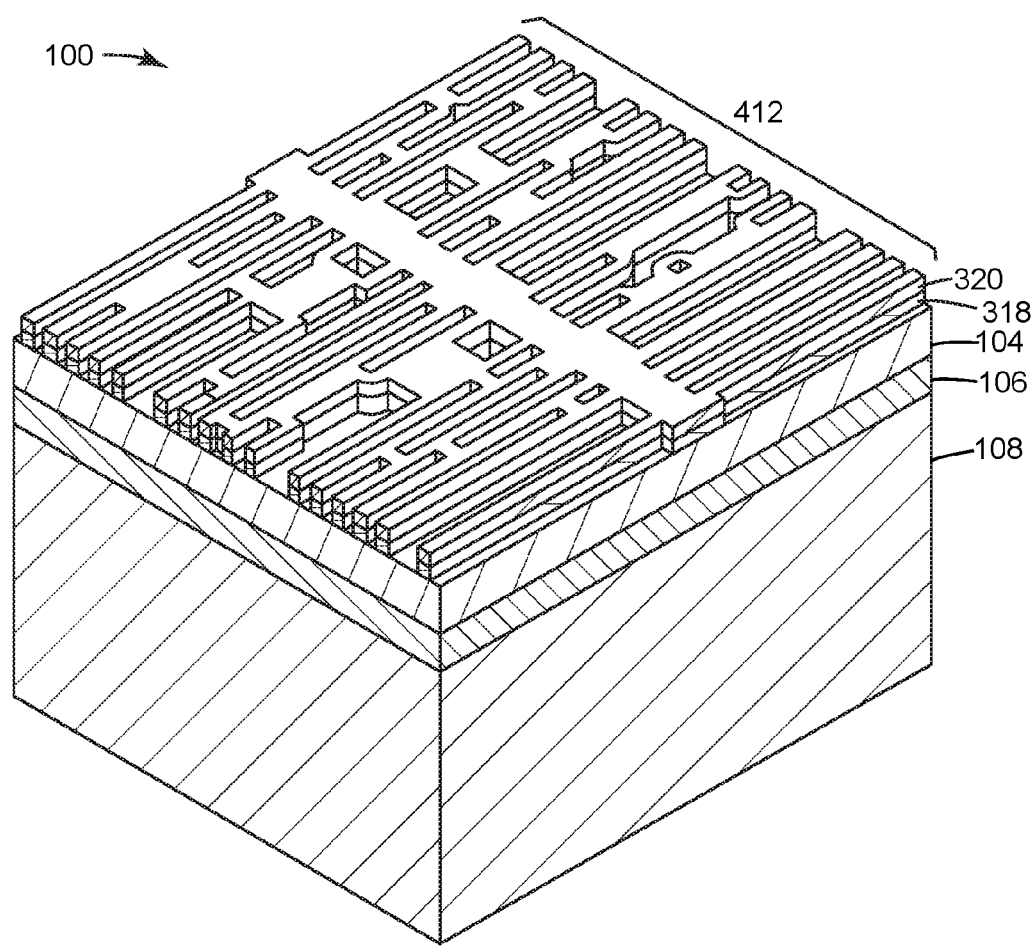
FIG. 44 is a perspective view of the structure of FIG. 43 having the final pattern anisotropically etched into the 1st hardmask layer wherein the final pattern is now disposed directly over the dielectric layer in accordance with the present invention.
Figure 45:
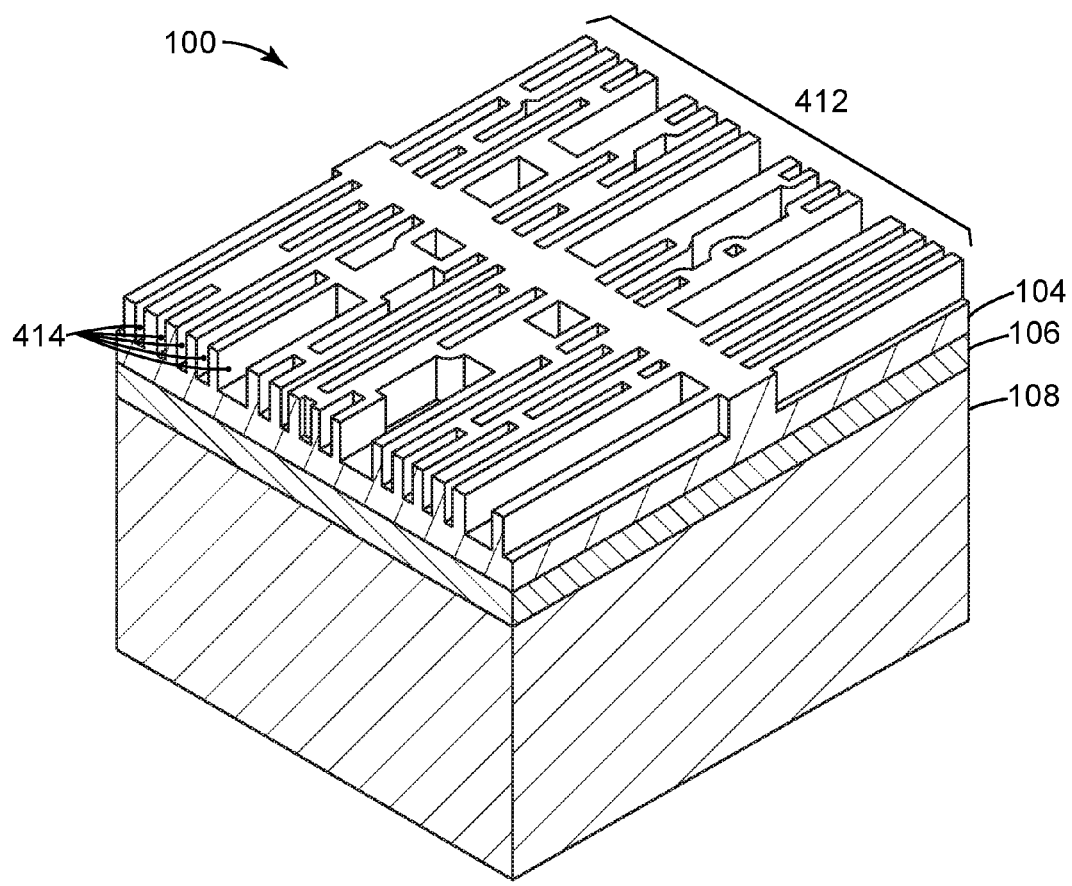
Figure 46:
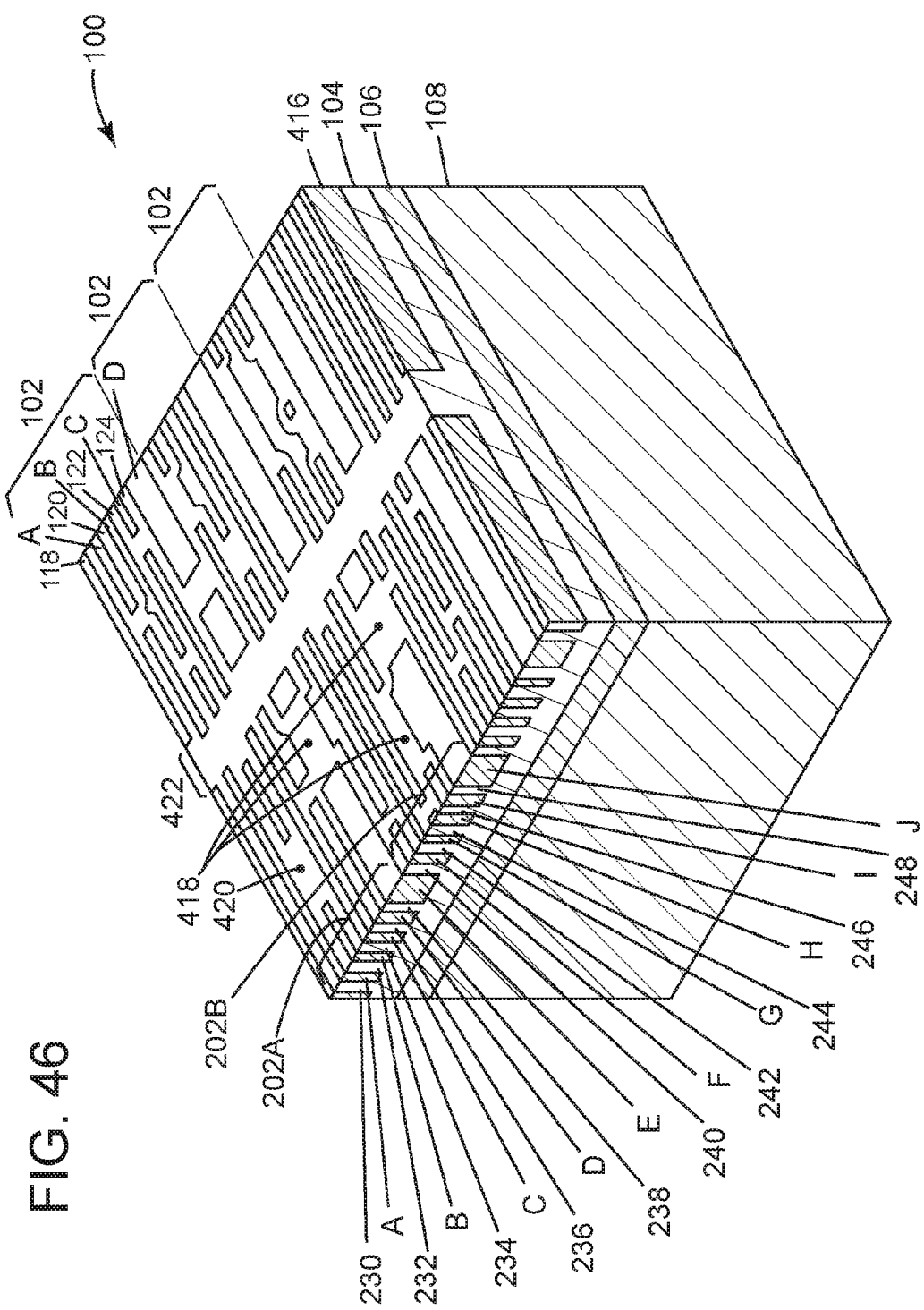

FIG. 45 is a perspective view of the structure of FIG. 44 having the dielectric layer anisotropically etched to transfer the final pattern into the dielectric layer in the form of a series of patterned trenches in accordance with the present invention; and FIG. 46 is a perspective view of the structure of FIG. 45 after the structure has been metalized and planarized to finalize formation of the 6 track metal interconnect cells and the 5 track metal interconnect cells into the dielectric layer, wherein FIG. 46 is also a perspective view of FIGS. 1-5 in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1-46 illustrate various exemplary embodiments of an apparatus, and method of making the same, of cells of an interconnect system for a semiconductor structure, wherein the spaces between metal lines within the cell are not subject to lithographic variation and the widths of the lines are variable in accordance with the present invention. Additionally the method and apparatus can apply cuts to the signal lines and power lines of the cells that are fully self-aligned with the edges of the lines and, therefore, are not subject to lithographic overlay problems and do not inadvertently cut or notch any of the metal lines.

Further the method and apparatus can provide fully self-aligned continuity cuts, which have variable lengths in the Y direction. For example, the continuity cuts may have lengths that are greater (typically by many times) than the minimum pitch of the metal lines within a cell, or may essentially remove large portions of dummy lines within a cell.

Moreover, the invention can be applied to semiconductor cells of interconnection lines having a minimum pitch of 38 nm or less. Additionally, the invention may be applied to semiconductor cells of any number of lines and any number of tracks, for example, 5 track, 6 track, 6.5 track and more.

More specifically, the following FIGS. 1-5 describe structural features of the cells in accordance with the present invention. Additionally FIGS. 6-46 describe methods of making the cells in accordance with the present invention.

Figure 1:
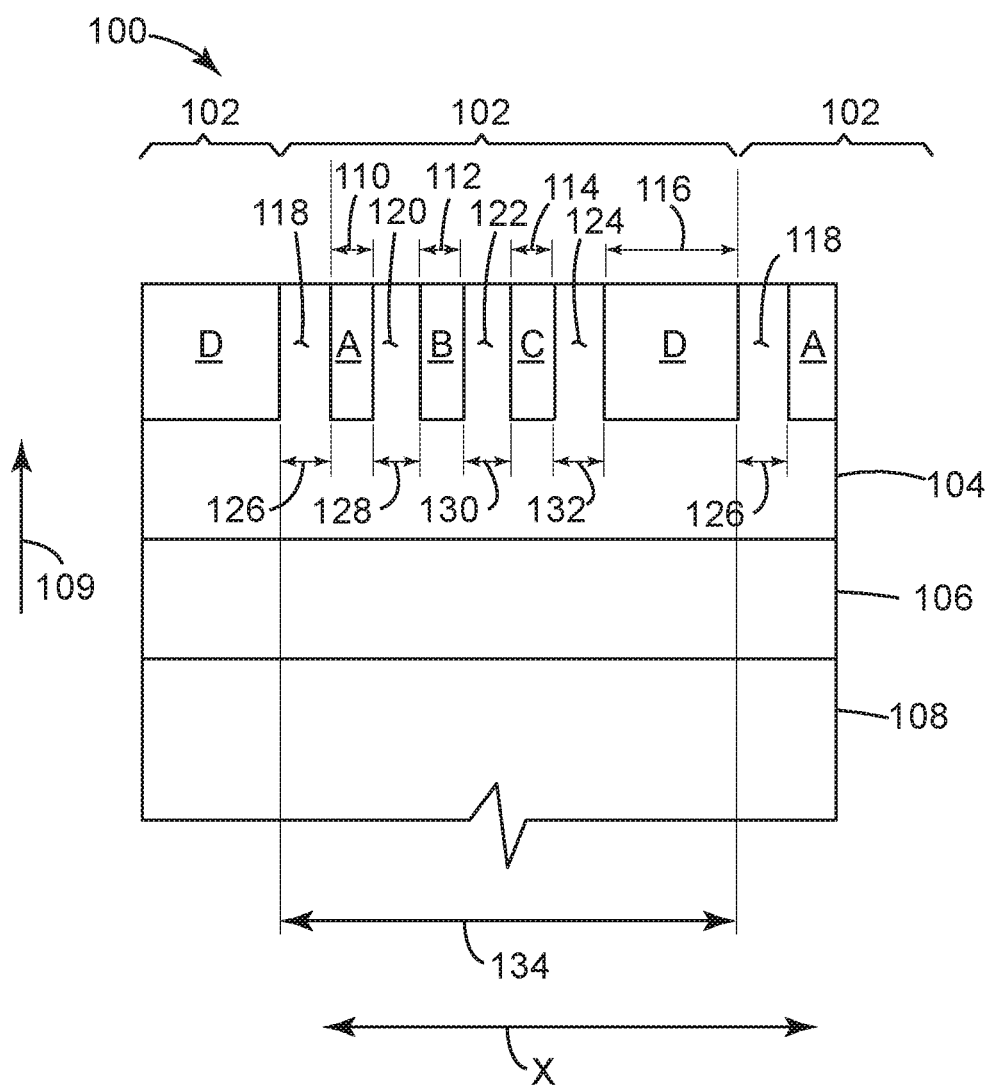

Referring to FIG. 1, a simplified cross-sectional view of an exemplary embodiment of a semiconductor structure 100 of an integrated circuit in accordance with the present invention is presented. Structure 100 includes a plurality of fully formed semiconductor cells 102 of metal interconnect lines A, B, C and D, which are disposed in a dielectric layer 104.

The dielectric layer 104 is composed of a dielectric isolation material such as a low K or ultra low K (ULK) material or various combinations of silicon, carbon, oxygen and hydrogen (an SiCOH layer). The dielectric layer may be disposed over an etch-stop hard mask layer 106, such as a silicon nitride (SiN) or similar. The etch stop layer 106 may be disposed over a complex stack of buried layers 108 from the substrate (not shown) upwards.

The top surfaces of layers 104, 106 and the buried layers of stack 108 are all planarized to be substantially parallel to each other. For purposes herein, the direction perpendicular to those top surfaces will be designated the vertical direction (as represented by the arrow 109).

The metal lines A, B, C and D of each cell 102 form an array of substantially parallel metal lines disposed within the dielectric layer 104. In this embodiment, the lines A, B and C represent signal lines for transmitting signals to and from devices in structure 100. Also, in this embodiment, the line D represents a power line for transmitting power to the devices in structure 100. As such, the power line D is required to carry significantly more current relative to signal lines A, B, C and, therefore, will be proportionally larger in width.

A plurality of first (1st) 118, second (2nd) 120, third (3rd) 122 and fourth (4th) 124 line spaces are disposed between the metal lines A, B, C, D and have the dielectric isolation material of dielectric layer 104 disposed therein. The line spaces 118, 120, 122, 124 have first 126, second 128, third 130 and fourth 132 line space widths respectively.

Figure 2:
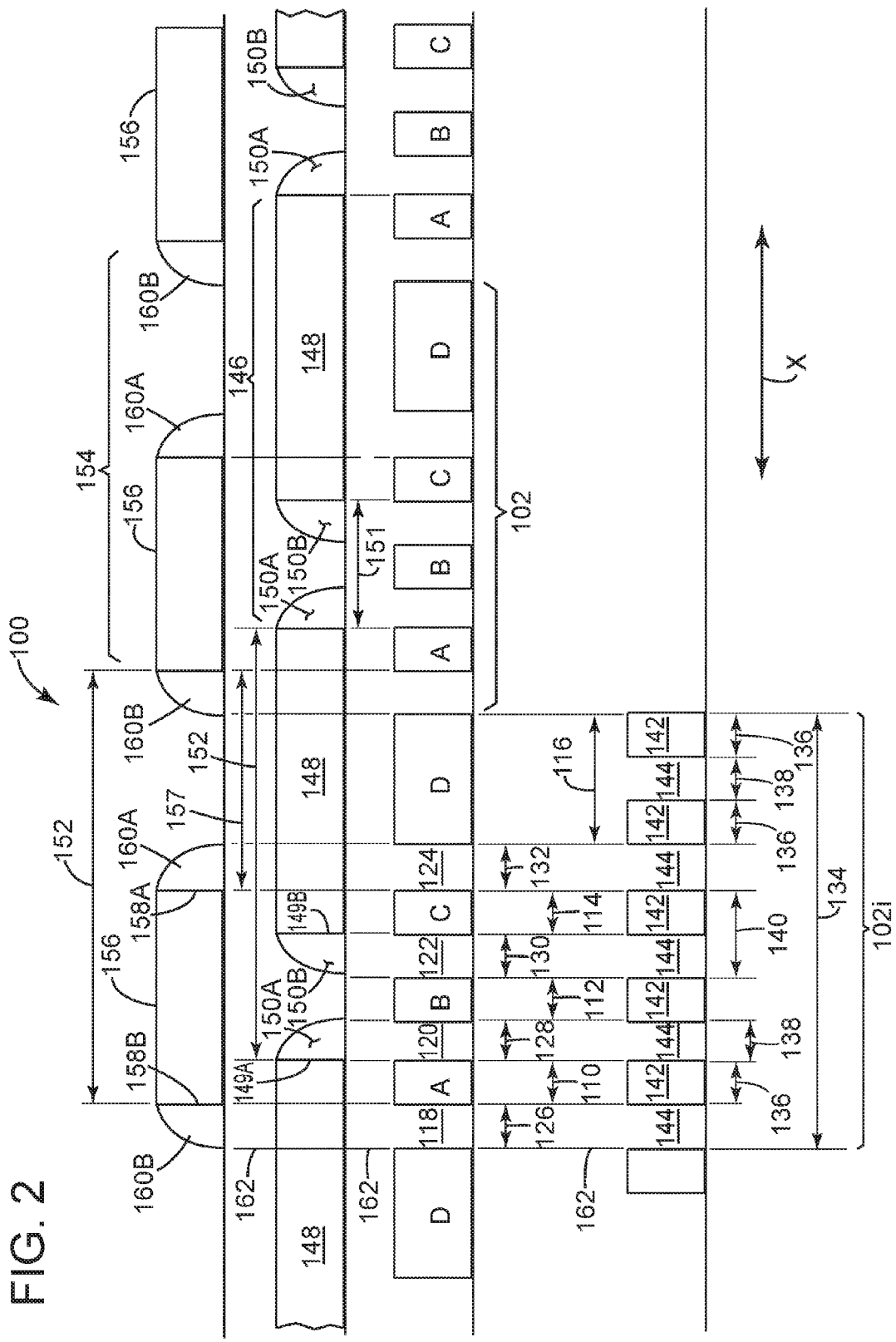

In this particular embodiment, the line widths 110, 112, and 114 of lines A, B and C respectively are set substantially equal to a predetermined minimum allowable line width 136 (best seen in FIG. 2). Also the line space widths 126, 128, 130 and 132 are set substantially equal to a predetermined minimum allowable line space width 138 (best seen in FIG. 2). Additionally, in this particular embodiment, the line width 116 of line D is set substantially equal to twice the minimum line width 136 plus the minimum line space width 138. The overall length in the X direction of cell 102 is known herein as the overall line cell pitch 134.

Referring to FIG. 2, a simplified cross sectional view of a plurality of the cells 102 of semiconductor structure 100, without the dielectric layer 104, is superimposed over an imaginary cell 102i. Imaginary cell 102i is composed of a plurality of parallel minimum metal lines 142 having the predetermined minimum line width 136, wherein the metal lines 142 are separated by minimum line spaces 144 having the minimum line space width 138. The combination of a minimum line width 136 and minimum line space width 138 defines a cell track 140. Each cell track 140 is also considered to be a minimum line pitch 140 of the cells 102 and 102i. In this case, cell 102 is referred to as a 5 track cell since it has an overall line cell pitch 134 of 5 minimum line pitches 140.

Figure 3:
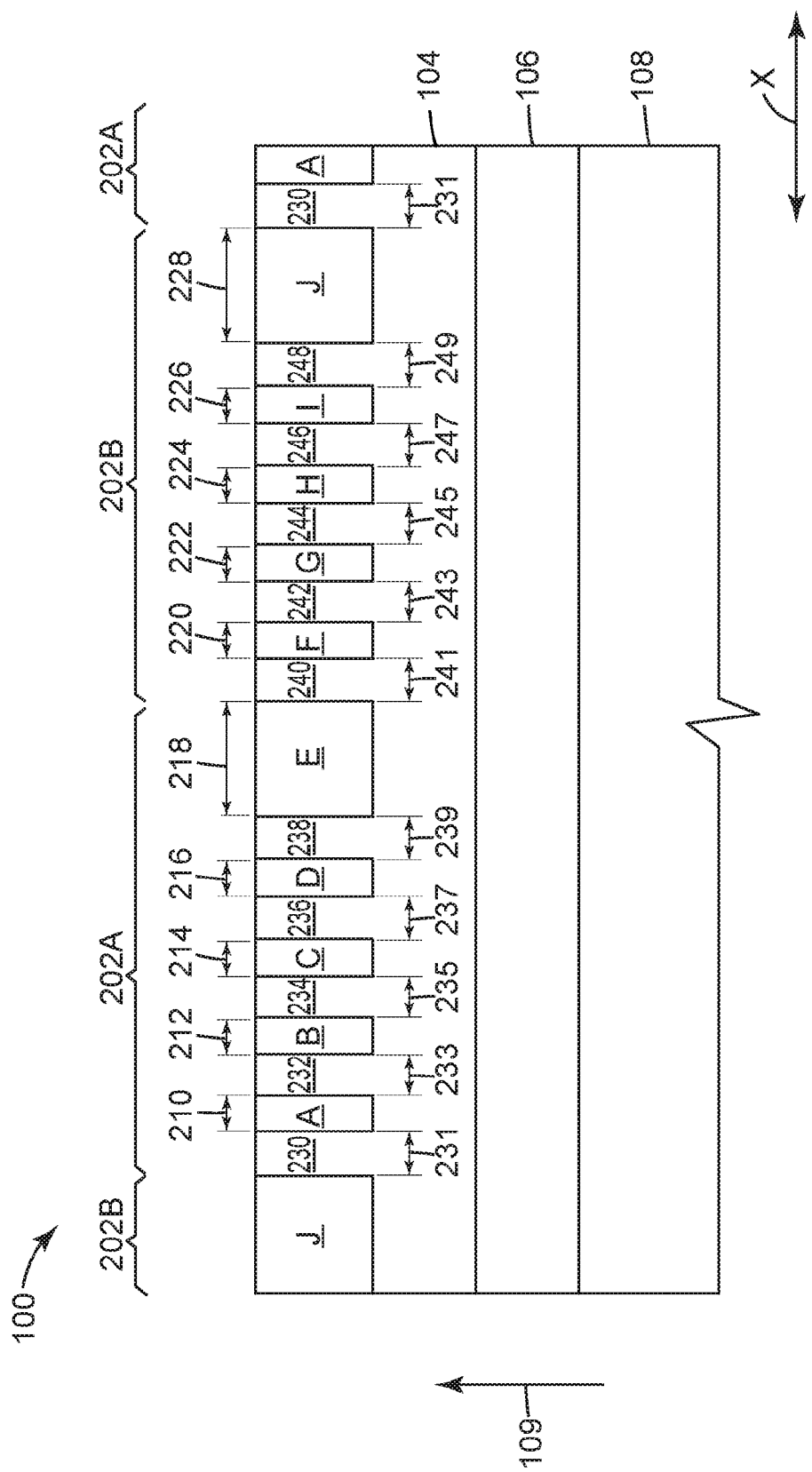
Figure 4:
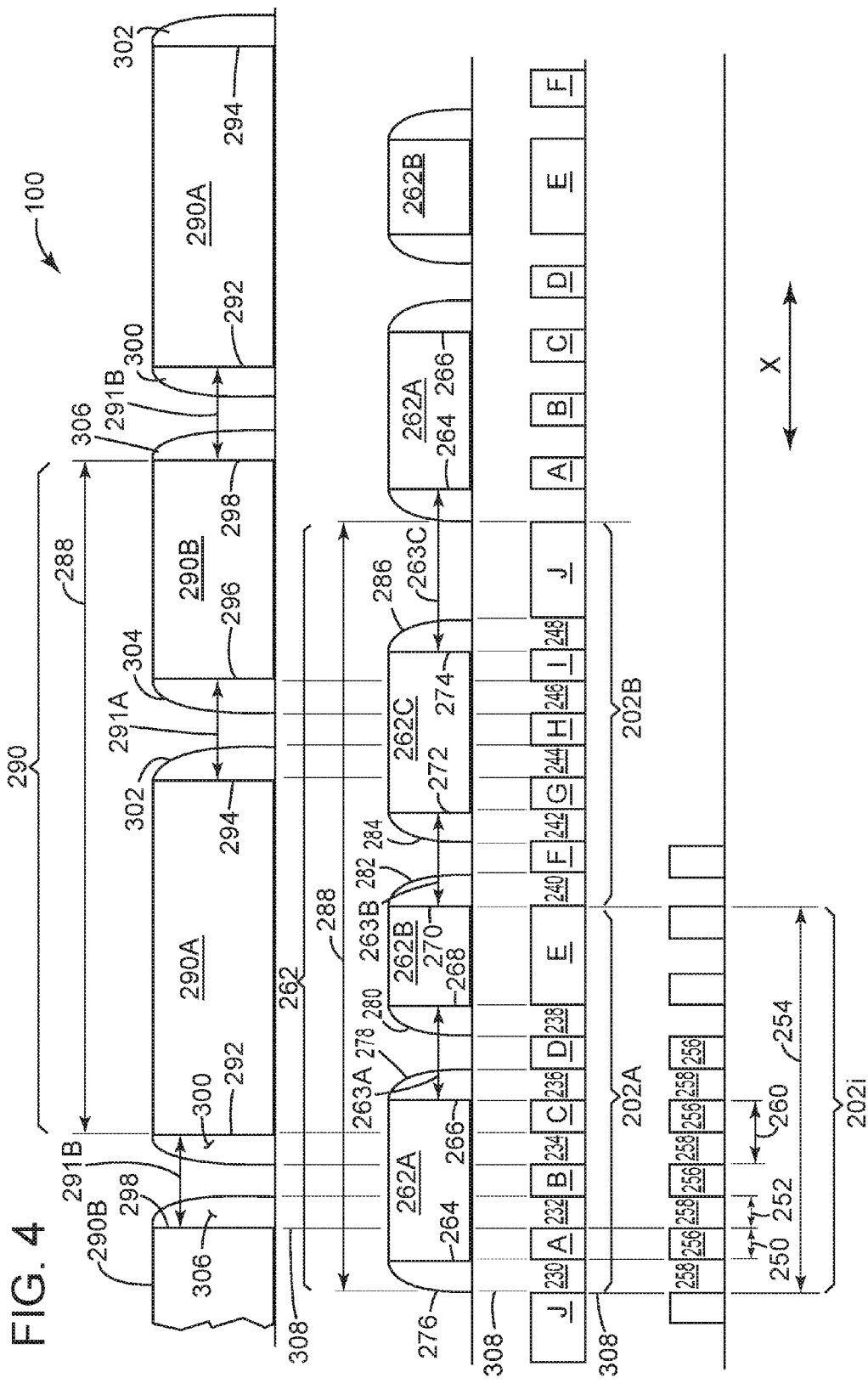

One skilled in the art would recognize that the overall line cell pitch 134 may be equal to other multiples of cell track 140. For example (as illustrated in FIGS. 3 and 4), the overall line cell pitch 134 could be equal to 6 cell tracks 260 in width, in which case the cell 102 would be referred to as a six track cell. Also, overall line cell pitch 134 may be a non-integer multiple of the cell track 140, as in 5.33, 5.66, 6.33 or 7.5 track and the like.

The minimum line pitch 140 may be 38 nm or less. So, for example, the minimum line pitch 140 of this cell 102 may be 36 nm, 32 nm, 28 nm, 26 nm or smaller, in accordance with the present invention.

Additionally the relative positions of a plurality of yet to be formed 1st mandrel cells 146 are shown superimposed over the cells 102. The 1st mandrel cells 146 include a repetitive pattern of 1st mandrels 148. Each 1st mandrel 148 has an opposing pair of sidewalls 149A, 149B located at the distal X direction ends of the 1st mandrels. Upon the sidewalls are disposed an associated pair of 1st mandrel spacers 150A and 150B respectively.

Each 1st mandrel cell 146 has at least one 1st mandrel 148 and a 1st mandrel space 151 associated with it. The 1st mandrel spaces 151 separate the 1st mandrels within a cell 146 or between cells 146. The overall length in the X direction of a 1st mandrel cell 146 is herein referred to as the mandrel cell pitch 152.

Additionally the relative positions of a plurality of yet to be formed 2nd mandrel cells 154 are shown superimposed over the 1st mandrel cells 146. The 2nd mandrel cells 154 include a repetitive pattern of 2nd mandrels 156. Each 2nd mandrel 156 has an opposing pair of sidewalls 158A, 158B located in the X direction distal ends of the mandrels, upon which are disposed an associated pair of 2nd mandrel spacers 160A and 160B respectively.

Each 2nd mandrel cell 154 also has at least one 2nd mandrel 156 and a 2nd mandrel space 157 associated with it. The 2nd mandrel spaces 157 separate the 2nd mandrels within a cell 154 or between cells 154. The overall length (or cell pitch) in the X direction of a 2nd mandrel cell 154 is substantially the same mandrel cell pitch 152 as the 1st mandrel cells 146.

The process flow which utilizes the 1st and 2nd mandrels to form the 5 track cells 102 will be discussed in greater detail with reference to the formation of 6 track cells 202A and B, starting with FIG. 3. In summary though, a plurality of 1st mandrel cells 146 are lithographically patterned into a 1st mandrel layer (not shown) that is disposed over the dielectric layer 104. A plurality of 2nd mandrel cells are then lithographically patterned into a 2nd mandrel layer (not shown) that is disposed above the 1st mandrel layer. The 1st and 2nd mandrel spacers 150A, 150B, 160A, 160B are formed with a process such as atomic layer deposition (ALD).

It is important to note that the mandrels 148, 156, the spaces 151, 157 between the mandrels and the relative positions of the 1st mandrel cells 146 to the 2nd mandrel cells 154 are variously used to define the widths 110, 112, 114, 116 of the metal lines A, B, C, D. Since the mandrel cells 146, 154 are lithographically formed, they have a great deal of flexibility in the formation of the line widths 110, 112, 114, 116. However, for the same reason, the mandrel cells 146, 154, and therefore the line widths 110 and 114, are susceptible to lithographic variability.

It is also important to note that each 1st mandrel spacer 150A, 150B of a 1st mandrel cell 146 and each 2nd mandrel spacer 160A, 160B of a 2nd mandrel cell is used to form a specific line space 118, 120, 122, 124 of a single metal line cell 102. More specifically, in this embodiment (and as can be seen from vertical projections 162 in FIG. 2), within each metal line cell 102:

2nd mandrel spacer 160B is used to form the 1st line space 118;

1st mandrel spacer 150A is used to form the 2nd line space 120;

1st mandrel spacer 150B is used to form the 3rd line space 122; and

2nd mandrel spacer 160A is used to form the 4th line space 124.

Since the mandrel spacers 150A, 150B, 160A, 160B are not lithographically formed, but rather are formed by an ALD process, they are not subject to lithographic variation issues. As such, the spaces 118, 120, 122, 124 can be very precisely controlled in their widths, but have less flexibility regarding the range of variations in their widths.

Additionally, it is important to note that in this embodiment there are an even number (in this case 4) of lines A, B, C, D and line spaces 118, 120, 122, 124 in each 5 track metal line cell 102. Since there are always going to be a pair of two opposing sidewalls for each mandrel, then there will necessarily always be an even number of mandrel spacers per mandrel cell available to form the line spaces in the metal line cells 102. More specifically, 1st mandrels 148 include sidewalls 149A, 149B, upon which are formed 1st mandrel spacers 150A, 150B, and 2nd mandrels 156 include sidewalls 158A, 158B, upon which are formed 2nd mandrel spacers 160A, 160B.

Accordingly, there are an even number of mandrel spacers 150A, 150B, 160A, 160B for every pair of mandrel cells 146, 154 utilized to form an even number of line spaces 118, 120, 122, 124 per line cell 102. As such, the pitch 152 of the mandrel cells 146, 154 must be set equal to the overall line cell pitch 134 of the metal line cells 102 in order to repetitively match the mandrel spacers to the line spaces from metal line cell to metal line cell.

Finally, as will be explained in greater detail herein, the positioning of the 2nd mandrel cells 154 relative to the 1st mandrel cells 146 is such that the 2nd mandrels 156 always entirely overlays the 1st mandrel space 151. As will be explained with reference to 6 track cell formation (beginning with FIG. 3), this overlay is important for formation of fully self-aligned continuity cuts within the metal line cells 102.

Referring to FIG. 3, a simplified cross-sectional view of another exemplary embodiment of the same semiconductor structure 100 of an integrated circuit in accordance with the present invention is presented. Structure 100 additionally includes a plurality of fully formed identical pairs of adjacent semiconductor metal line cells 202A and 202B. Line cell 202A includes metal interconnect lines A, B, C, D and E (herein A-E), which are disposed in the dielectric layer 104. Additionally, line cell 202B includes metal interconnect lines F, G, H, I and J (herein F-J), which are also disposed in the dielectric layer 104. As in the embodiments describing metal line cells 102, the dielectric layer 104 is disposed over the etch stop layer 106 and buried layers 108 respectively.

As will be explained in greater detail herein, line cells 202A and 202B are adjacent and substantially identical to each other. However they are formed utilizing different features of a 1st set of mandrel cells 262 (best seen in FIG. 4) and a second set of mandrel cells 290 (best seen in FIG. 4). It is important to note that, the most significant difference between the embodiments of line cells 202A and 202B and the embodiments of line cells 102 is that line cells 202A, 202B have an odd number of metal lines A-E and F-J and metal line spaces, whereas the line cells 102 have an even number of metal lines A-D and metal line spaces.

The dielectric layer 104 is the same as the dielectric layer for the line cells 102 of FIG. 1. As before, the dielectric layer may be disposed over the etch-stop hard mask layer 106. The etch stop layer 106 may be disposed over a complex stack of buried layers 108 from the substrate (not shown) upwards.

The top surfaces of layers 104, 106 and the buried layers of stack 108 are all planarized to be substantially parallel to each other. For purposes herein, the direction perpendicular to those top surfaces will be designated the vertical direction (as represented by the arrow 109).

The metal lines A-E and F-J of each cell 202A, 202B form an array of substantially parallel metal lines disposed within the dielectric layer 104. In this embodiment, the lines A, B, C, D (herein A-D) of cell 202A and lines F, G, H, I (herein F-I) of cell 202B represent signal lines for transmitting signals to and from devices in structure 100. Also, in this embodiment, the lines E and J represent power lines for transmitting power to the devices in structure 100. As such, the power lines E and J are required to carry significantly more current relative to signal lines A-D and F-I, therefore, will be proportionally larger in width.

The metal lines A-E have metal line widths 210, 212, 214, 216, 218 (herein 210-218) and the metal lines F-J have metal lines widths 220, 222, 224, 226, 228 (herein 220-228) respectively. A plurality of first (1st) 230, second (2nd) 232, third (3rd) 234, fourth (4th) 236 and fifth (5th) 238 line spaces (herein 230-238) are disposed between the metal lines A-E of line cell 202A, which have line space widths 231, 233, 235, 237, 239 (herein 231-239) respectively. A plurality of sixth (6th) 240, seventh (7th) 242, eighth (8th) 244, ninth (9th) 246 and tenth (248) line spaces (herein 240-248) are disposed between the metal lines F-J of line cell 202B, which have line space widths 241, 243, 245, 247, 249 (herein 241-249) respectively. The line spaces 230-238 and 240-248 (collectively 230-248) have the dielectric isolation material of dielectric layer 104 disposed therein.

In this particular embodiment, the line widths 210, 212, 214, 216 of cell 202A and line widths 220, 222, 224, 226 of cell 202B are set substantially equal to a predetermined minimum allowable line width 250 (best seen in FIG. 4). Also the line space widths 231-239 and 241-249 (collectively 231-249) are set substantially equal to a predetermined minimum allowable line space width 252 (best seen in FIG. 4). Additionally, in this particular embodiment, the line width 218 of line E and line width 228 of line J are set substantially equal to twice the minimum line width 250 plus the minimum line space width 252. The overall length in the X direction of cells 202A and 202B are known herein as the overall line cell pitch 254.

Referring to FIG. 4, a simplified cross sectional view of a plurality of the cells 202A and 202B of semiconductor structure 100, without the dielectric layer 104, is superimposed over an imaginary cell 202i. Imaginary cell 202i is composed of a plurality of parallel minimum metal lines 256 having the predetermined minimum line width 250, wherein the metal lines 256 are separated by minimum line spaces 258 having the minimum line space width 252. The combination of a minimum line width 250 and minimum line space width 252 defines a cell track 260. Each cell track 260 is also considered to be a minimum line pitch 260 of the cells 202A, 202B and 202i. In this case, cells 202A and 202B are referred to as 6 track cells since they have an overall line cell pitch 254 of 6 minimum line pitches 260.

Additionally the relative positions of a plurality of yet to be formed 1st mandrel cells 262 are shown superimposed over the cells 202A and 202B. The 1st mandrel cells 262 include a repetitive pattern of 1st mandrels 262A, 262B, 262C. Each 1st mandrel 262A, 262B, 262C has an opposing pair of sidewalls 264-274 upon which are disposed an associated pair of 1st mandrel spacers 276-286. More specifically, 1st mandrel 262A includes opposing sidewalls 264, 266 upon which are disposed 1st mandrel spacers 276, 278 respectively. Also, 1st mandrel 262B includes opposing sidewalls 268, 270 upon which are disposed 1st mandrel spacers 280, 282 respectively. Additionally, 1st mandrel 262C includes opposing sidewalls 272, 274 upon which are disposed 1st mandrel spacers 284, 286 respectively.

Associated with each 1st mandrel cell 262A, 262B, 262C is a respective 1st mandrel cell space 263A, 263B, 263C (collectively 263). The 1st mandrel spaces 263A, 263B, 263C separate the 1st mandrels 262A, 262B, 262C within a cell 262 or between cells 262. The overall length in the X direction of a 1st mandrel cell 262 is herein referred to as the mandrel cell pitch 288.

Additionally the relative positions of a plurality of yet to be formed 2nd mandrel cells 290 are shown superimposed over the 1st mandrel cells 262. The 2nd mandrel cells 290 include a repetitive pattern of 2nd mandrels 290A, 290B. Each 2nd mandrel 290A, 290B has an opposing pair of sidewalls 292-298 upon which are disposed an associated pair of 1st mandrel spacers 300-306. More specifically, 2nd mandrel 290A includes opposing sidewalls 292, 294 upon which are disposed 2nd mandrel spacers 300, 302 respectively. Also, 2nd mandrel 290B includes opposing sidewalls 296, 298 upon which are disposed 2nd mandrel spacers 304, 306 respectively.

Associated with each 2nd mandrel cell 290A, 290B is a respective 2nd mandrel cell space 291A, 291B (collectively 291). The 2nd mandrel spaces 291A, 291B separate the 2nd mandrels 290A, 290B within a cell 290 or between cells 290. The overall length in the X direction of a 2nd mandrel cell 290 is substantially the same mandrel cell pitch 288.

The process flow that utilizes 1st and 2nd mandrel cells 262, 290 to form line cells 202A and 202B will be discussed in greater detail herein. The superposition in FIG. 4 of the mandrel cells 262, 290 over the line cells 202A and 202B are used to illustrate which specific structures within the mandrel cells control and define the lines A-E of line cell 202A and lines F-J of line cell 202B during the process flow of semiconductor structure 100.

In summary though, a plurality of the 1st mandrel cells 262 are lithographically patterned into a 1st mandrel layer 330 (best seen in FIG. 8) that is disposed over the dielectric layer 104. A plurality of 2nd mandrel cells 290 are then lithographically patterned into a 2nd mandrel layer 382 (best seen in FIG. 30A) that is disposed above the 1st mandrel layer. The 1st and 2nd mandrel spacers 276-286 and 300-306 are formed with a process such as atomic layer deposition (ALD).

It is important to note that the 1st and 2nd mandrels 262A, 262B, 262C, 290A, 290B, the 1st and 2nd mandrel spaces 263A, 263B, 263C, 291A, 291B between the mandrels and the relative positions of the 1st mandrel cells 262 to the 2nd mandrel cells 290 are variously used to define the metal lines A-E and F-J. Since the mandrel cells 262, 290 are lithographically formed, they have a great deal of flexibility in the formation of the line widths 210-228 (best seen in FIG. 3). However, for the same reason, the mandrel cells 262, 290, and therefore the line widths 210-228, are susceptible to lithographic variability.

It is also important to note that each 1st mandrel spacer 276-286 of a 1st mandrel cell 262 and each 2nd mandrel spacer 300-306 of a 2nd mandrel cell 290 is used to form a specific line space 230-248 of a single metal line cell 202A, 202B. More specifically, in this embodiment (and as can be seen from vertical projections 308 in FIG. 4), within each metal line cell 202A, 202B:

1st mandrel spacer 276 is used to form 1st line space 230
2nd mandrel spacer 306 is used to form 2nd line space 232
2nd mandrel spacer 300 is used to form 3rd line space 234
1st mandrel spacer 278 is used to form 4th line space 236
1st mandrel spacer 280 is used to form 5th line space 238
1st mandrel spacer 282 is used to form 6th line space 240
1st mandrel spacer 284 is used to form 7th line space 242
2nd mandrel spacer 302 is used to form 8th line space 244
2nd mandrel spacer 304 is used to form 9th line space 246
1st mandrel spacer 286 is used to form 10th line space 248.

Since the mandrel spacers 276-286 and 300-306 are not lithographically formed, but rather are formed by an ALD process, they are not subject to lithographic variation issues. As such, the line spaces 230-248 can be very precisely controlled in their widths, but have less flexibility regarding the range of variations in their widths.

More specifically, the mandrel spacers 276-286, 300-306, and therefore the line spaces 230-248, can typically be held to a tolerance of plus or minus 2 nm and more preferably to a tolerance of plus or minus 1 nm. The width of the mandrel can typically be maintained within a tolerance of plus or minus 2 nm and the final line spaces can typically be held to within a tolerance of plus or minus 3 nm or better. Though the 1st mandrel spacers 276-286 and 2nd mandrel spacers 300-306 are often set to the same thickness, they can also be set to two separate and distinct widths within the range specified. As such, the 1st, 4th, 5th, 6th, 7th and 10th line spaces (reference nos. 230, 236, 238, 240, 242, 248) can be set to one line space width since they are formed from the 1st mandrel spacers 276-286. Additionally, the 2nd, 3rd, 8th and 9th lines spaces (reference nos. 232, 234, 244, 246) can be set to a different line space width (for example a difference of 4 nm to 12 nm) since they are formed from the 2nd mandrel spacers 300-306. For purposes of this particular embodiment though, the line spaces 230-248 are all set to the minimum line space width 252.

Additionally, it is important to note that in this embodiment there are an odd number (in this case 5) of lines and line spaces per cell 202A, 202B. More specifically, there are 5 metal lines A-E and 5 metal line spaces 230-238 in cell 202A. Additionally, there are 5 metal lines F-J and 5 metal line spaces 240-248 in the substantially identical cell 202B.

Since there are always going to be a pair of two opposing sidewalls for each mandrel, then there will necessarily always be an even number of mandrel spacers per mandrel cell utilized to form the line spaces in the metal line cells. However, since the metal line cells in this embodiment have an odd number of metal lines and associated metal line spaces per cell, then the metal line cells must be processed as an identical pair 202A, 202B in order to match the even number of sidewalls and associated mandrel spacers in the mandrel cells 262, 290 that form them. Otherwise the flow process will not be able to repeat itself from line cell to line cell within the dielectric layer 104.

More specifically, in this embodiment, the line cells 202A and 202B have 5 metal lines and line spaces each, which is an odd number. Therefore the paired cells 202A, 202B have a combined total of 10 metal lines A-J and 10 line spaces 230-248. In 1st mandrel cell 262 there are three 1st mandrels 262A, 262B, 262C and six 1st mandrel spacers 276-286. Additionally, in 2nd mandrel cell 290 there are two mandrels 290A, 290B and four 2nd mandrel spacers 300-306. Therefore the paired mandrel cells 262, 290 have a combined total of five mandrels 262A, 262B, 262C, 290A, 290B and ten mandrel spacers 276-286 and 300-306. The ten mandrel spacers 276, 278, 280, 282, 284, 286, 300, 302, 304 and 306 match, and are utilized to form, the ten metal lines A-J and line spaces 230-248 in line cells 202A, and B. Accordingly, the flow process will be able to repeat itself from line cell to line cell within the dielectric layer 104.

It is important to note that for the flow process described in the embodiment illustrated in FIGS. 3 and 4, when the number of metal lines A-E and F-J of metal line cells 202A, 202B of structure 100 are an odd number (5, in this embodiment), the number of metal lines within the line cell are equal to the sum of the number of 1st mandrels 262A, B, C within the 1st mandrel cell 262 plus the number of 2nd mandrels 290A, B within the 2nd mandrel cell 290. Additionally for the flow process described in the embodiment illustrated in FIGS. 1 and 2, when the number of metal lines A-D of metal line cell 102 of structure 100 are an even number (4, in this embodiment), the number of metal lines within the line cell are equal to twice the sum of the number of 1st mandrels 148 within the 1st mandrel cell 146 plus the number of 2nd mandrels 156 within the 2nd mandrel cell 154.

It is also important to note that for the flow process described in the embodiment illustrated in FIGS. 3 and 4, when the number of metal lines A-E and F-J of metal line cells 202A, 202B of structure 100 are an odd number (5, in this embodiment), the overall line cell pitch 254 is substantially equal to half the mandrel cell pitch 288. Additionally for the flow process described in the embodiment illustrated in FIGS. 1 and 2, when the number of metal lines A-D of metal line cell 102 of structure 100 are an even number (4, in this embodiment), the overall line cell pitch 134 is substantially equal to the mandrel cell pitch 152.

Additionally, it is important to note that the positioning of the 2nd mandrel cells 290 relative to the 1st mandrel cells 262 is such that the 2nd mandrels 290A, 290B entirely overlay the 1st mandrel spaces 263A, 263B, 263C. As will be explained in greater detail herein, this overlay is important for formation of fully self-aligned continuity cuts within the metal line cells 202A and 202B.

More specifically, in the embodiment illustrated in FIGS. 3 and 4, the 2nd mandrel 290A entirely overlays 1st mandrel spaces 263A and 263B by completely spanning across 1st mandrel 262B and having its distal ends (defined by sidewalls 292 and 294) overlap with a distal end of 1st mandrel 262A (defined by sidewall 266) and a distal end of 1st mandrel 262C (defined by sidewall 272). Additionally, 2nd mandrel 290B entirely overlays 1st mandrel space 263C by having its distal ends (defined by sidewalls 296 and 298)

overlap with a distal end of 1st mandrel 262C (defined by sidewall 274) and a distal end of 1st mandrel 262A (defined by sidewall 264).

Figure 5:
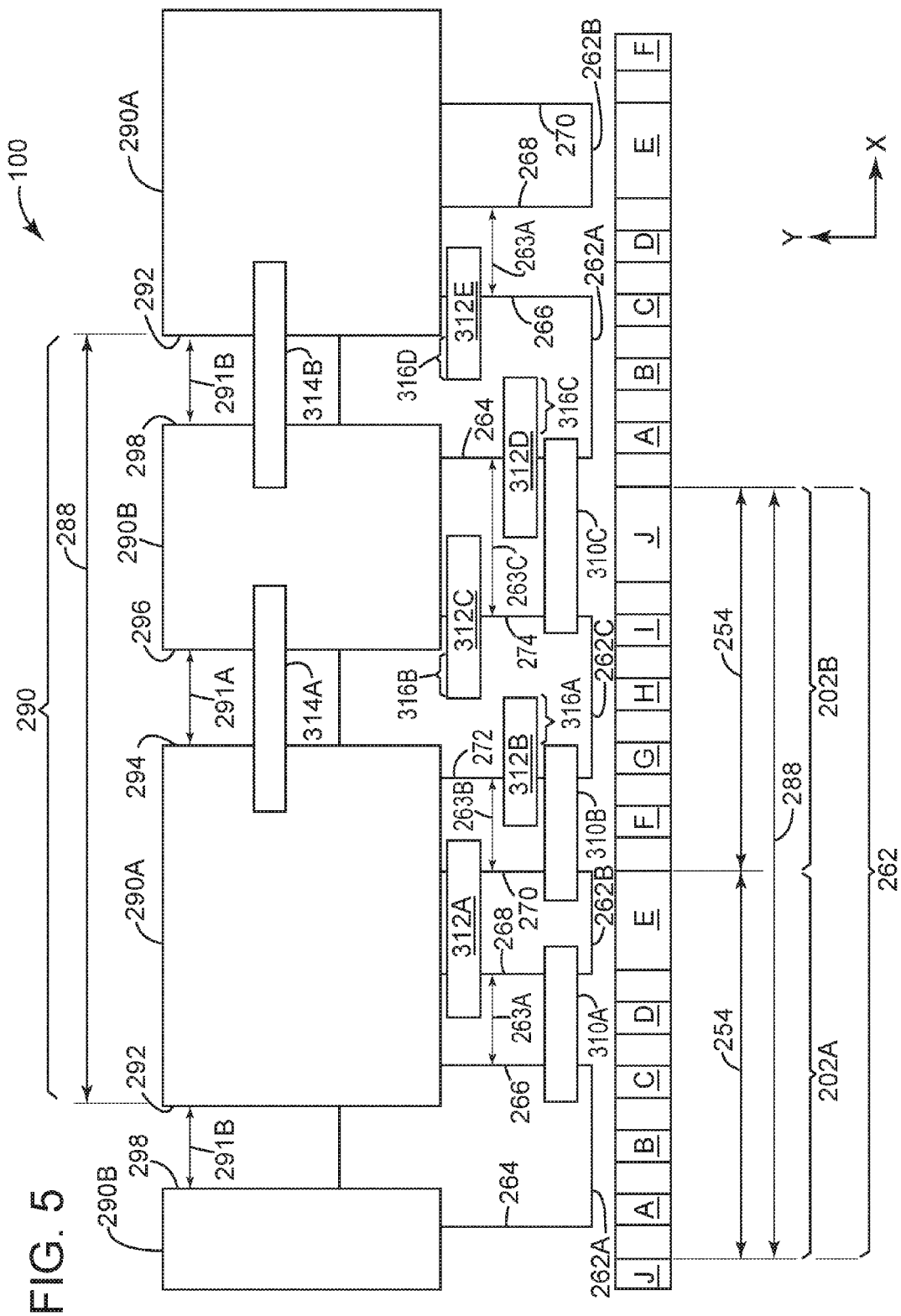

Referring to FIG. 5, a simplified top view of a plurality of the cells 202A, 202B of semiconductor structure 100 is presented. Additionally, superimposed over the cells 202A, 202B are the yet to be formed 1st mandrel cells 290 and 2nd mandrel cells 262. Finally, superimposed over the mandrel cells 290, 262 are yet to be formed 1st, 2nd and 3rd openings 310, 312, 314, which will be patterned into resist layers during the process flow of structure 100.

The 1st, 2nd and 3rd openings 310, 312, 314 are illustrated in FIG. 5 as having variable widths in the X direction and having relatively constant short lengths (i.e., lengths that are less than or equal to the minimum pitch or track length) in the Y direction. However, the lengths of the openings 310, 312, 314 may vary considerably and may be made much larger than the minimum pitch. Additionally, the openings 310, 312, 314 will be utilized to form self-aligned, variable length, continuity cuts (or continuity blocks) 418, 420 (best seen in FIG. 46) in the metal lines of cells 202A and 202B.

Additionally, the openings 310, 312, 314 can be utilized to form self-aligned, variable length, continuity cuts in cells having any number of lines with any number of track sizes. For example, as will be discussed in greater detail herein, openings 310, 312, 314 may be used to form self-aligned, variable length, continuity cuts in the 5 track cells 102. The continuity cuts can be self-aligned in the X direction with the metal lines and may be larger than the minimum line pitch in the Y direction. For example, the continuity cuts may be 2, 5, 10, 100 or more minimum line pitches in the Y direction.

The process flow that forms those continuity cuts will be discussed in greater detail herein. The superposition in FIG. 5 of these structures over the cells 202A, 202B are used to illustrate which specific structures control and define the openings 310, 312, 314 (and ultimately the continuity cuts 418, 420) of the cells 202A, 202B during the process flow of semiconductor structure 100.

In summary though:

The 1st openings 310 are lithographically patterned into the 1st mandrel cells 262 such that they entirely span the 1st mandrel spaces 263A, B, C. The 1st openings 310 are then etched down to be self-aligned at opposing distal ends (i.e., fully self-aligned) with the sidewalls of the 1st mandrels 262A, B, C.

The 2nd openings 312 are also lithographically patterned into the 1st mandrel cell 262 such that they either partially or entirely span the 1st mandrels 262A, B, C. The 2nd openings 312 are then etched down to be self-aligned with at least one sidewall of the 1st mandrels 262A, B, C. It is important to note, that at this stage of the process flow those 2nd openings 312 that entirely span a 1st mandrel are fully self-aligned on both opposing distal ends with both sidewalls of the spanned 1st mandrel, while those 2nd openings 312 that only partially span a 1st mandrel are only self-aligned at one distal end (i.e., partially self-aligned) with one sidewall of the spanned 1st mandrel.

The 3rd openings 314 are lithographically patterned into the 2nd mandrel cells 290 such that they entirely span the 2nd mandrel spaces 291A, B. The 3rd mandrel openings 314 are then etched down to be fully self-aligned at opposing distal ends with the sidewalls of the 2nd mandrels 290A, B.

Importantly, the 2nd mandrel cells 290 are positioned relative 1st mandrel cells 262 such that they cover and protect any structures formed from the self-aligned portions of the 1st and 2nd openings 310, 312 from any etching processes performed on the 3rd openings 314. However, the positioning of the 2nd mandrel cells 290 leaves exposed any non-self-aligned structures formed from the non-self-aligned portions 316 of the 2nd openings 312. As such, those non-self-aligned structures formed from the non-self-aligned portions 316 will be etched down during the process flow of the 3rd openings 314 to be "repaired" and self-aligned with sidewalls of the 2nd mandrels 290A, B. The net result is that the structures formed from the 2nd openings become fully self-aligned with sidewalls of both the 1st mandrels 262A, B, C and 2nd mandrels 290A, B, C.

It is important to note that in order for 2nd mandrel cells 290 to properly cover and protect structures formed from the self-aligned portions of the 1st and 2nd openings 310, 312, then the positioning of the 2nd mandrel cells 290 relative to the 1st mandrel cells 262 must be such that the 2nd mandrels 290A, B entirely overlay at least the 1st mandrel spaces 263A, B, C.

The 1st, 2nd and 3rd openings 310, 312, 314 are then etched down to form fully self-aligned continuity cuts in the metal lines of cells 202A, 202B.

The following FIGS. 6-46 will describe the detailed process flow utilized to form 6 track cells 202A and 202B, having an odd number of metal lines and line spaces, in semiconductor structure 100. The detailed process flow will focus on formation of the large, fully self-aligned, variable length, continuity cuts 418 and 420 and on the formation of the large ANA region 422.

The process flow utilized to form the 5 track cells 102, having an even number of metal lines and line spaces, in structure 100 is essentially the same. Therefore, FIGS. 6-46 will also illustrate the 5 track cell 102 formation and its process flow will be summarized herein.

Figure 6:
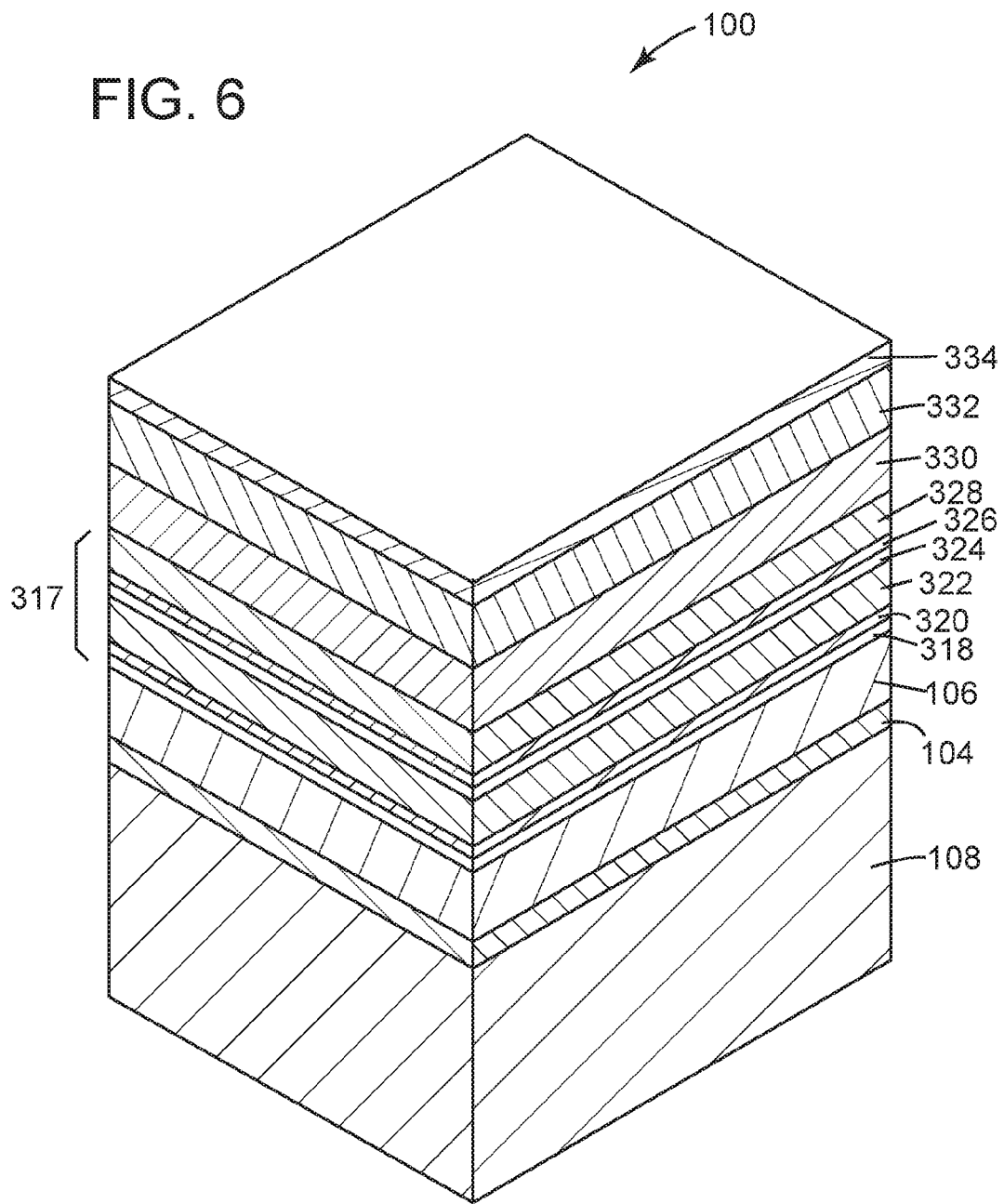

Referring to FIG. 6, a stack is provided which includes the buried layers 108, the etch stop layer 106 and the dielectric layer 104 as discussed earlier. Disposed respectively over the dielectric layer is a hardmask layer stack 317 that includes a 1st hardmask layer 318 composed of a titanium nitride (TiN) or similar material, a 2nd hardmask layer 320 composed of an amorphous silicon (aSi) or similar, a 3rd hardmask layer 322 composed of a silicon nitride (SiN) or similar, a 4th hardmask layer 324 composed of a TiN or similar, a 5th hardmask layer 326 composed of an aSi or similar, and a 6th hardmask layer 328 composed of a SiN or similar. Disposed over the 6th hardmask layer 328 is a 1st mandrel layer 330 composed of an aSi or similar.

Disposed over the 1st mandrel layer 330 is a 1st spin-on hardmask (SOH) layer 332 and a 1st SiON cap layer 334. The 1st SOH layer 332 may be an organic planarization layer (OPL) deposited through a spin-on process and may be composed of an organic material such as amorphous carbon (aC) or similar. The 1st SOH layer 332 and 1st SiON cap layer 334 are the first two layers of an exemplary 1st lithographic (litho) stack 336 (best seen in FIG. 7A).

Figure 7A:
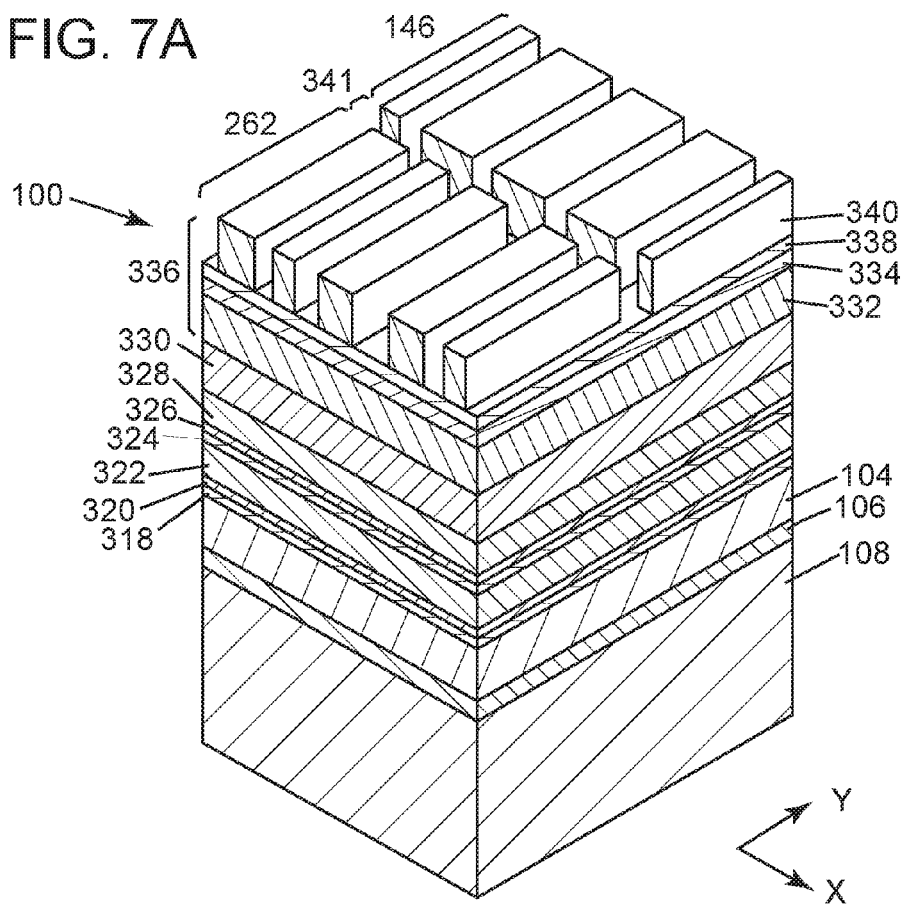
FIG. 7A is a perspective view of the structure of FIG. 6 with a 1st lithographic (litho) stack disposed thereon, the litho stack having a resist layer, the resist layer having five track and 6 track 1st mandrel cells having 1st mandrels patterned therein in accordance with the present invention.
Figure 7B:
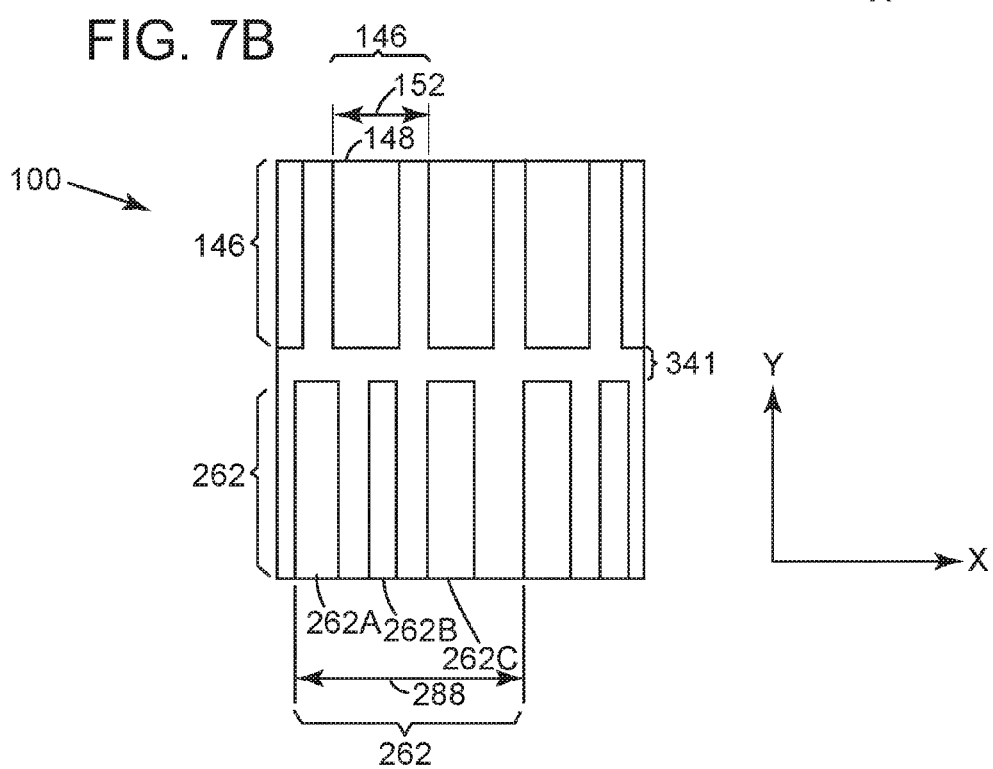
FIG. 7B is a top view of FIG. 7A in accordance with the present invention.

Referring to FIGS. 7A and 7B, a perspective view (FIG. 7A) and a top view (FIG. 7B) of the structure 100 of FIG. 6 after the litho stack 336 has been disposed onto structure 100 and patterned is presented. As illustrated, the 1st litho stack 336 is next completed and disposed onto the 1st mandrel layer 330. The litho stack 336 can be composed of several different kinds of layers, depending on such parameters as the application requirements, design or proprietary preferences or the like. One such stack of layers includes a stack of four thin films which includes (from bottom to top)

the 1st SOH layer 332, the 1st SiON cap layer 334, a 1st bottom antireflective coating (BARC) layer 338, and a 1st resist layer 340.

Once the stack 336 is disposed over the 1st mandrel layer 330, the 1st mandrel cells 262 for the 6 track cells 202A, 202B, which include 1st mandrels 262A, B, and C, are patterned into the resist layer 340 through well-known lithographic techniques. The 1st mandrel cells 262 are formed with the predetermined 1st mandrel pitch 288.

Though the detailed process flow for the formation of the 6 track cells 202A, B will be the primary focus herein, the process flow for the formation of the 5 track cells 102 will also be illustrated and summarized herein. Accordingly, the 1st mandrel cells 146 for the 5 track cells 102 are also patterned into the resist layer 340. The 1st mandrel cells 146 are formed with the predetermined 1st mandrel pitch 152.

The plurality of 6 track 1st mandrel cells 262 and the plurality of 5 track 1st mandrel cells 146 are separated by a large ANA space 341, which is also patterned into resist layer 340. As will be discussed in greater detail herein, it is within the ANA space 341 that an ANA region 422 (best seen in FIG. 46) will be formed into the dielectric layer 104. The ANA region 422, in this embodiment, separates and electrically isolates the plurality of 5 track cells 102 from the plurality of 6 track cells 202A, B and can be on the order of microns (as compared to nanometers) wide in the X direction. The ANA region 422 is also many times longer in the Y direction (for example 10 times or more) than the minimum pitch distance between metal lines in either of cells 102, 202A, 202B.

Figure 8:
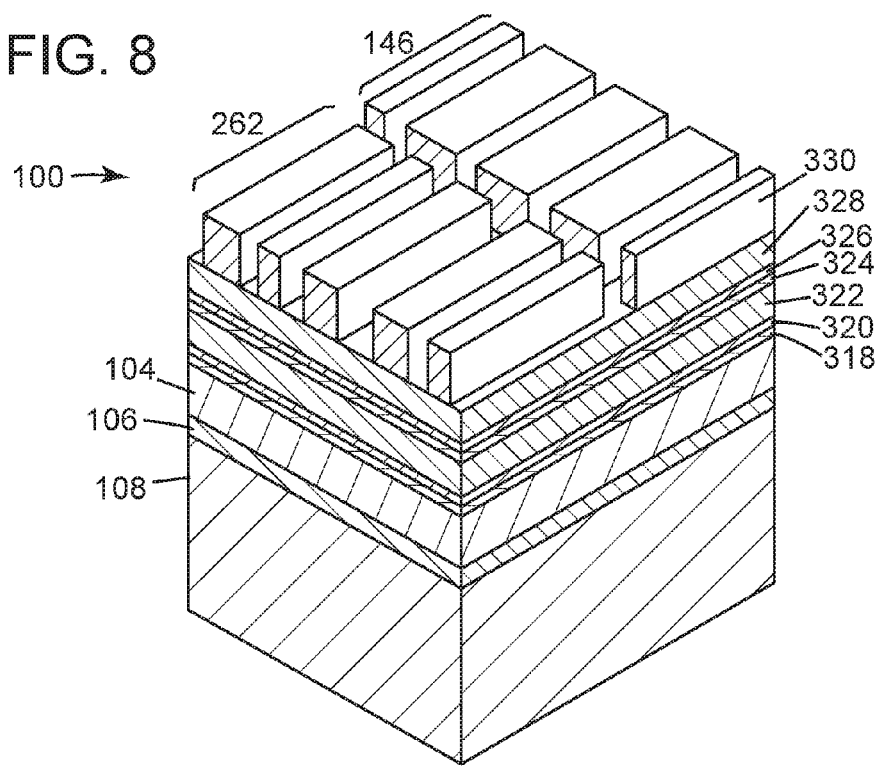
FIG. 8 is a perspective view the structure of FIG. 7A having the 1st mandrels patterned into the 1st mandrel layer in accordance with the present invention.

Referring to FIG. 8, the 1st 6 track mandrel cells 262 and 1st 5 track mandrel cells 146 are next patterned down to the 1st mandrel layer 330. For purposes of clarity, any feature herein, such as a spacer, a trench, an opening, a plug, a mandrel or the like, that is etched down (i.e., formed or patterned) from an original feature will be referred to as such original feature if it has the same form and function as the original feature. However, it is well-known that the etched down feature will be a translation of the original feature and will be composed of remnants of the various layers involved in the etching process. More specifically, in the case of the mandrel cells 262, the original mandrel cells 262 were etched into the resist layer 340 and may be composed primarily of material from resist layer 340 (best seen in FIG. 7A). However, once the mandrel cells 262 have been etched down and translated into the 1st mandrel layer 330, the mandrel cells 262 may be composed primarily of the aSi material of the 1st mandrel layer 330 (best seen in FIG. 8).

Figure 9:
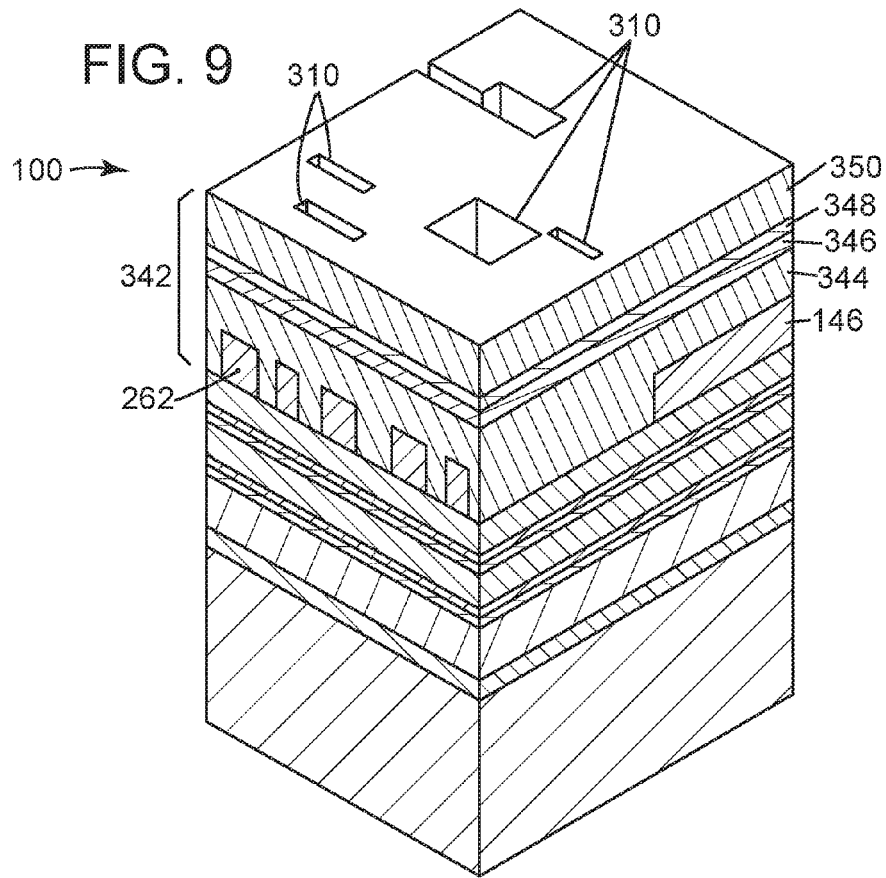
FIG. 9 is a perspective view of the structure of FIG. 8 having a 2nd lithographic stack disposed thereon and 1st openings patterned into a 2nd resist layer of the 2nd lithographic stack in accordance with the present invention.

Referring to FIG. 9, the process of patterning the 1st openings 310 into the structure 100 is initiated by next disposing a 2nd litho stack 342 over the 1st six track mandrel cells 262 and 1st five track mandrel cells 146.

Similar to the 1st litho stack 336, the 2nd litho stack 342 can be composed of a 2nd SOH layer 344, a 2nd SiON cap layer 346, a 2nd BARC layer 348, and a 2nd resist layer 350. The 1st openings 310 are then lithographically patterned into the 2nd resist layer 350 such that they at least span the 1st mandrel spaces 263 (best seen in FIG. 5) and 1st mandrel spaces 151 (best seen in FIG. 2). The 1st openings 310 also span targeted locations of fully self-aligned continuity cuts 418 (best seen in FIG. 46) in metal lines D, F and J of the 6 track cells 202A. These 1st openings 310 can have a variety of lengths in the Y direction, from 1 minimum metal line width 250 long to many minimum line pitches 260 long and more. For example, the 1st openings 310 can have lengths in the Y direction that are 2, 5, 10, 100 or more minimum line pitches 260.

Figure 10A:
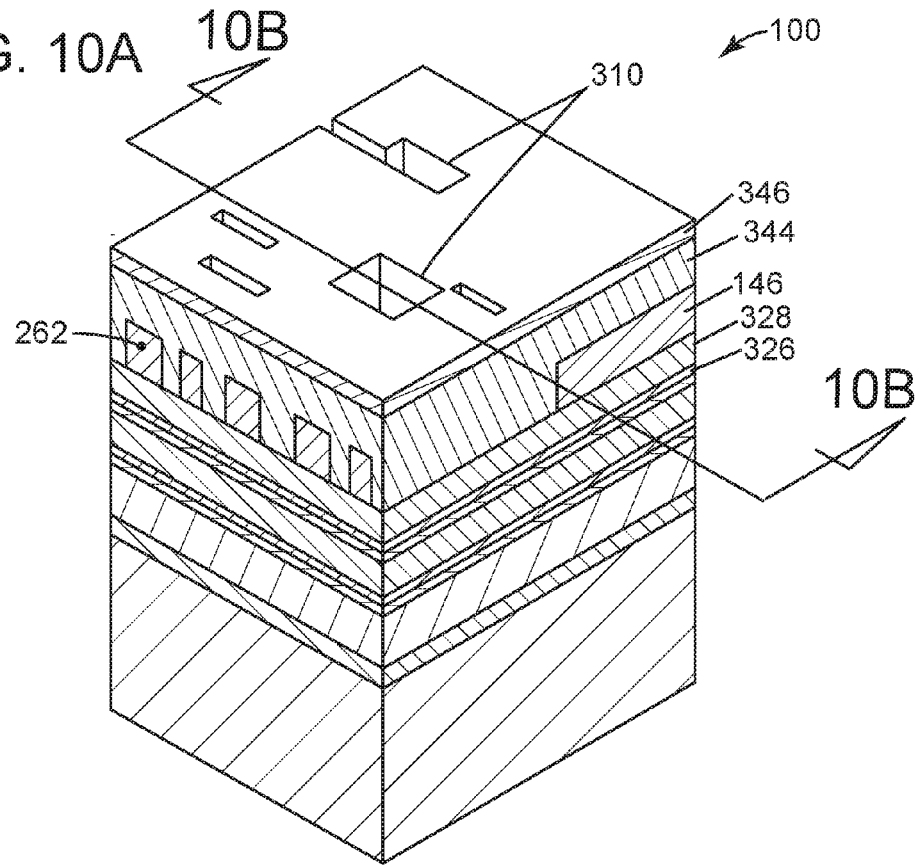
FIG. 10A is a perspective view of the structure of FIG. 9 having the 2nd litho stack stripped off of the structure and the 1st openings etched down past the 1st mandrels and through the 6th hardmask layer to land on the 5th hardmask layer in accordance with the present invention.

Referring to FIG. 10A, the 2nd resist layer 350 and 2nd BARC layer 348 are removed by, for example, an ashing process. The 1st openings 310 are then anisotropically etched down through the SiN 6th hardmask layer 328 to land on the aSi 5th hardmask layer 326. This can be done with a reactive ion etching (ME) process or similar.

Figure 10B:
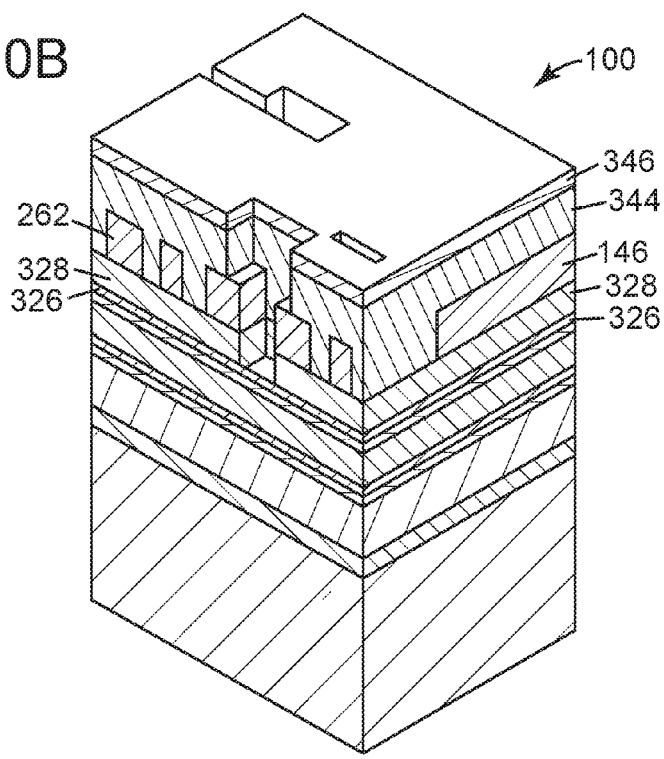
FIG. 10B is a perspective cross-sectional view of FIG. 10A taken along the line 10B-10B in accordance with the present invention.

Referring to FIG. 10B, a cross sectional view of FIG. 10A taken along the line 10B-10B is presented. In FIG. 10B it can be seen that the 1st openings 310 are etched down past the aSi 1st six and five track mandrel cells 262, 146 and through the SiN 6th hardmask layer 328 to land on the aSi 5th hardmask layer 326. Because the mandrel cells 262, 146 and 5th hardmask layer 326 are composed of the same or similar aSi material, the SiN 6th hardmask layer 328 may be anisotropically etched selective to the mandrel cells 262, 146 and 5th hardmask layer 326 such that the sidewalls 264-274 (best seen in FIG. 5) of the 1st six track mandrel cells 262 and the sidewalls 149A, 149B (best seen in FIG. 2) of the 1st five track mandrel cells 146 define (or self-align with) the edges of the 1st openings 310 in the SiN 6th hardmask layer 328.

For purposes of brevity, only the flow process for formation of the 6 track metal line cells 202A, 202B will be discussed in detail hereinafter. However, the flow process for formation of the 5 track metal line cells 102 is essentially the same and is illustrated in the following FIGS. 11-46.

Figure 11:
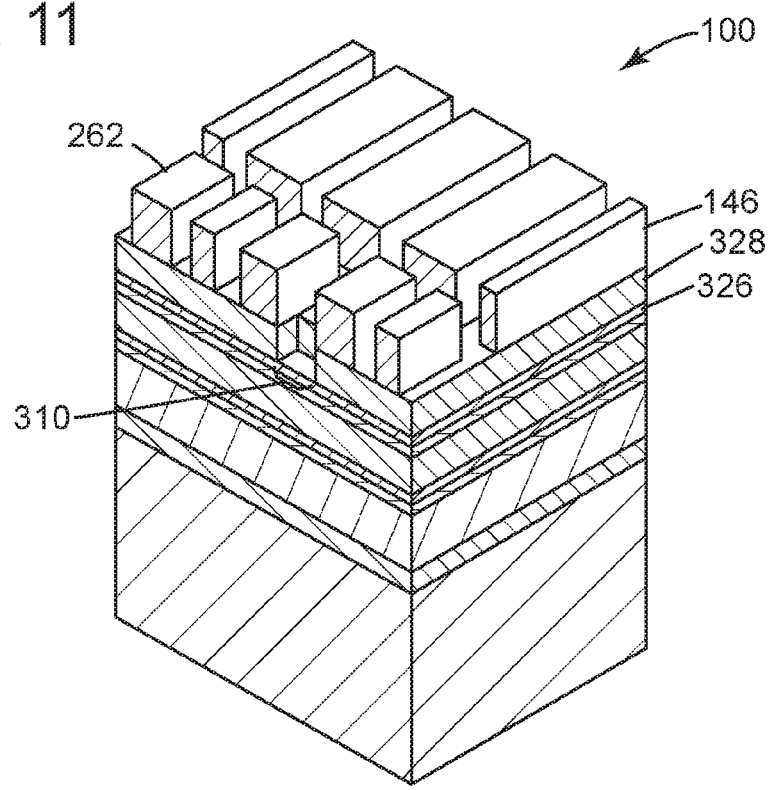
FIG. 11 is a perspective view of FIG. 10A having a 2nd SOH layer of the 2nd litho stack stripped off in accordance with the present invention.

Referring to FIG. 11, after the 1st openings 310 are self-aligned with the sidewalls 264-274 of the 1st mandrel cells 262 within the 6th hardmask layer 328, the 2nd SOH layer 344 is stripped off of structure 100. This may be done by several well-known processes, such as wet etching, ashing or similar.

Figure 12:
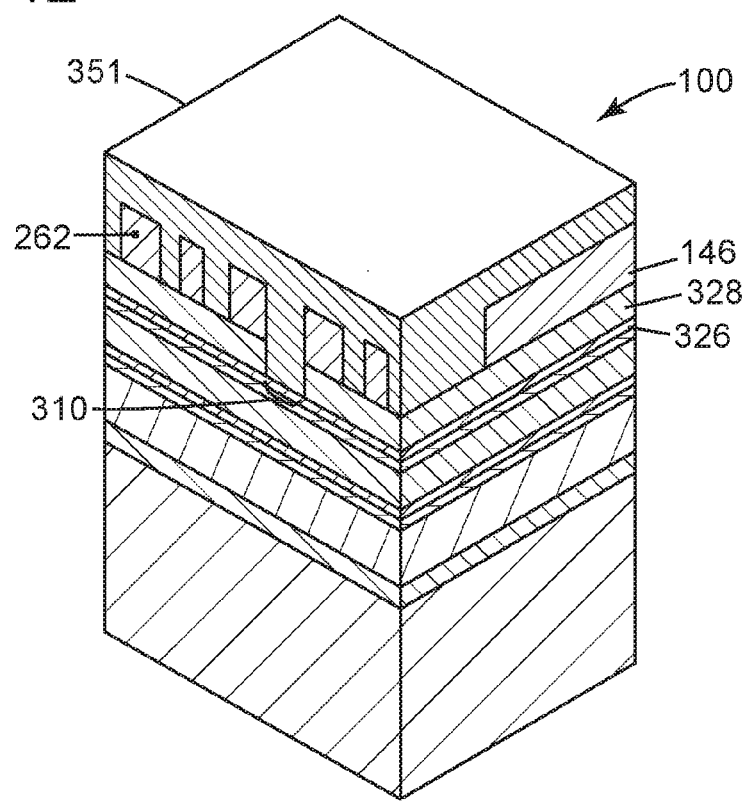
FIG. 12 is a perspective view of FIG. 11 having a 1st refill layer disposed thereon in accordance with the present invention.

Referring to FIG. 12, a 1st refill layer 351 is next disposed over the structure 100 to completely fill and protect the variably sized 1st openings 310 and the type five and type six 1st mandrel cells 262, 146. More specifically, any 1st openings 310 that are longer in the Y direction than the minimum line pitch 260, will be difficult to plug with a conventional ALD process of the type used to form the 2nd mandrel spacers 276-286. Accordingly, in order to fill and protect 310 openings that are longer in the Y direction than the minimum line pitch 260 of the metal line cells 202A, 202B and/or are many times wider in the X direction than the minimum line pitch 260, the 1st refill layer 351 is utilized. The refill layer 351 can be disposed with a flowable chemical vapor deposition (FCVD) process or similar and can be applied to thicknesses that are much greater than the thickness of a spacer applied by an ALD process. For example the refill layer may have a thickness that is 40-120 nm or greater.

The 1st refill layer 351 may be composed of an oxide material such as silicon dioxide (SiO2), SiCOH, metal oxide like TiOx or similar. However, it is desirable that the material of the refill layer 351 have good gap-fill properties, be selective to both the aSi of the 1st mandrel cells 262 and the SiN of the 6th hardmask layer 328, and is preferably self-planarizing. It may be deposited planar using a CVD, flowable CVD or spin-on process, as an example. Alternatively, a CMP process could be used post deposition.

Figure 13:
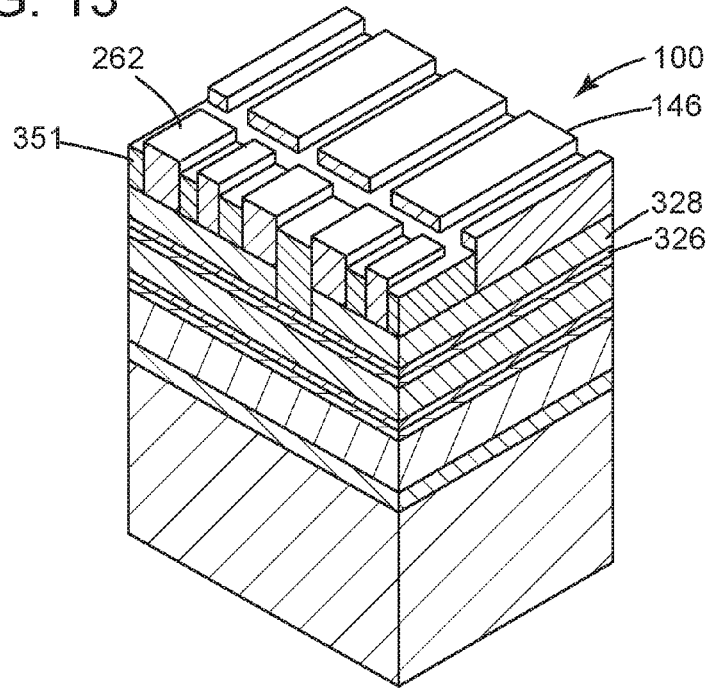
FIG. 13 is a perspective view of FIG. 12 having the 1st refill layer recessed in accordance with the present invention.

Referring to FIG. 13, after the 1st refill layer 351 has been disposed over structure 100, it is then recessed back be a RIE process or similar. The refill layer 351 is recessed below the top surface of the 1st mandrel cells 262 and above the top surface of the 6th hardmask layer 328.

Figure 14:
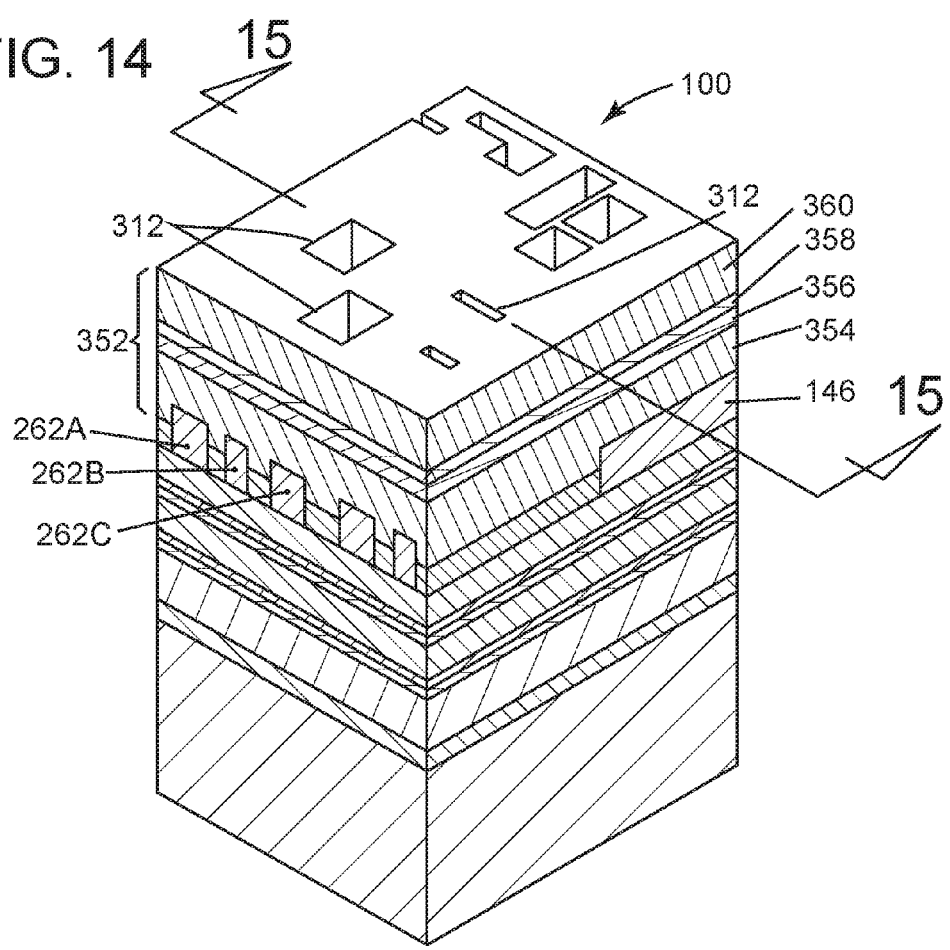
FIG. 14 is a perspective view of the structure of FIG. 13 having a 3rd lithographic stack disposed thereon and 2nd openings patterned into a 3rd resist layer of the 3rd lithographic stack in accordance with the present invention.

Referring to FIG. 14, the process of patterning the 2nd openings 312 into the structure 100 is initiated by next disposing a 3rd litho stack 352 over the 1st mandrel cells 262. Similar to the 1st and 2nd litho stacks 336 and 342, the 3rd litho stack can be composed of a 3rd SOH layer 354, a 3rd SiON cap layer 356, a 3rd BARC layer 358, and a 3rd resist layer 360. The 2nd openings 312 are then lithographically patterned into the 3rd resist layer 360 such that they either partially or entirely span the 1st mandrels 262A, 262B, 262C.

After patterning into the resist layer, the 2nd openings 312 are next anisotropically etched down into the 1st mandrel cells 262 such that they land on and expose the top surfaces of the 1st refill layer 351 and the SiN 6th hardmask layer 328.

Figure 15:
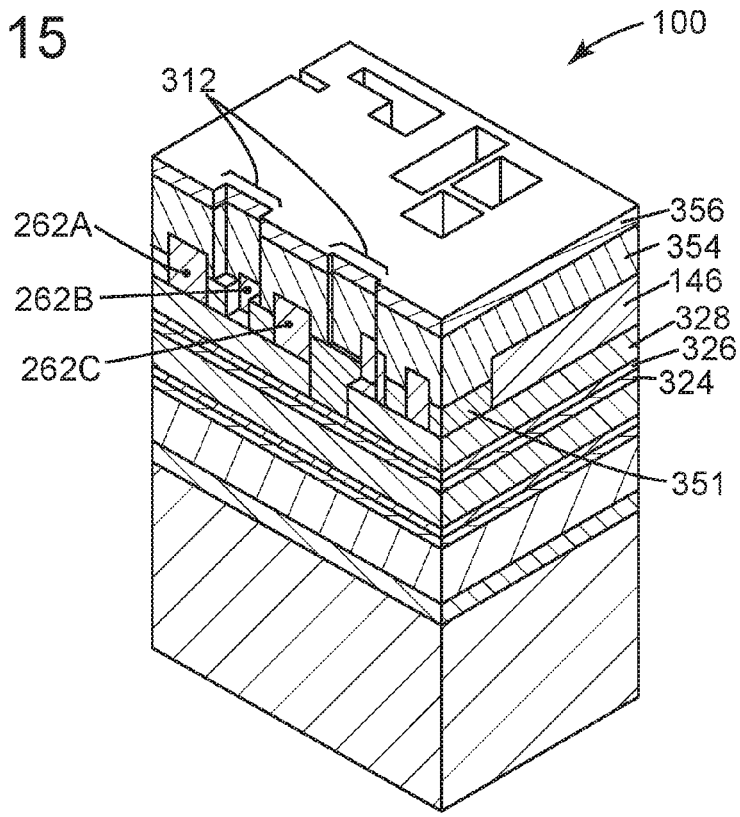
FIG. 15 is a perspective cross-sectional view of FIG. 14 taken along the line 15-15 after the 3rd resist layer and a 3rd BARC layer of the 3rd litho stack have been removed in accordance with the present invention.

Referring to FIG. 15, a cross sectional view of FIG. 14 taken along the line 15-15 is presented. In FIG. 15, the 3rd resist layer 360 and 3rd BARC layer 358 have been removed. This can be done by such processes as wet etching, ashing or similar. In FIG. 15 it can be seen that the 2nd openings 312 are etched down through the 1st mandrel cells 262 to land on the top surfaces of the 1st refill layer 351 and 6th hardmask layer 328.

At this stage of the process flow, the 2nd openings 312 have been etched through targeted locations of the 1st mandrels 262A, 262B, 262C such that at least one end of each opening 312 spans over at least one sidewall 264-274 (best seen in FIG. 5) of the 1st mandrels to become self-aligned with that sidewall. It is important to note, that at this stage of the process flow those 2nd openings 312 that entirely span a 1st mandrel (such as 2nd opening 312A entirely spanning 1st mandrel 262B in FIG. 5) will be fully self-aligned on both opposing distal ends, while those 2nd openings 312 that only partially span a 1st mandrel (such as 2nd mandrel opening 312B partially spanning 1st mandrel 262C in FIG. 5) will only be self-aligned at one distal end (i.e., partially self-aligned). The partially self-aligned 2nd mandrel openings will have a non-self-aligned portion 316 on their non-self-aligned end. The 2nd mandrel openings 312 also span across predetermined locations of the A, C, E, G and I lines and will be used to form fully self-aligned continuity cuts 418 (best seen in FIG. 46) later in the process flow.

It is also important to note, that due to lithographic variability, the non-self-aligned portions 316 (best seen in FIG. 5) of the 2nd openings, that do not span over a 1st mandrel sidewall, will almost certainly over-extend to metal lines that are adjacent to the targeted lines A, C, E, G. As such, if these non-self-aligned portions 316 are not repaired (or removed) later in the process flow, they will end up forming unwanted notches or cuts in the neighboring lines.

Figure 16:
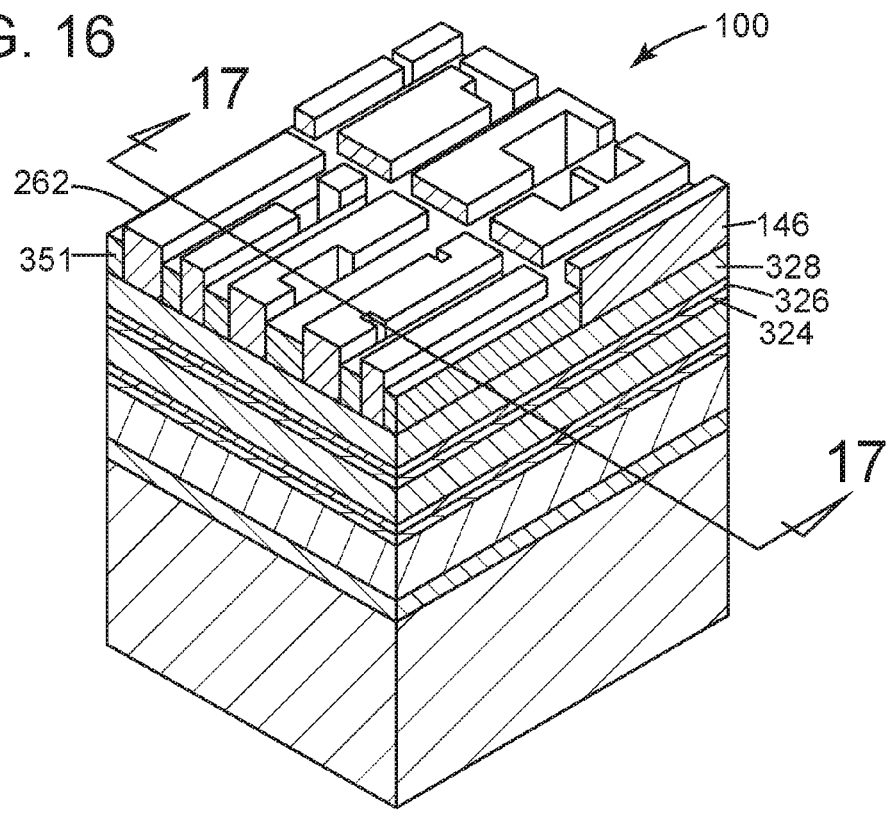
FIG. 16 is a perspective view of FIG. 15 having a 3rd SiON layer and a 3rd SOH layer of the 3rd litho stack removed in accordance with the present invention.

Referring to FIG. 16, the 3rd SiON cap layer 356 and the 3rd SOH layer 354 are stripped off of structure 100. This may be done by several well-known processes, such as wet etching, ashing or similar.

Figure 17:
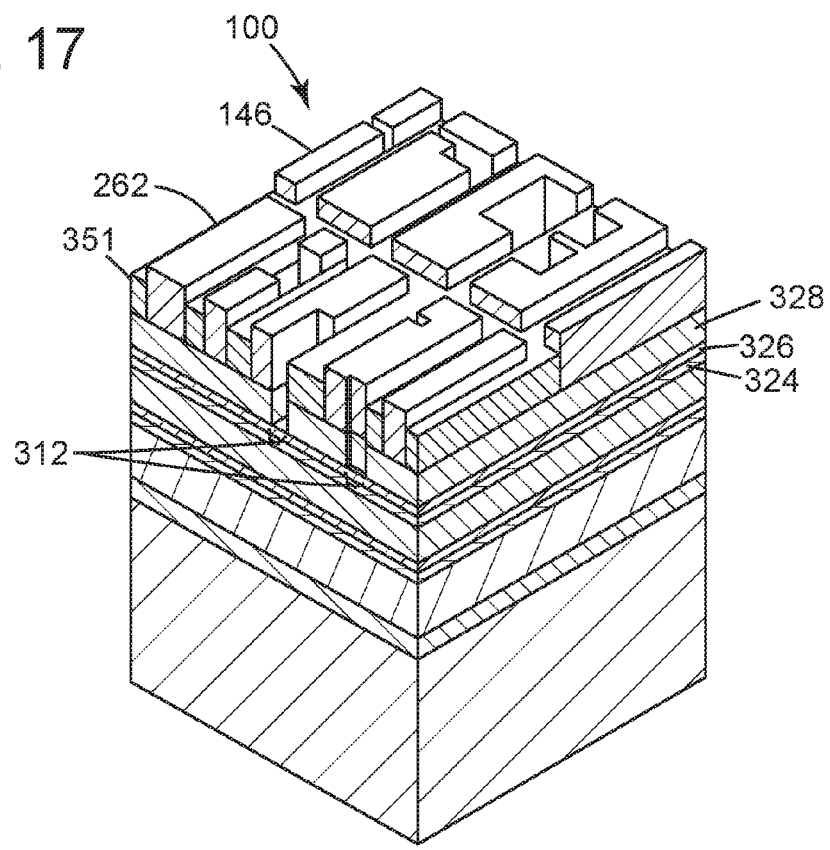
FIG. 17 is a cross sectional perspective view of FIG. 16 taken along the line 17-17 having the 2nd openings etched through the 6th hardmask layer in accordance with the present invention.

Referring to FIG. 17, the 2nd openings 312 are next anisotropically etched through the SiN 6th hardmask layer 328 to land on the aSi 5th hardmask layer 326. This can be done by a RIE process or similar.

Note that the etching process was chosen to be selective to the oxide material of the 1st refill layer 351. As such the 1st openings 310 remain undamaged by the etching process that transfers the 2nd openings 312 into the 6th hardmask layer 328. Accordingly, both the 1st openings 310 and 2nd openings 312 are now disposed into the 6th hardmask layer with the 1st openings being covered by the 1st refill layer 351.

Figure 18:
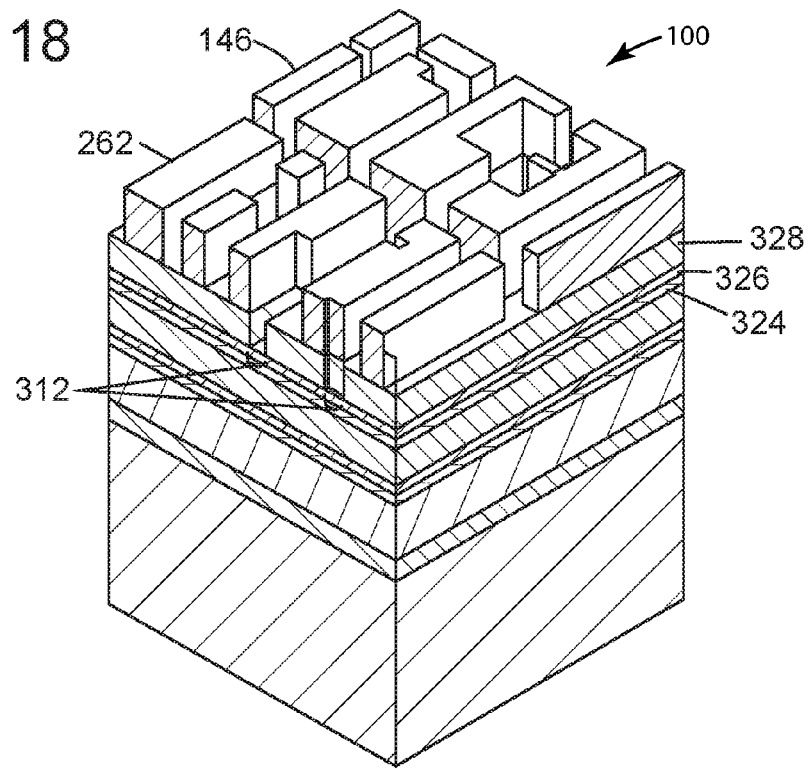
FIG. 18 is a perspective view of FIG. 17 having the 1st refill layer removed in accordance with the present invention.

Referring to FIG. 18, the 1st refill layer 351 is removed. As such both the 1st openings 310 and 2nd openings 312 are now exposed in the SiN 6th hardmask layer 328. This can be done by wet etch or similar.

Referring to FIG. 19A, a perspective view of FIG. 18 having a 1st mandrel spacer layer 362 dispose thereon is presented. The 1st mandrel spacer layer 362 has a predetermined first mandrel spacer layer thickness 364 and is conformally coated over the 1st mandrels 262A, 262B, 262C of the 1st mandrel cells 262. The first mandrel spacer layer 362 may be an oxide layer (such as SiO2) and may be coated over the mandrel cells 262 by an atomic layer deposition (ALD) process.

Due to the ALD process, the thickness 364 of spacer layer 362 can be precisely controlled (e.g., plus or minus 2 nm), but is thin. That is, the thickness 364 typically ranges between 8-20 nm thick, which is significantly smaller than a typical minimum line pitch 260. As such, the spacer layer 362 cannot fill large openings (such as openings 310 and 312) that are greater than the minimum line pitch 260 in both the X and Y directions, for example.

Figure 19B:
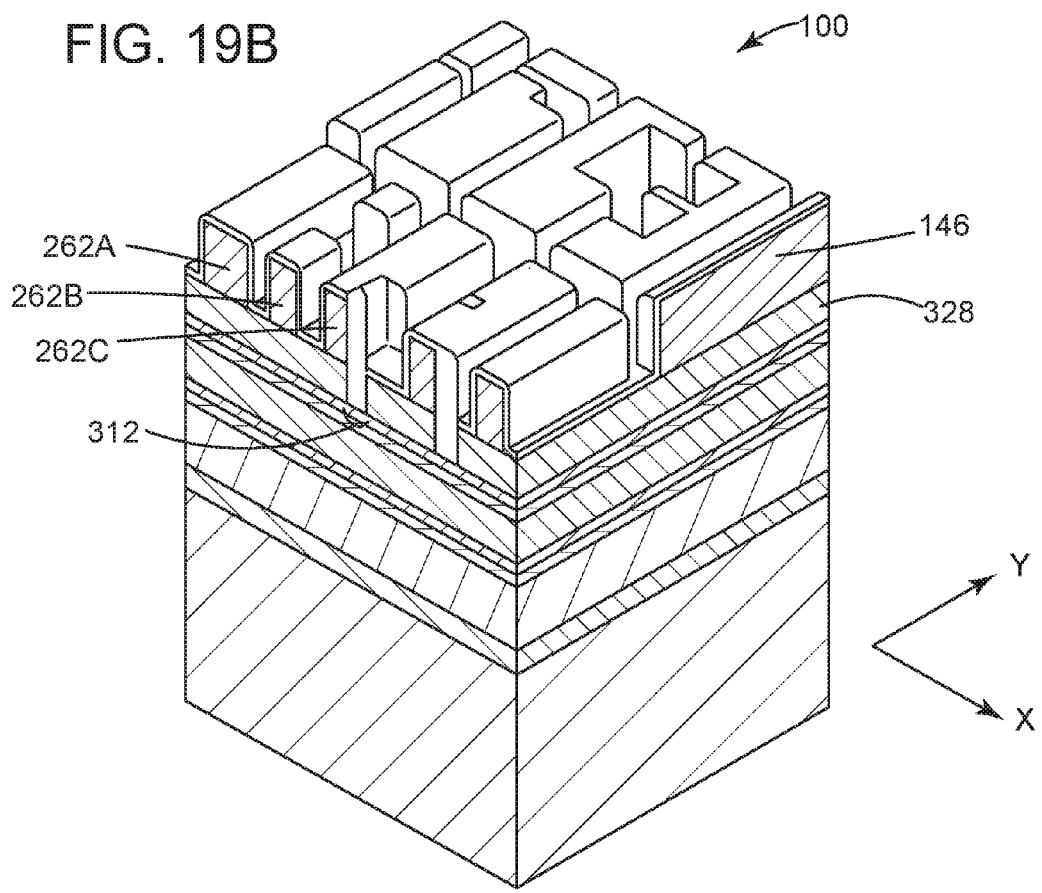
FIG. 19B is a cross-sectional perspective view of FIG. 19 A taken along the line 19B-19B in accordance with the present invention.

Referring to FIG. 19B, a cross sectional view along the X direction of FIG. 19A taken along the line 19B-19B is presented. By way of example, this view shows a cross-section of a 2nd opening 312 that is wide (i.e., greater than the minimum line pitch 260) in the X direction and long (i.e., also greater than the minimum line pitch 260) in the Y direction. The opening is a 2nd opening 312 because it is disposed partially through 1st mandrel 262C. As can be seen, the 1st mandrel spacer layer 362 does not fill the large 2nd opening 312. Rather the 1st mandrel spacer layer 362 coats this 2nd opening along its sidewalls and over its bottom surface.

Figure 19C:
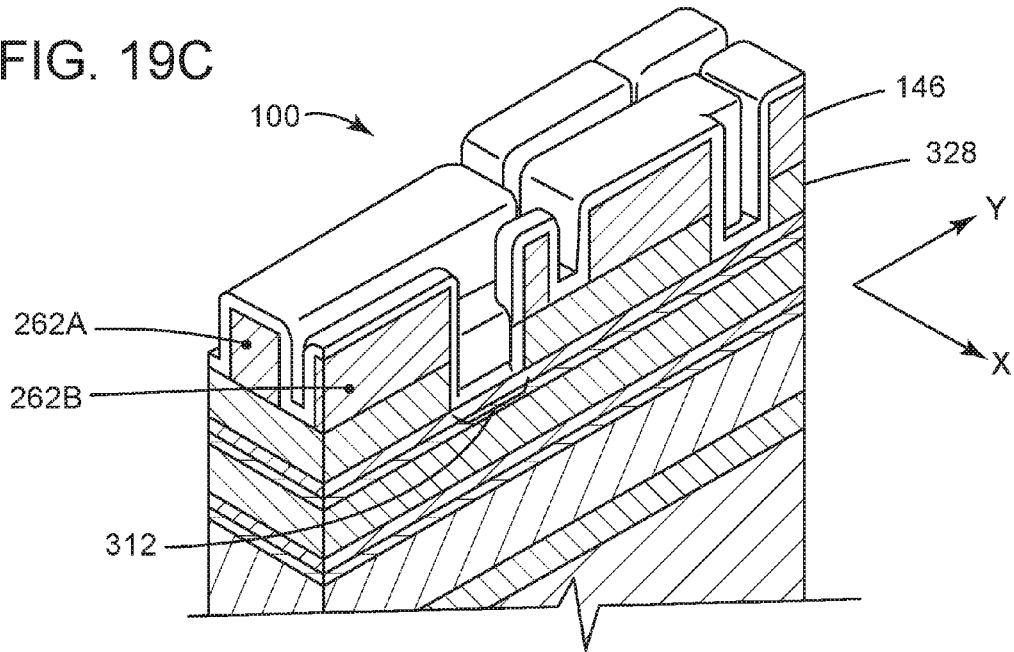
FIG. 19C is a cross-sectional perspective view of FIG. 19 A taken along the line 19C-19C in accordance with the present invention.

Referring to FIG. 19C, a cross sectional view along the Y direction of FIG. 19A taken along the line 19C-19C is also presented. Also by way of example, this view also shows a cross-section of a large 2nd opening 312 (i.e., large because 2nd opening 312 is both wide in the X direction and long in the Y direction). This opening is a 2nd opening because it is at least partially disposed in 1st mandrel 262B. As can be seen, the 1st mandrel spacer layer 364 does not fill the large 2nd opening 312. Rather the 1st mandrel spacer layer 362 coats this 2nd opening 312 along its sidewalls and over its bottom surface.

Figure 20:
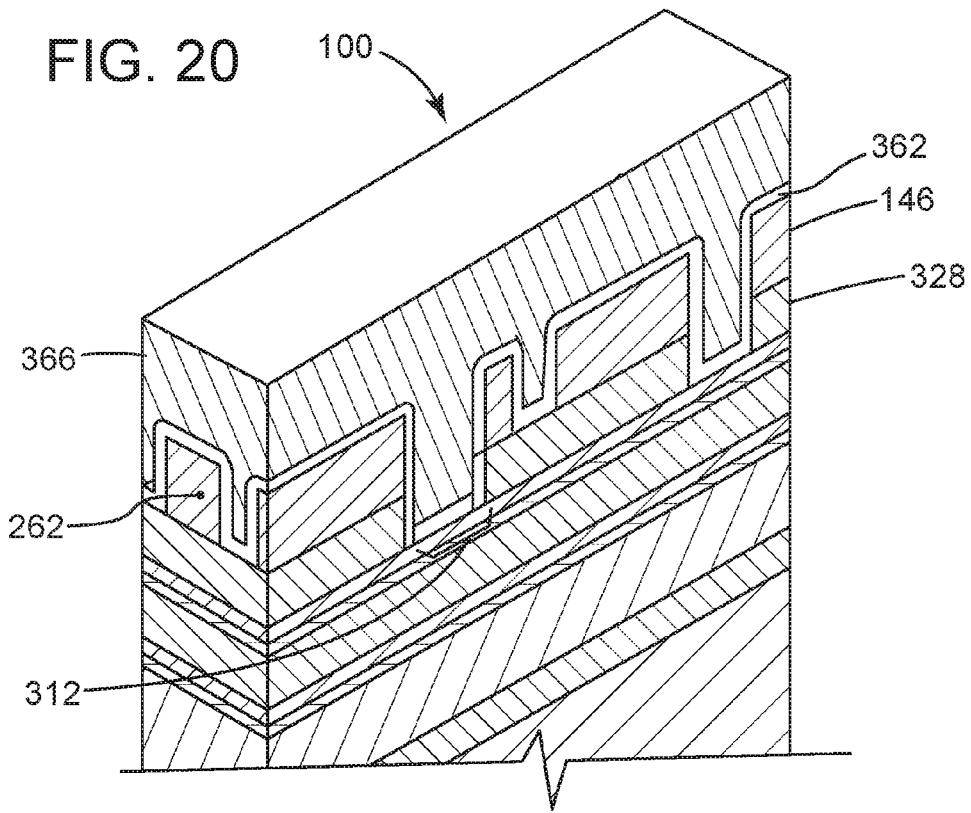
FIG. 20 is a perspective view of FIG. 19C having a 2nd refill layer disposed thereon in accordance with the present invention.

Referring to FIG. 20, a cross-sectional view of FIG. 19C after a 2nd refill layer 366 is disposed over the structure 100. The 2nd refill layer 366 may be a spin-on hardmask (SOH) layer, which completely covers 1st mandrel spacer layer 362. The SOH refill layer 366 also completely fills the openings 310, 312 disposed in the SiN 6th hardmask layer.

Figure 21:
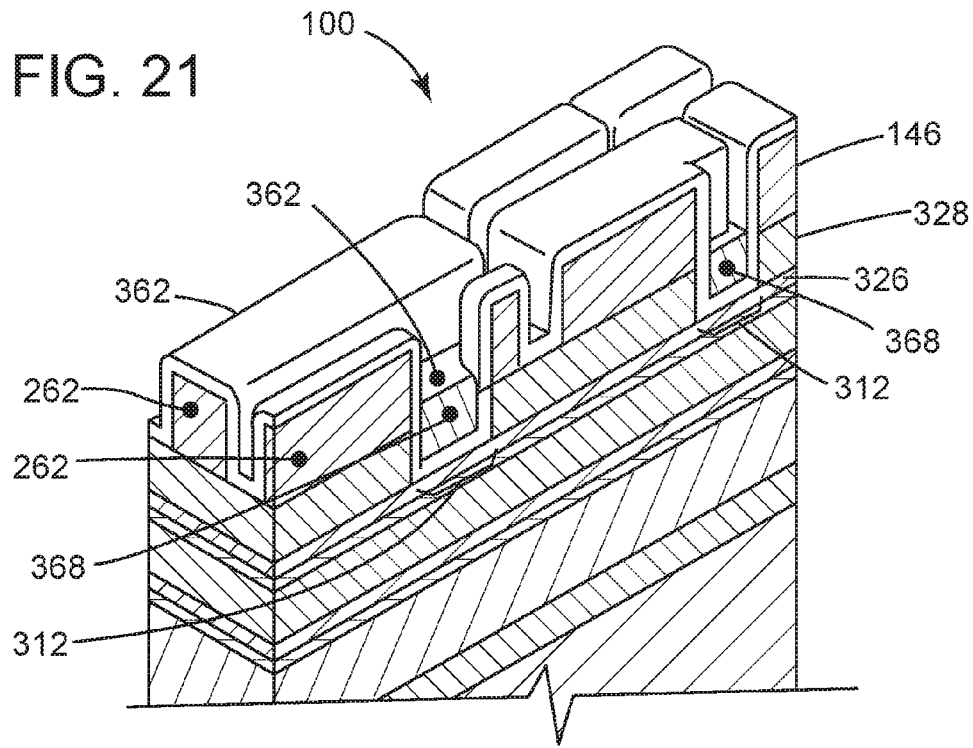
FIG. 21 is a perspective view of FIG. 20 having the 2nd refill layer recessed to form 1st and 2nd opening plugs disposed in the 1st and 2nd openings in accordance with the present invention.

Referring to FIG. 21, the SOH 2nd refill layer 366 in next recessed down to below the level of the top surface of the SiN 6th hardmask layer 328 and above the level of the top surface of the aSi 5th hardmask layer 326. The recessing may be done by an anisotropic etching process, such as a RIE process or similar.

The recessing of the refill layer 366 is done to expose the spacer layer 362 that is disposed on the top surface of the 6th hardmask layer 328, which is essentially the bottom of the trenches formed between the mandrels 262 and the top surface of the 6th hardmask layer 328. The recessing of the refill layer 366 is also done to form a plurality of 1st and 2nd opening plugs 368, which fill the 1st and 2nd large openings 310, 312 disposed in the 6th hardmask layer 328.

The SOH 1st and 2nd opening plugs 368 will be subjected to certain etching processes later during the process flow. The height of the plugs 368 is defined by the thickness of the 6th hardmask layer 328. For that reason, the 6th hardmask layer 328 must be thick enough to allow the plug 368 to survive those etching processes without being entirely etched away. Typically, the thickness of the 6th hardmask layer 328 is within a range of 50-100 nm and is at least two, three or even four times as thick as the 4th and 5th hardmask layers 324, 326.

Figure 22:
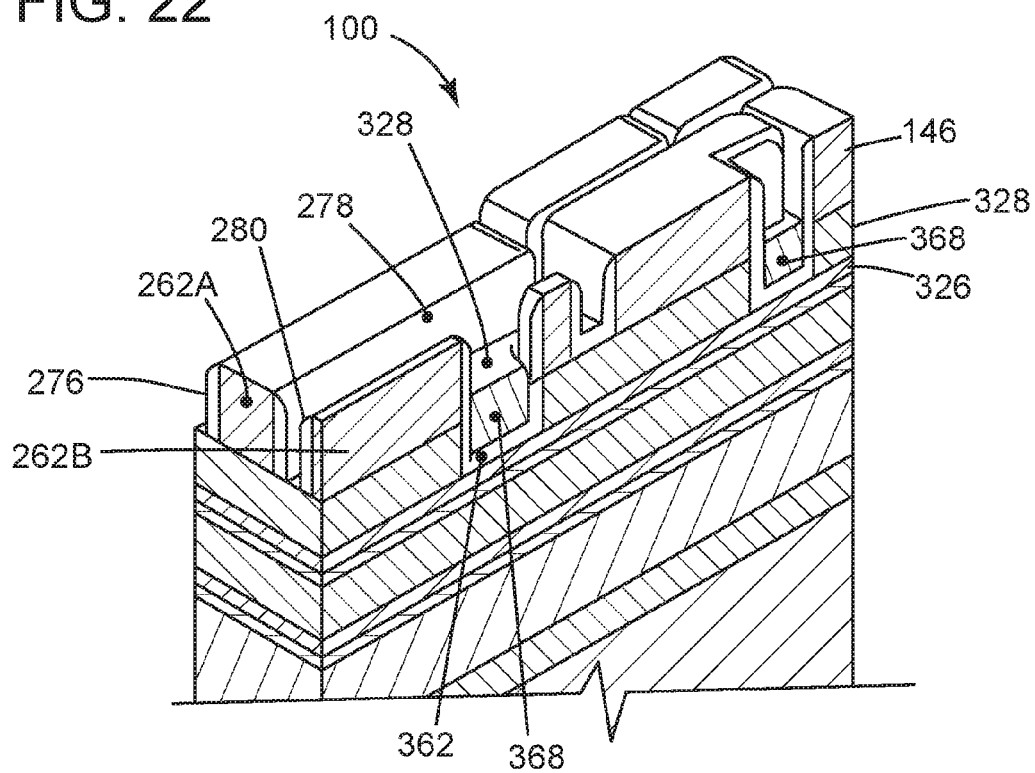
FIG. 22 is a perspective view of FIG. 21 having the 1st mandrel spacer layer etched to form 1st mandrel spacers on sidewalls of the 1st mandrels in accordance with the present invention.

Referring to FIG. 22, the SiO2 1st mandrel spacer layer 362 is anisotropically etched to expose the top surfaces of the 6th harmask layer 328. Additionally, the spacer layer 362 is etched to form the 1st mandrel spacers 276-286 on sidewalls 264-274 of the 1st mandrels 262A, 262B, 262C (best seen in FIG. 4). In this embodiment, the 1st mandrel spacers 276-286 have a width that is equal to the 1st mandrel spacer layer thickness 364 and is also equal to the line space width 252.

Figure 23:
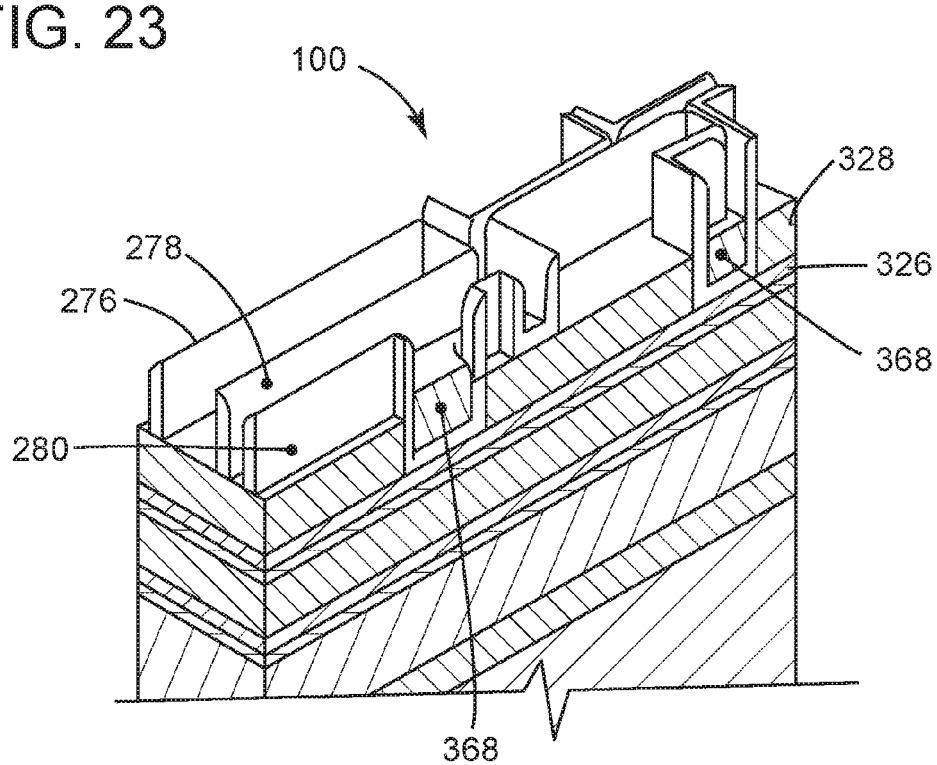
FIG. 23 is a perspective view of FIG. 22 having the 1st mandrels removed in accordance with the present invention.

Referring to FIG. 23, the 1st mandrels 262 are next pulled. This can be done with a wet etching process or similar.

Figure 24:
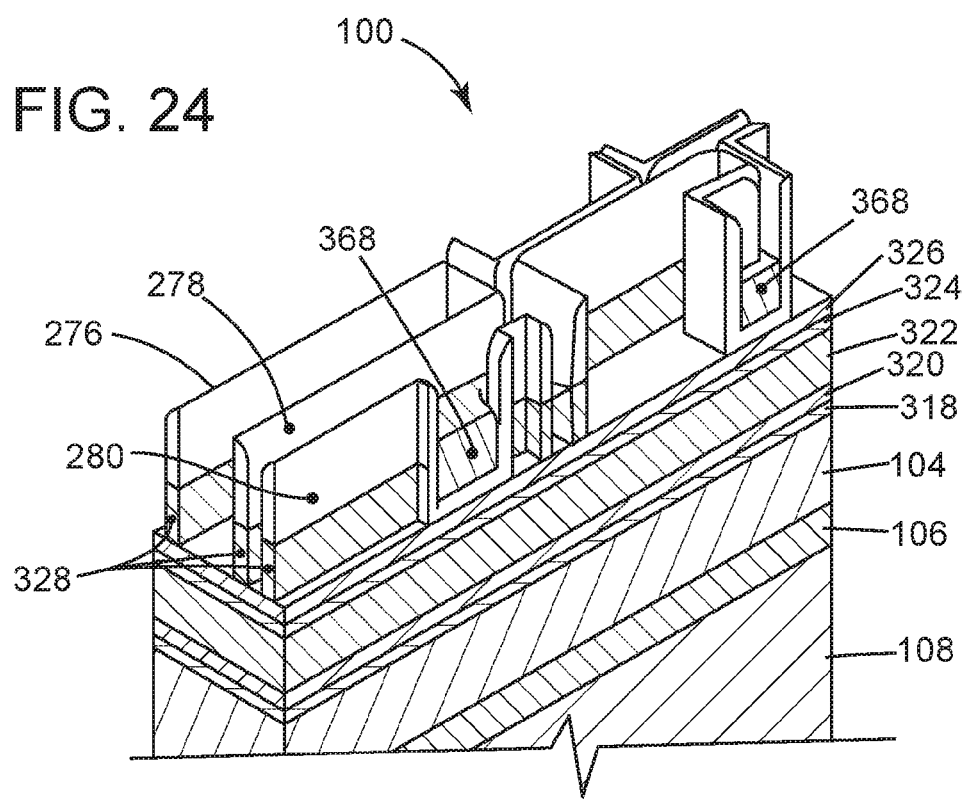
FIG. 24 is a perspective view of FIG. 23 having the 1st mandrel spacers and the 1st and 2nd opening plugs etched down to the 5th hardmask layer in accordance with the present invention.

Referring to FIG. 24, the 1st mandrel spacers 276-286, as well as the 1st and 2nd opening plugs 368, are next anisotropically etched down to the top of the aSi 5th hardmask layer 326. Any exposed portion of the SiN 6th hardmask layer 328 is etched away during the process. The etching process can be a RIE process or similar.

Figure 25:
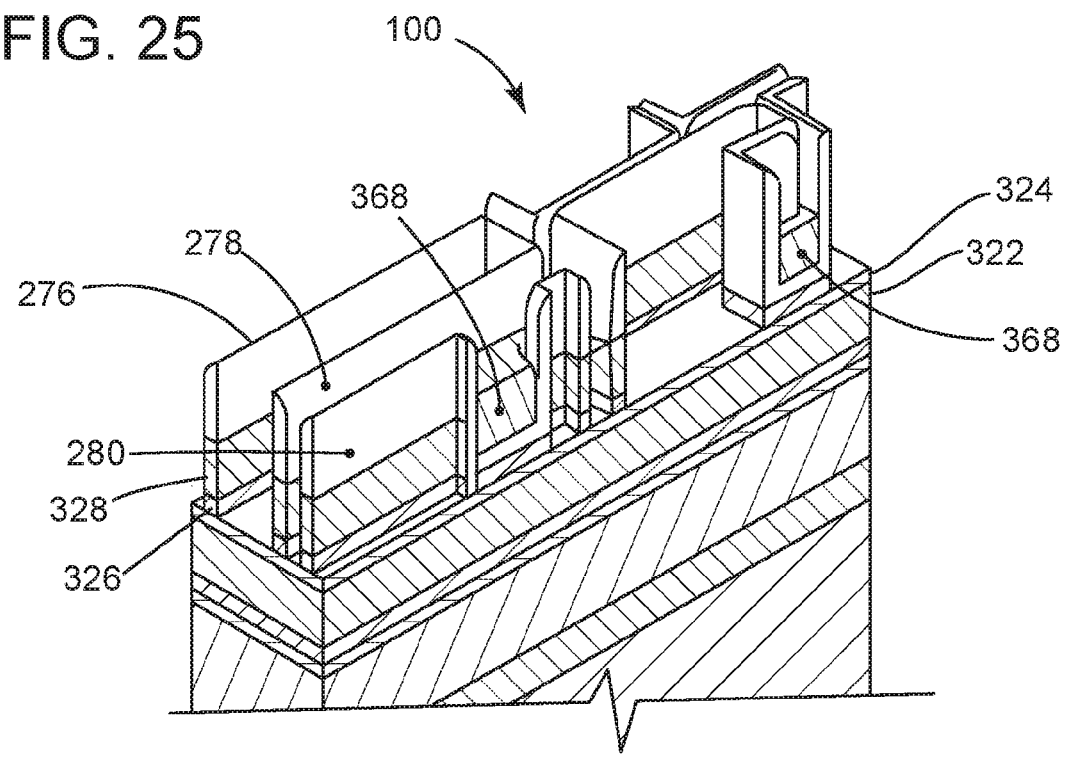
FIG. 25 is a perspective view of FIG. 24 having the 1st mandrel spacers and the 1st and 2nd opening plugs etched down to the 4th hardmask layer in accordance with the present invention.

Referring to FIG. 25, the 1st mandrel spacers 276-286, as well as the plugs 368, are next etched down to the top of the TiN 4th hardmask layer 324. The etching process can also be a RIE process or similar.

Figure 26:
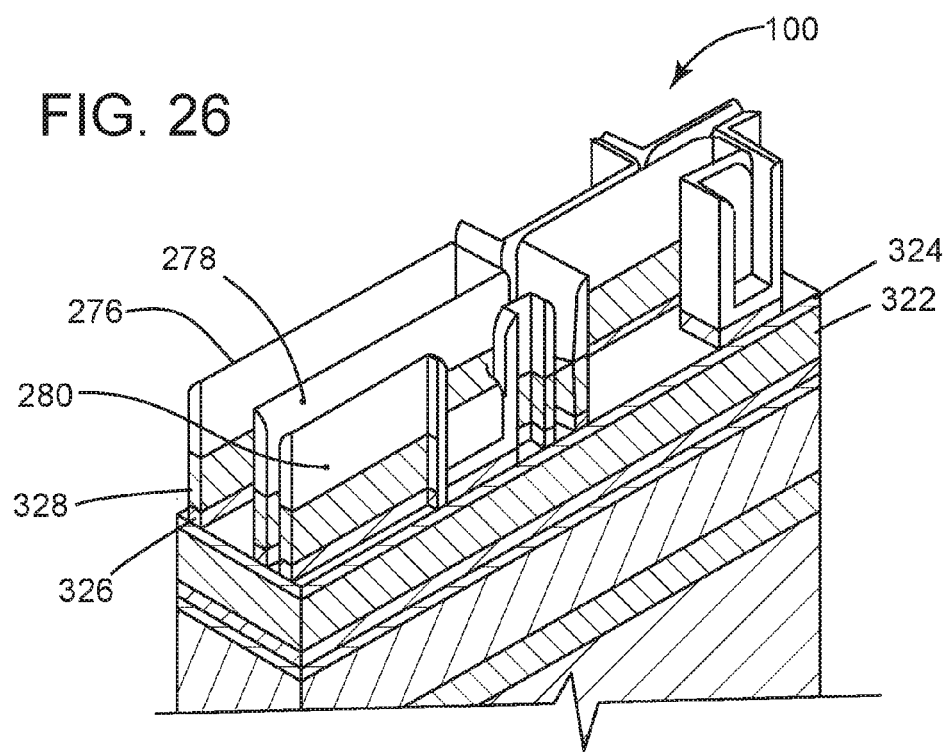
FIG. 26 is a perspective view of FIG. 25 having the 1st and 2nd opening plugs removed in accordance with the present invention.

Referring to FIG. 26, the SOH plugs 368 are next removed. This can be done be a wet etching process or similar.

Figure 27B:
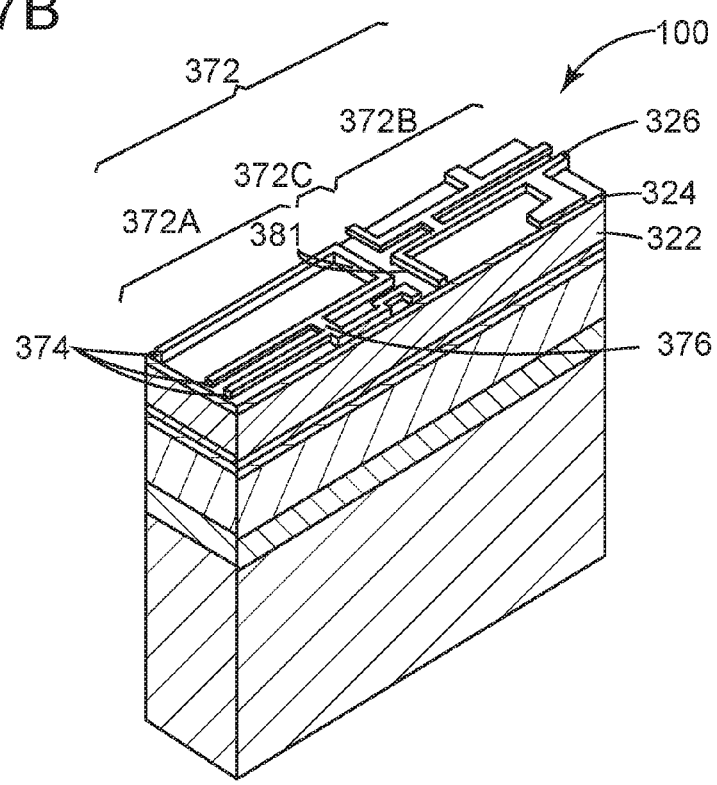
FIG. 27B is a cross sectional view of FIG. 27A and also a perspective view of FIG. 26 wherein the 1st mandrel spacers and the remainder of the 6th hardmask layer are removed to reveal a 1st pattern portion disposed on the 4th hardmask layer in accordance with the present invention.

Referring to FIGS. 27A and 27B, wherein 27B is a cross-sectional view of FIG. 27A taken along the line 27B-27B. Note that FIG. 27A is a full perspective view of FIG. 26 at this next stage of the process flow. In FIGS. 27A and 27B, the 1st mandrel spacers 276-286 and remainder of the SiN 6th hardmask layer 328 are removed via any one of several well-known processes to reveal a 1st pattern portion 372 that has been memorized into the aSi 5th hardmask layer 326 and disposed over the TiN 4th hardmask layer 324.

The 1st pattern portion 372 includes a six track 1st pattern section 372A formed from the 6 track type 1st mandrel cells 262. The 1st pattern portion 372 also includes a five track 1st pattern section 372B formed from the 5 track type 1st mandrel cells 146. Disposed between the two pattern sections 372A and 372B is an ANA 1st pattern section 372C, which is disposed in the predetermined location of the ANA space 341 and will be utilized to define and form the ANA region 422 in the dielectric layer 104.

The six track and five track 1st pattern sections 372A and 372B include similar features and structures. Therefore, for purposes of brevity, only the six track 1st pattern section will be discussed in detail herein. However, the five track 1st pattern section will be illustrated in the following figures.

The 1st pattern section 372A includes a plurality of 1st line space molds 374 which were formed from the 1st mandrel spacers 276-286. The 1st line space molds 374 extend longitudinally in the Y direction. The 1st line space molds 374 define the locations of the lines spaces 230, 236, 238, 240, 242 and 248 of cells 202A and 202B that will be patterned into the dielectric layer 104.

The 1st pattern portion 372 also includes a plurality of 1st and 2nd cut (block) masks 376, formed directly from the 1st and 2nd opening plugs 368. The 1st and 2nd cut masks 376 extend between the line space molds 374 in the X direction. The 1st and 2nd cut masks 376 originated from the 1st and 2nd openings 310, 312 (best seen in FIG. 5). In this embodiment, 1st and 2nd cut masks 376 define the locations of continuity cuts through lines A, C, D, E, F, G, I and J in the metal line cells 202A and 202B.

Some of the 1st and 2nd cut masks 376 originated from 2nd openings that were only partially self-aligned. In other words, some of the cut masks 376 originate from 2nd openings that only partially spanned one of the 1st mandrels 262A, 262B, 262C of 1st mandrel cells 262. As such, those specific cut masks 376 will have a non-self-aligned mask portion 380 associated with the non-self-aligned portions 316 of the 2nd openings 312.

The ANA 1st pattern section 372C includes a plurality of five and six track cell distal end sacrificial masks 381, which were necessarily formed on the distal end sidewalls of the five track and six track mandrel cells 262, 146 that abut the ANA 1st pattern section 372C. These sacrificial masks 381 are unwanted and will be removed later in the process flow.

Figure 28:
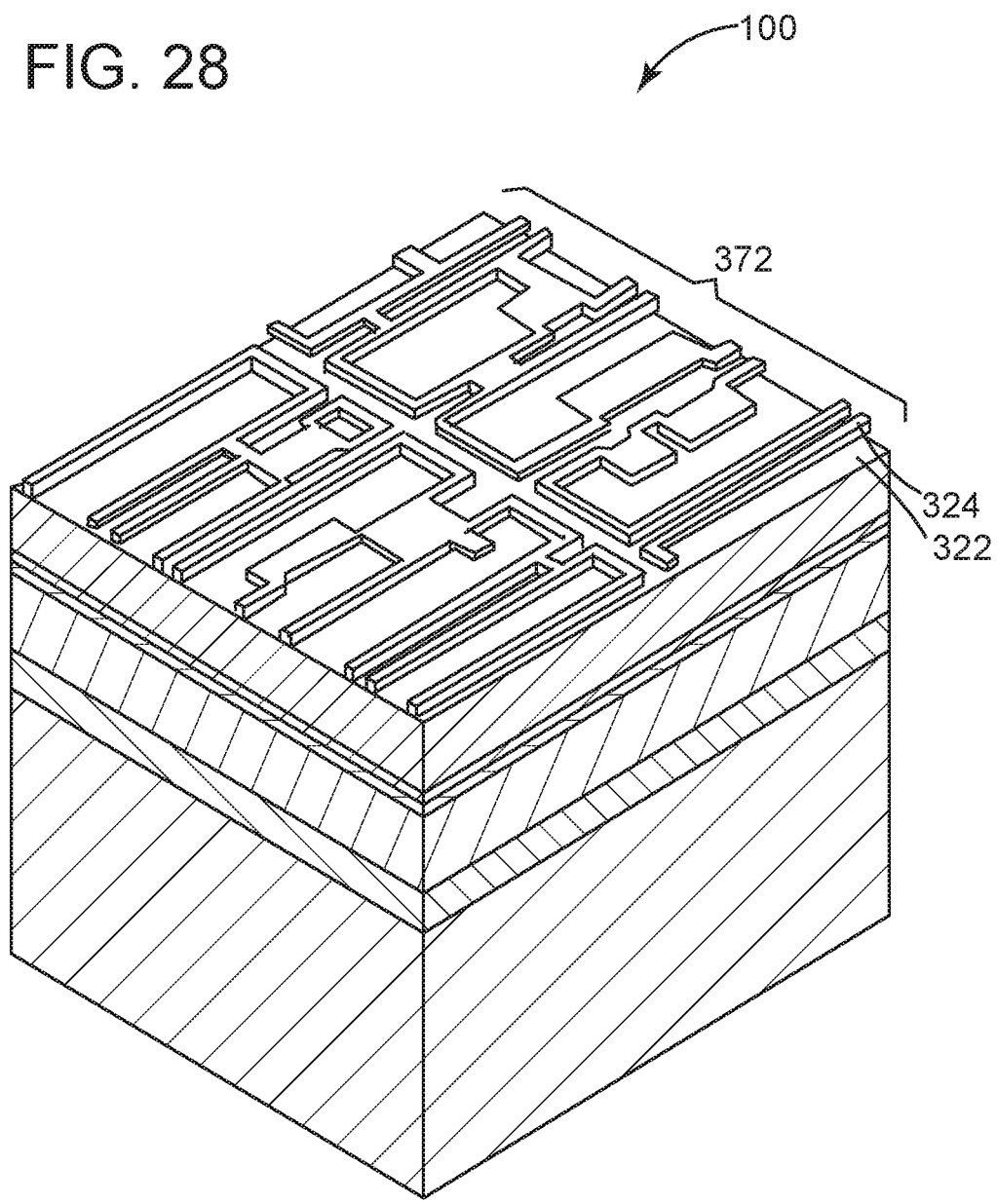
FIG. 28 is a perspective view of FIG. 27A having the 1st pattern portion transferred into the 4th hardmask layer and disposed over the 3rd hardmask layer in accordance with the present invention.

Referring to FIG. 28, the 1st pattern portion 372 is then transferred and memorized into the TiN 4th hardmask layer 324. This can be done with an anisotropic etch process such as a RIE process or similar on the 4th hardmask layer 324, followed by a wet etching process or similar to remove the remnants of the 5th hardmask layer 326.

Figure 29:
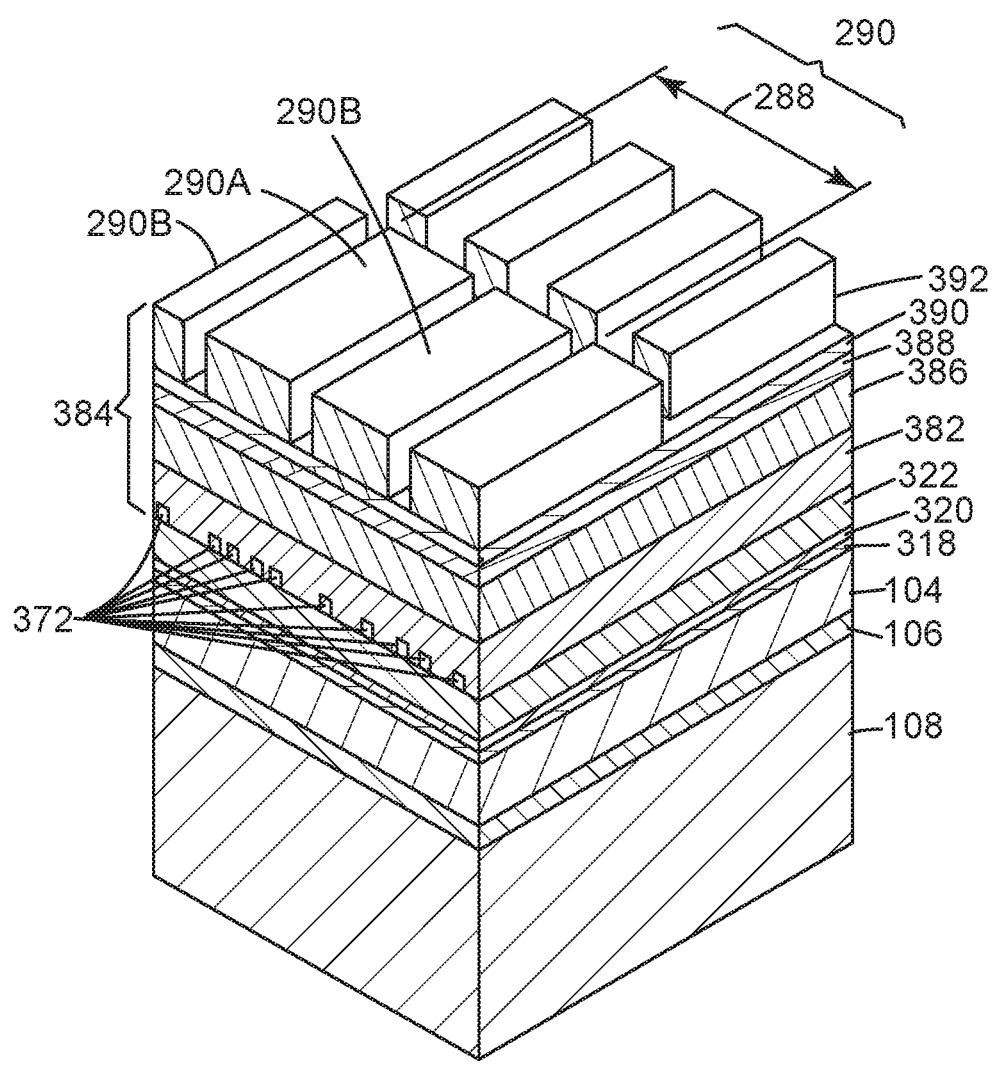
FIG. 29 is a perspective view of the structure of FIG. 28 having a 2nd mandrel layer and a 4th lithographic stack disposed thereon, wherein 2nd mandrel cells having 2nd mandrels are patterned into a 4th resist layer of the 4th lithographic stack in accordance with the present invention.

Referring to FIG. 29, a 2nd aSi mandrel layer 382 is next disposed over the 1st pattern portion 372. A 4th litho stack 384 is then disposed over the 2nd mandrel layer 382. As in the previous litho stacks, the 4th litho stack 384 can be composed of a 4th SOH layer 386, a 4th SiON cap layer 388, a 4th BARC layer 390, and a 4th resist layer 392.

Once the stack 384 is disposed over the 2nd mandrel layer 382, the 2nd mandrel cells 290, which include 2nd mandrels 290A and B, are patterned into the resist layer 392 through well-known lithographic techniques. The 2nd mandrel cells 262 are formed with the substantially same mandrel pitch 288 as the 1st mandrel cells 262.

Figure 30A:
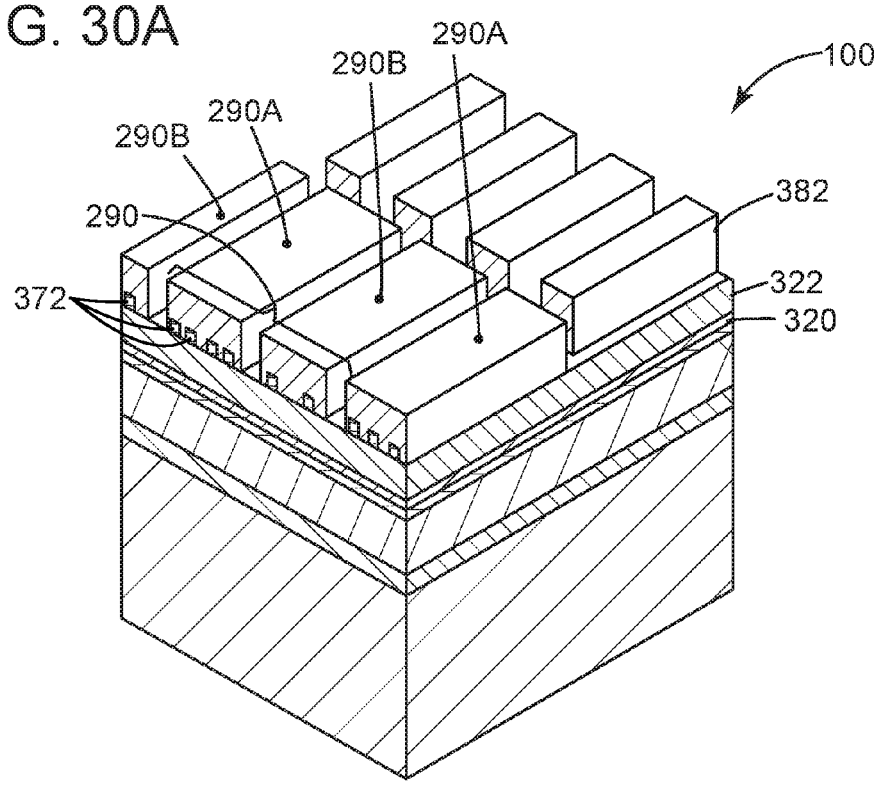
FIG. 30A is a perspective view the structure of FIG. 29 having the 2nd mandrel cells patterned into the 2nd mandrel layer in accordance with the present invention.

Referring to FIG. 30A, the 2nd mandrel cells 290 are next patterned down to the 2nd mandrel layer 382. This can be done through such techniques as a RIE process or similar.

Figure 30B:
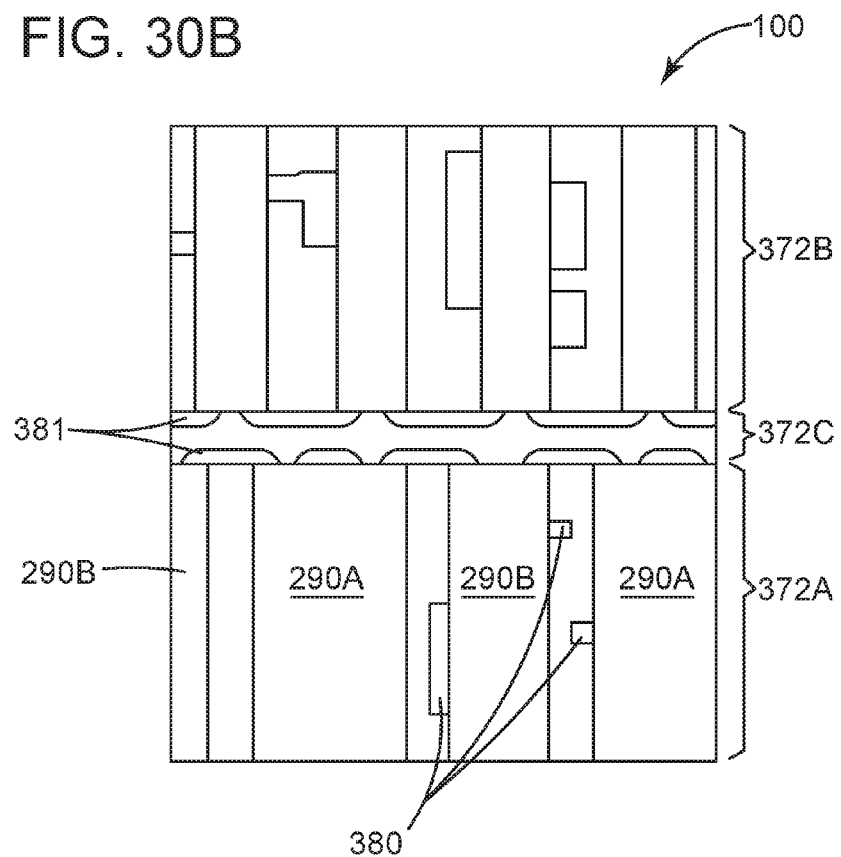
FIG. 30B is a top view of FIG. 30A showing the positioning of the 2nd mandrel cells relative to the 1st pattern portion such that they cover and protect self-aligned portions of the 1st pattern portion and expose non-self-aligned mask portions of the 1st pattern portion in accordance with the present invention.

Referring to FIG. 30B, a top view of FIG. 20A is presented. As can be seen, the 2nd mandrel cells 290 are positioned relative to the 1st pattern portion 372 such that they cover and protect the self-aligned portions of the 1st pattern portion 372. As such, only the non-self-aligned mask portions 380 are left exposed and are not covered by the 2nd mandrels 290A and B. In order to properly cover the self-aligned portions of the 1st pattern portion 372, the positioning of the 2nd mandrel cells 290 relative to the 1st mandrel cells 262 must be such that the 2nd mandrels 290A, 290B entirely overlay at least the 1st mandrel spaces 263A, 263B, 263C (best seen in FIG. 5).

Additionally, the cell distal end sacrificial masks 381 are also exposed in the ANA 1st pattern section 372C. Accordingly, both the non-self-aligned mask portions 380 and the sacrificial masks 381 can now be removed (or repaired).

Figure 31A:
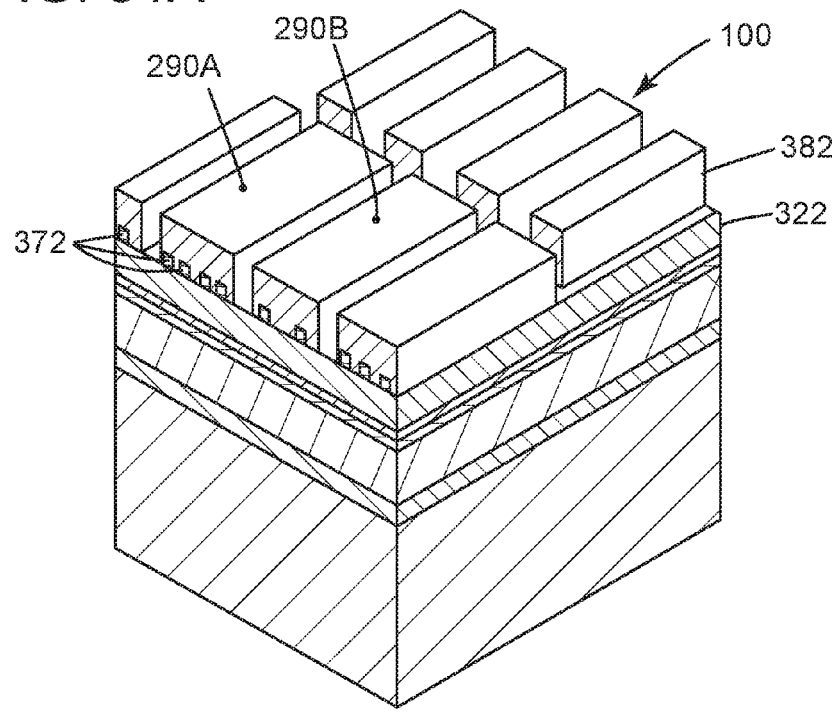
FIG. 31A is a perspective view of FIG. 30A after the non-self-aligned mask portions have been etched away in accordance with the present invention.
Figure 31B:
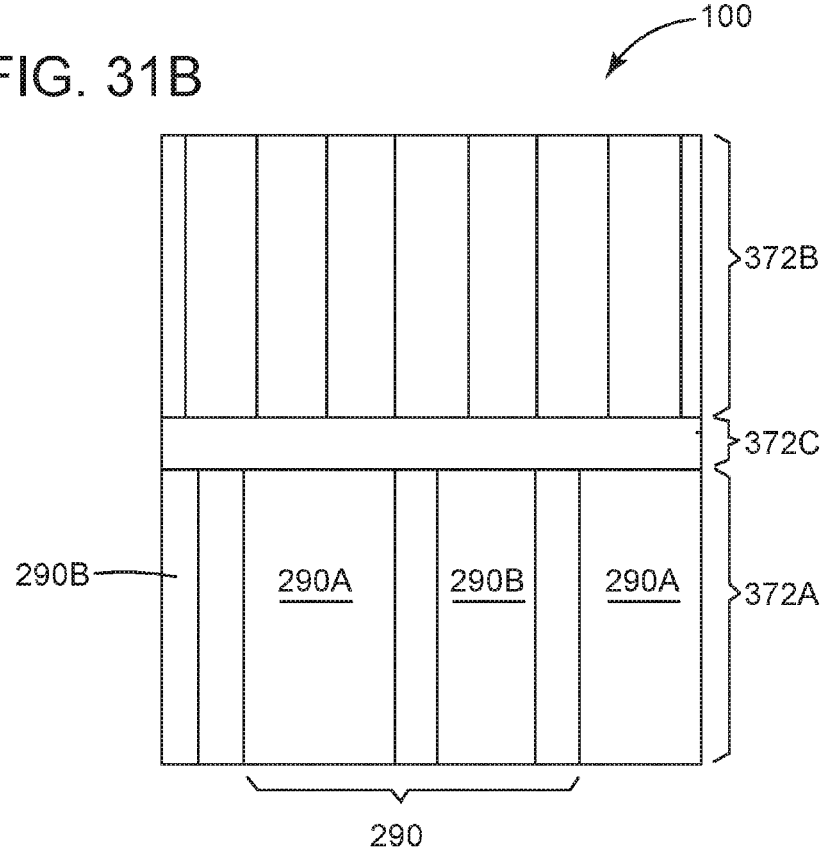
FIG. 31B is a top view of FIG. 31A in accordance with the present invention.

Referring to FIGS. 31A and B, perspective views of FIGS. 30A and 30B after the non-self-aligned mask portions 380 and sacrificial masks 381 are removed is presented. This can be done by a RIE process or similar.

As such, the cut masks 376 that were formed from the partially self-aligned 2nd openings 312 are now fully-self aligned at both of their distal ends with one of the sidewalls of the 1st mandrels 262A, 262B, 262C and one of the sidewalls of the 2nd mandrels 290A, 290B (best seen in FIG. 5). This is important because the 1st mandrel sidewalls 264, 266, 272, 274 will ultimately define one edge of lines A, C, G, I and the 2nd mandrel sidewalls 292, 294, 296, 298 will ultimately define the opposing edge of lines A, C, G, I, across which the now fully self-aligned cut masks 376 will be utilized to form self-aligned 1st and 2nd continuity cuts 418 (best seen in FIG. 46).

Figure 32:
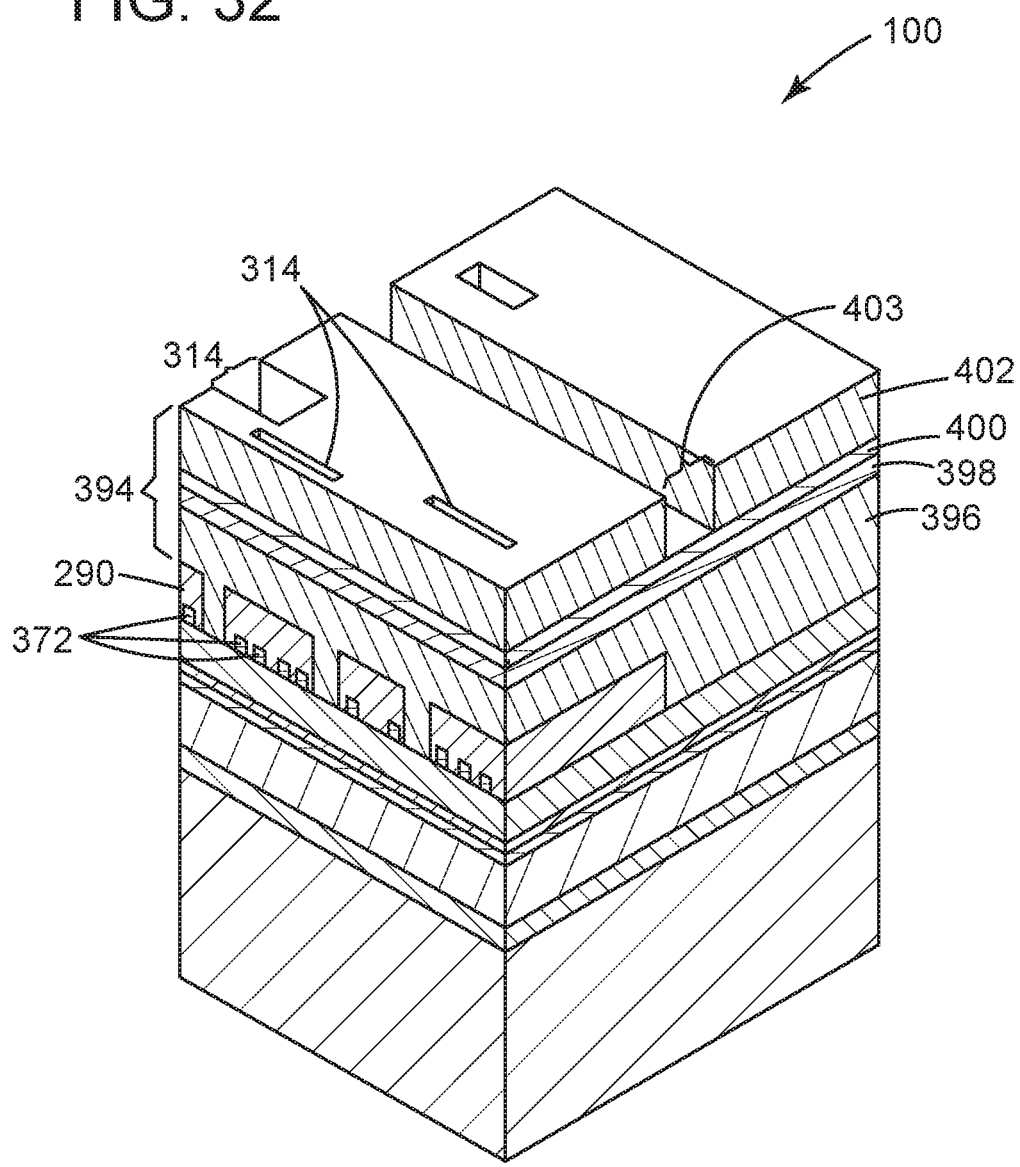
FIG. 32 is a perspective view of the structure of FIG. 31A having a 5th lithographic stack disposed thereon, wherein 3rd openings and an ANA opening are patterned into a resist layer of the 5th lithographic stack in accordance with the present invention.

Referring to FIG. 32, next a 5th litho stack 394 is disposed over the 2nd mandrel cells 290. As before, the 5th litho stack can be composed of a 5th SOH layer 396, a 5th SiON cap layer 398, a 5th BARC layer 400, and a 5th resist layer 402.

The 3rd openings 314 are then lithographically patterned into the 5th resist layer 402 such that they span the 2nd mandrel spaces 291 (best seen in FIG. 5). The 3rd openings 314 also span targeted locations of fully self-aligned continuity cuts 420 (best seen in FIG. 46) in metal lines B and H. Additionally, an ANA opening 403 is also patterned into the resist layer 402.

Figure 33A:
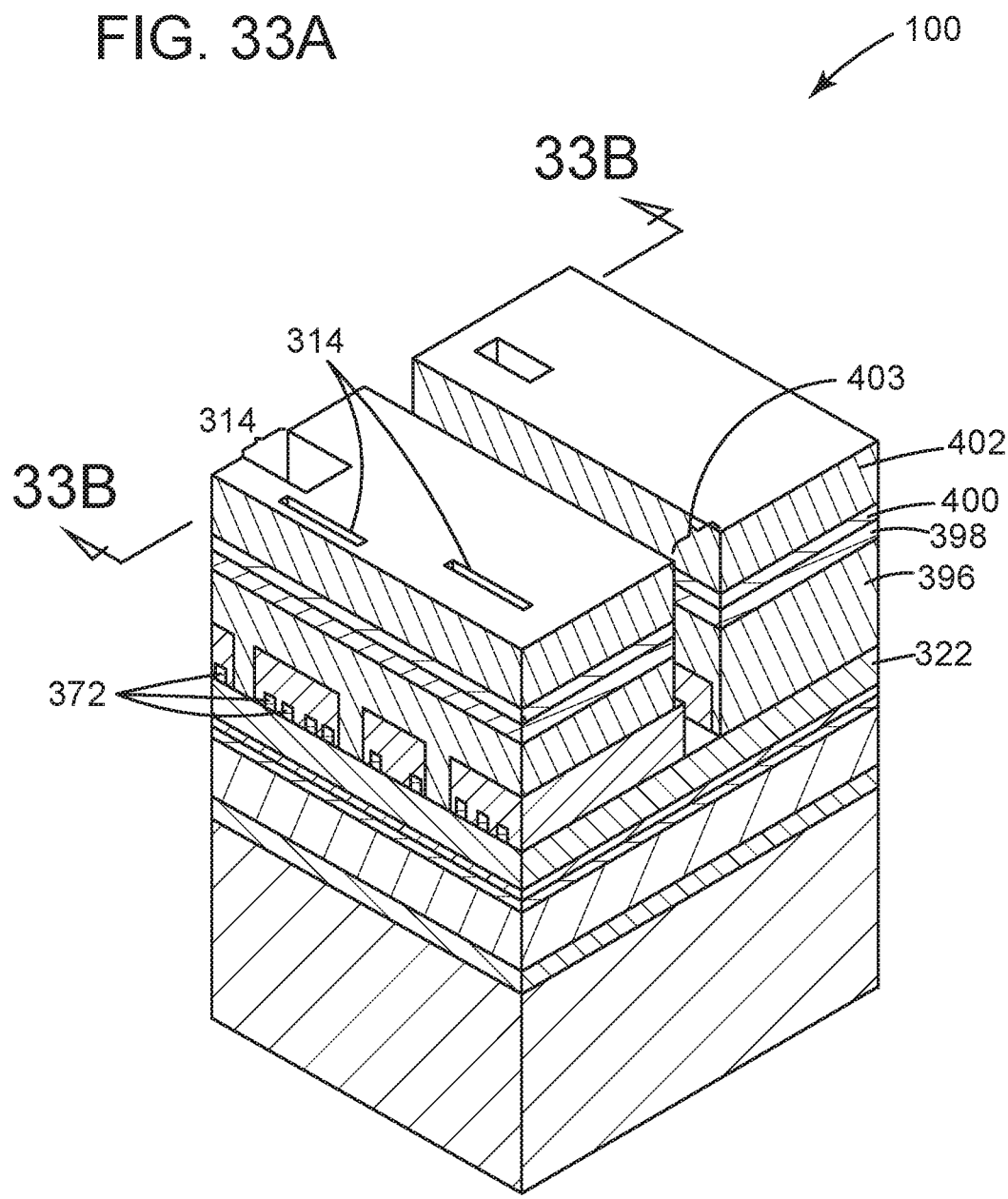
FIG. 33A is a perspective view of FIG. 32 having the 3rd openings and ANA opening etched down to the 3rd hardmask layer in accordance with the present invention.

Referring to FIG. 33A, the 3rd openings 314 and ANA opening 403 are next anisotropically etched down to the SiN 3rd hardmask layer 322. This can be done by a RIE process or similar.

Figure 33B:
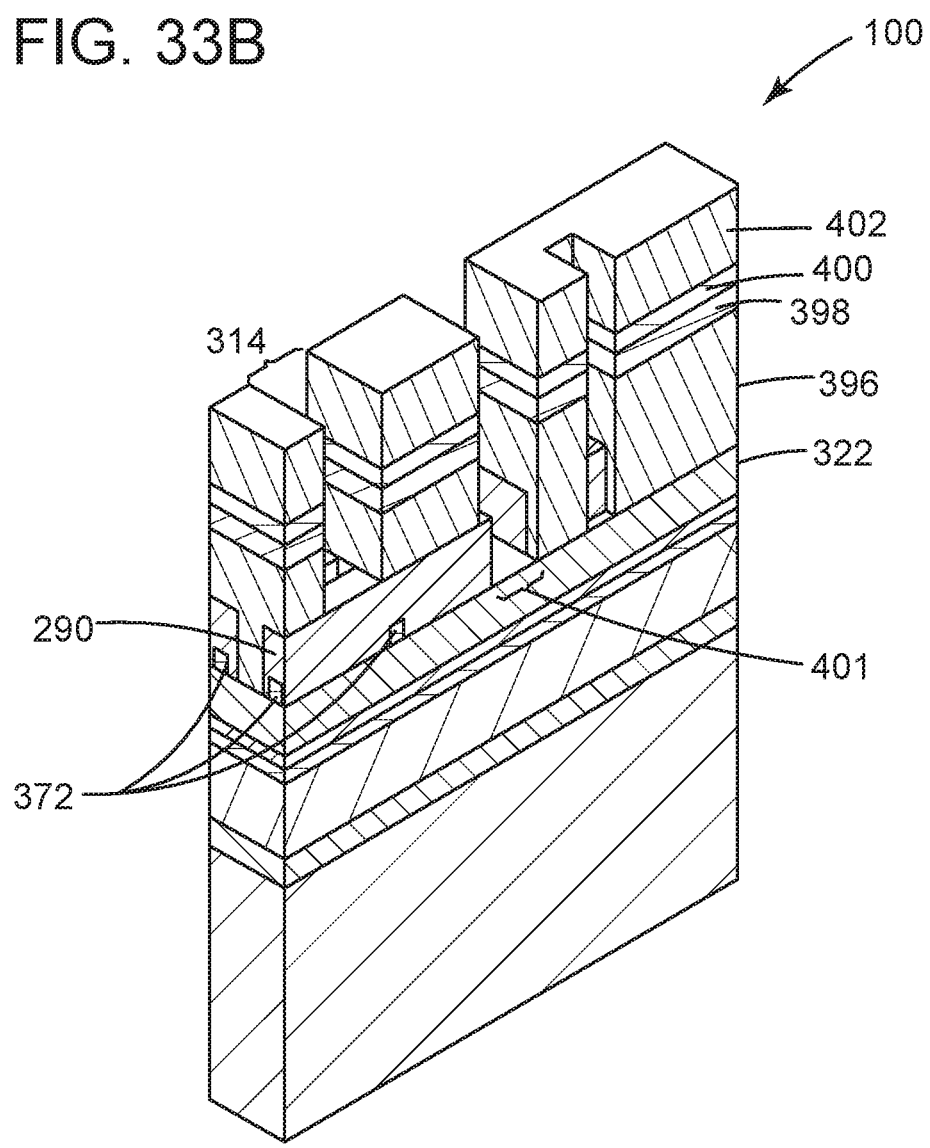
FIG. 33B is a cross-sectional view of FIG. 33A taken along the line 33B-33B in accordance with the present invention.

Referring to FIG. 33B, a cross-sectional perspective view of FIG. 33A taken along line 33B-33B is presented. In this view, it can more clearly be seen that the 3rd openings 314, as well as the ANA opening 403 are disposed on the top surface of the 3rd hardmask layer 322. Additionally, the 3rd opening 314 are now self-aligned with the 2nd mandrel cells 290.

Figure 34:
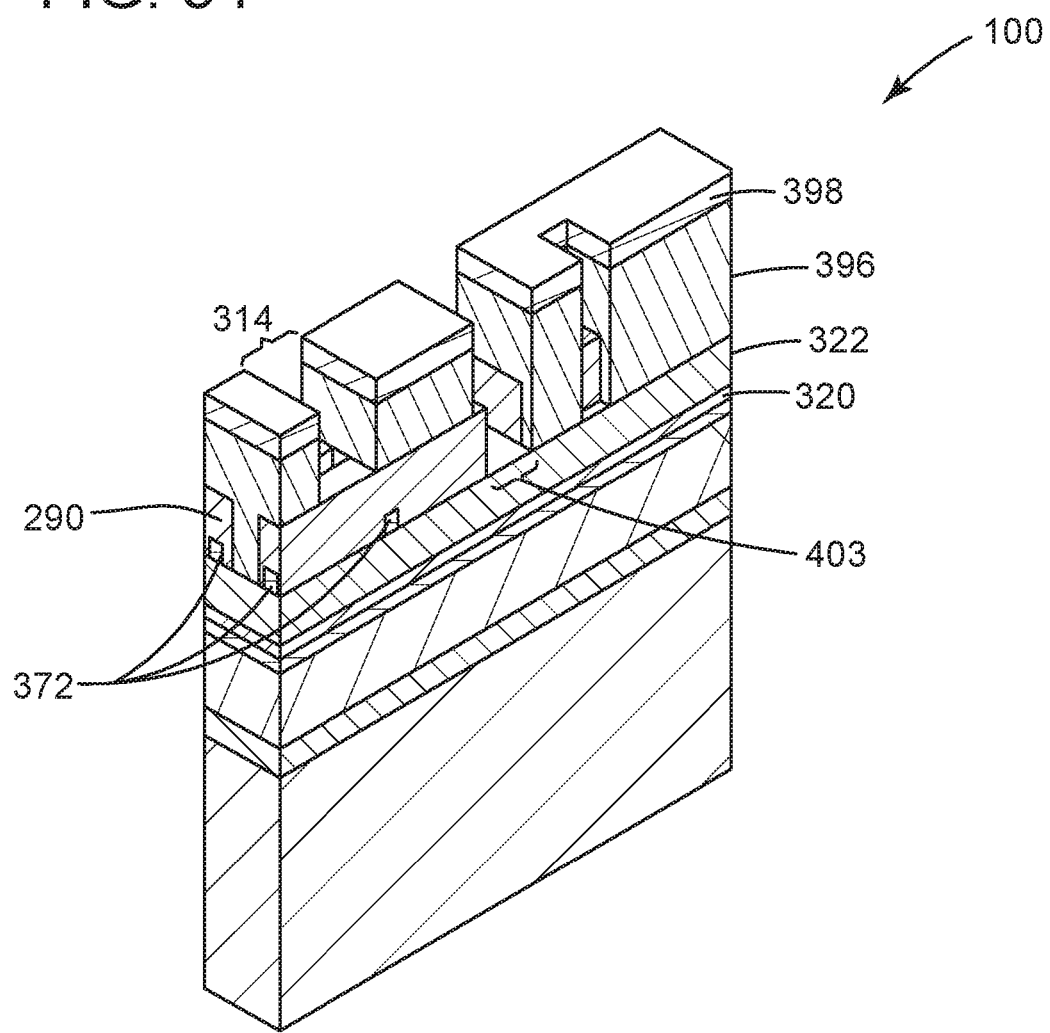
FIG. 34 is a perspective view of FIG. 33B having the 5th resist layer and a 5th BARC layer of the 5th litho stack removed and wherein the 3rd openings and ANA openings are etched down through the 3rd hardmask layer in accordance with the present invention.

Referring to FIG. 34, the 5th resist layer 402 and 5th BARC layer 400 are removed by well-know processes. Next the 3rd openings 314 and ANA opening 403 are anisotropically etched (as, for example, by a RIE process or similar) down past the aSi 2nd mandrel cells 290 and through the SiN 3rd hardmask layer 322 to land on the aSi 2nd hardmask layer 320. Because the mandrel cells 290 and 2nd hardmask layer 320 are composed of the same or similar aSi material, the SiN 3rd hardmask layer 322 may be anisotropically etched selective to the mandrel cells 290 and 2nd hardmask layer 320 such that the sidewalls 292-298 (best seen in FIG. 5) of the 2nd mandrel cells 290 define (or self-align with) the edges of the 3rd openings 314 in the SiN 3rd hardmask layer 322.

Figure 35:
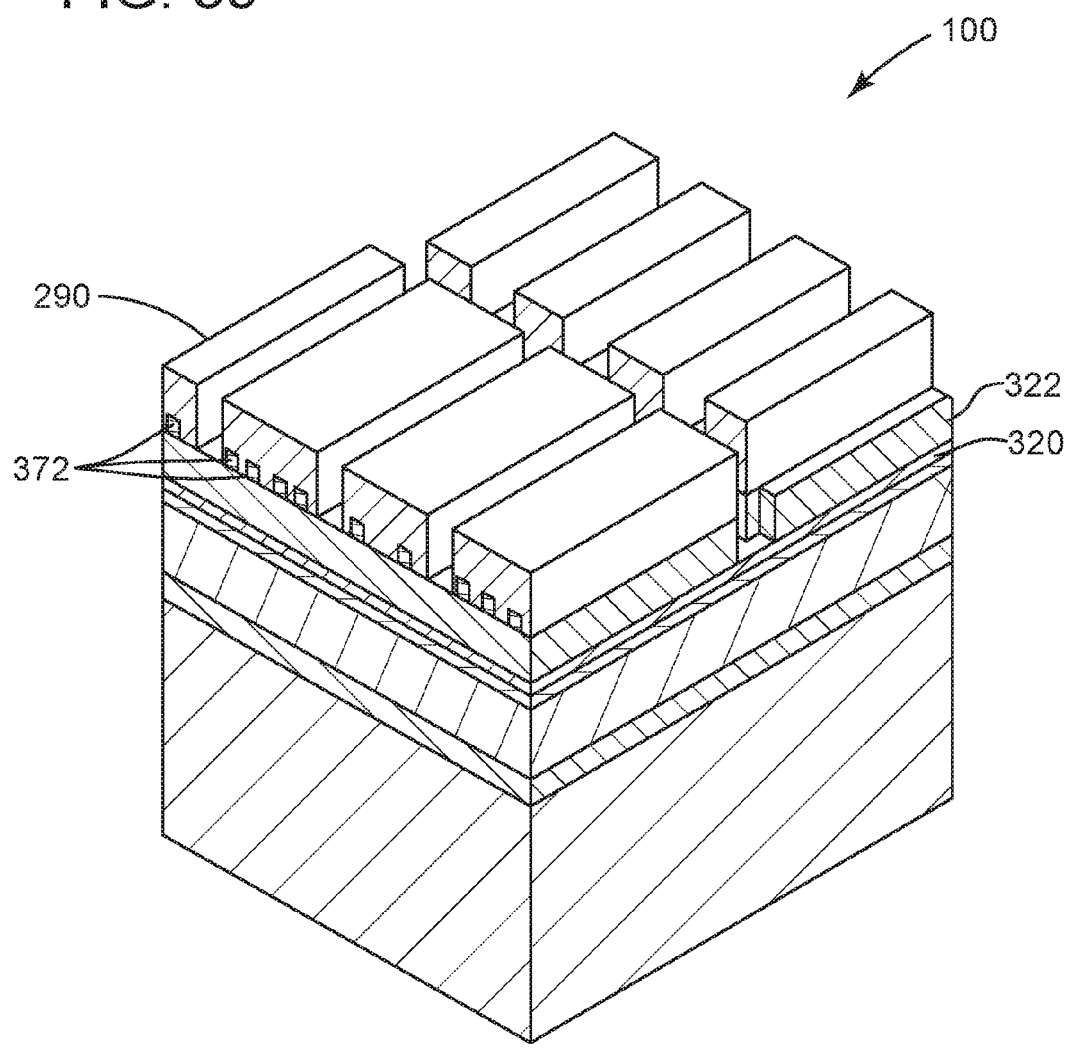
FIG. 35 is a full perspective view of FIG. 34 having a 5th SOH layer of the 5th litho stack stripped off in accordance with the present invention.

Referring to FIG. 35, after the 3rd openings 314 are self-aligned with the sidewalls 292-298 of the 2nd mandrel cells 290 within the 3rd hardmask layer 322, the 5th SOH layer 396 is stripped off of structure 100. This may be done by several well-known processes, such as wet etching, ashing or similar.

Figure 36:
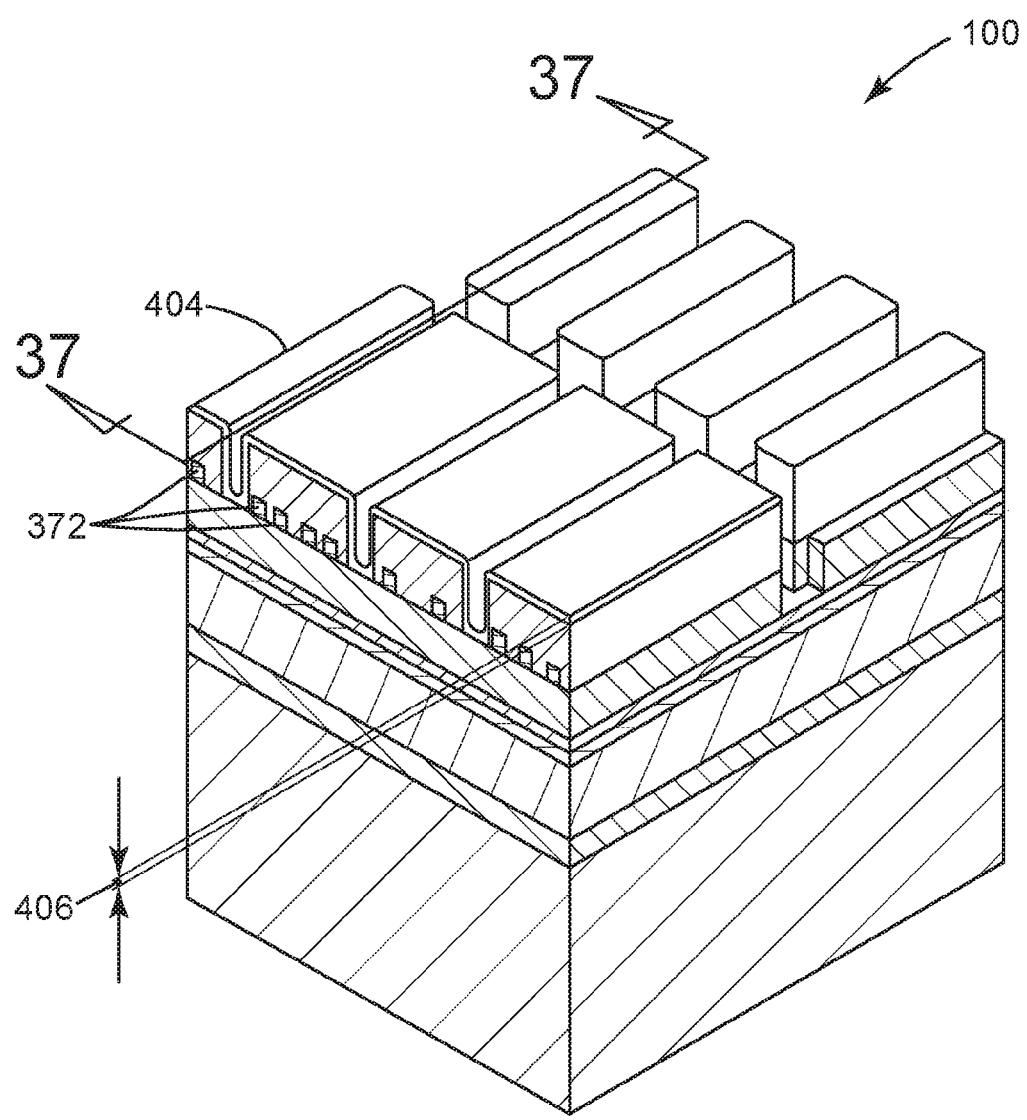
FIG. 36 is a perspective view of FIG. 35 having a 2nd mandrel spacer layer disposed thereon in accordance with the present invention.

Referring to FIG. 36, a perspective view of FIG. 35 having a 2nd mandrel spacer layer 404 dispose thereon is presented. The 2nd mandrel spacer layer 404 has a predetermined 2nd mandrel spacer layer thickness 406 and is conformally coated over 2nd mandrel cells 290. The 2nd mandrel spacer layer 404 may be an oxide layer (such as SiO2) and may be coated over the 2nd mandrel cells 290 by an atomic layer deposition (ALD) process.

Figure 37:
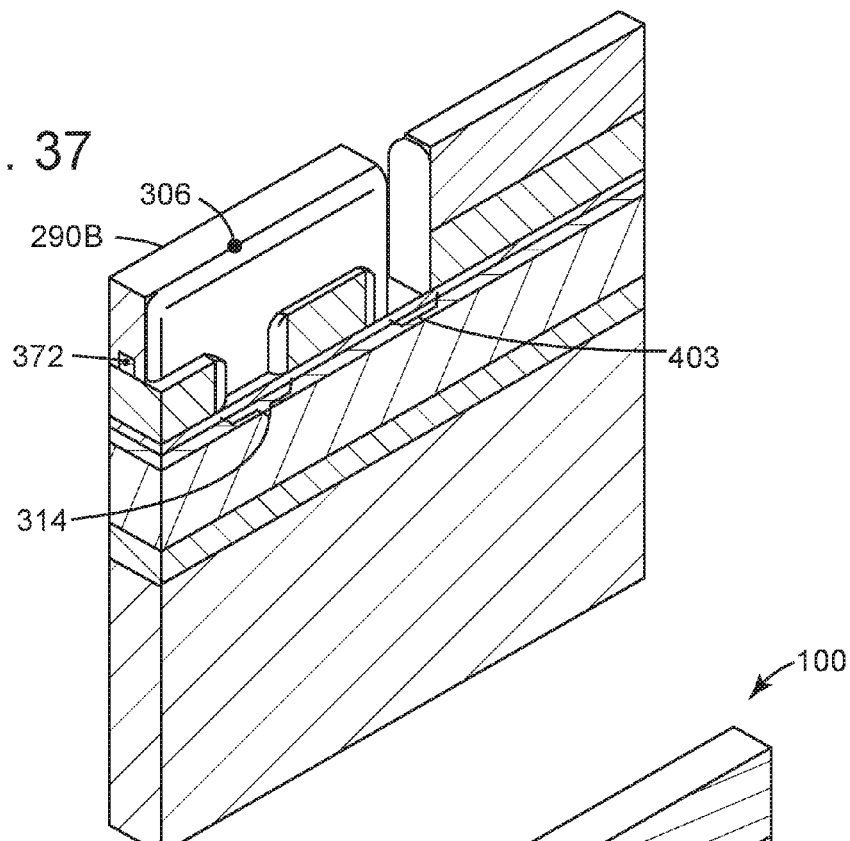
FIG. 37 is a cross-sectional perspective view of FIG. 36 taken along the line 37-37, wherein the 2nd mandrel spacer layer is etched to form 2nd mandrel spacers in accordance with the present invention.

Referring to FIG. 37, a perspective cross-sectional view of FIG. 36 taken along line 37-37 is presented. Next the 2nd mandrel spacer layer 404 is anisotropically etched to form the 2nd mandrel spacers 300-306 (best seen in FIG. 4). This can be done by a RIE process or similar.

Figure 38:
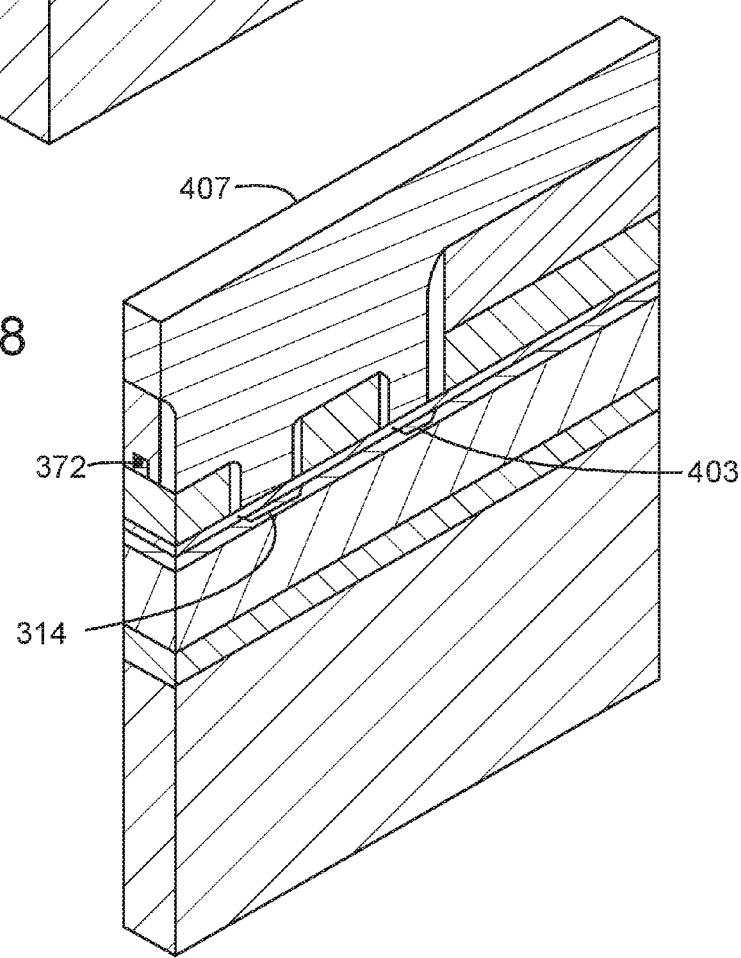
FIG. 38 is a perspective view of FIG. 37 having a 3rd refill layer disposed thereon in accordance with the present invention.

Referring to FIG. 38, a 3rd refill layer 407 is disposed over structure 100. The refill layer 407 may be composed of an SOH material or similar.

Figure 39:
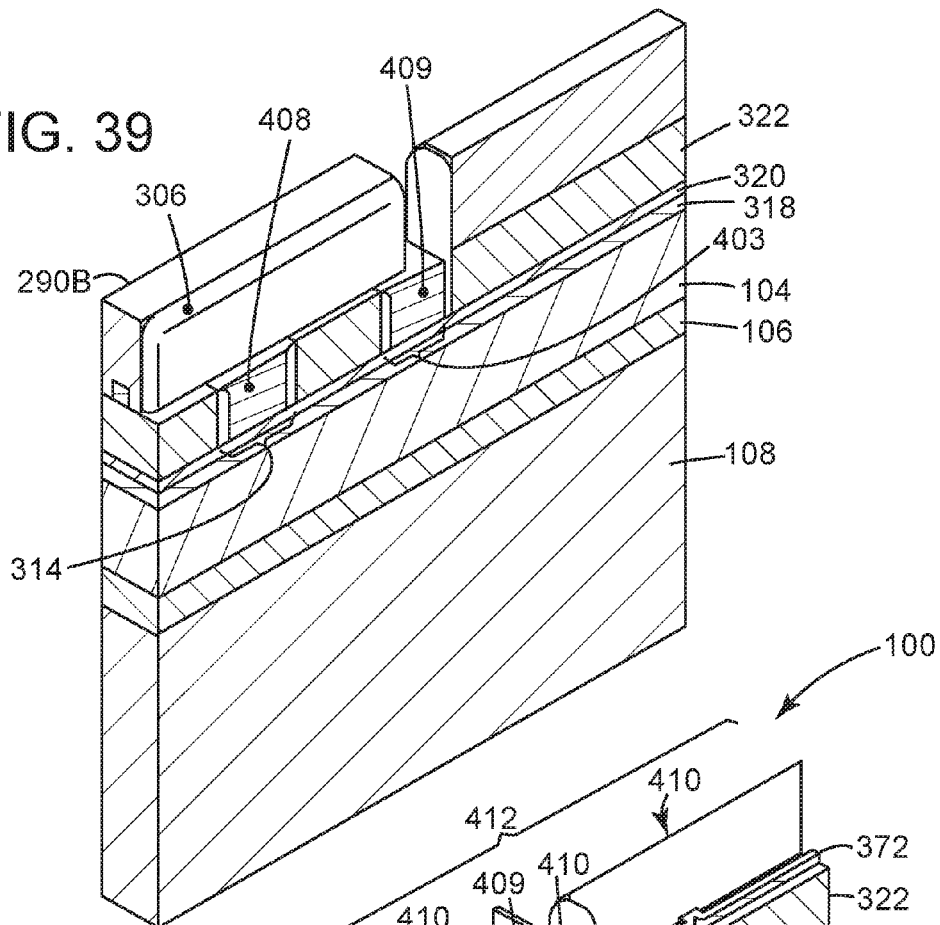
FIG. 39 is a perspective view of FIG. 38 having the 3rd refill layer recess to form 3rd opening plugs and an ANA plug opening in accordance with the present invention.

Referring to FIG. 39, the SOH 3rd refill layer 407 is next recessed down to below the level of the top surface of the SiN 3rd hardmask layer 322 and above the level of the top surface of the aSi 2nd hardmask layer 320. The recessing may be done by an anisotropic etching process, such as a RIE process or similar.

The recessing of the 3rd refill layer 407 is done to expose the top surface of the 3rd hardmask layer 322. The recessing of the refill layer 407 is also done to form a plurality of 3rd opening plugs 408, which fill the 3rd large openings 314 disposed in between the 3rd hardmask layer 322. Additionally, the recessing of the refill layer 407 is done to form an ANA opening plug 409, which fills the ANA opening 403 as well.

Note that the process flow steps of forming the 3rd opening plugs 408, which include, in the following order:
1. disposing the 2nd mandrel spacer layer 404,
2. then etching back the 2nd mandrel spacer layer 404,
3. then disposing the 3rd refill layer 407, and
4. then recessing that refill layer 407, are ordered differently relative to the process flow steps discussed in forming the 1st and 2nd opening plugs 368. That is, the process flow steps of forming the 1st and 2nd opening plugs 368 include, in the following order:
1. disposing the 1st mandrel spacer layer 362,
2. then disposing the 2nd refill layer 366,
3. then recessing that refill layer 366, and
4. then etching back the 1st mandrel spacer layer 362.

More specifically, for formation of the large opening plugs 408, 368, it does not matter if the etching back of the mandrel spacer layer 404, 362 occurs immediately before or after the disposing and recessing of the refill layer 407, 366. Either order will work for purposes of this invention. Structurally the main difference is that, in the formation of the plugs 368 (best seen in FIG. 21), the 1st mandrel spacer layer 362 is disposed below the plugs 368 and, in the formation of the plugs 408 (best seen in 39), the spacer layer 362 is not disposed below the plugs 408.

The SOH 3rd opening plugs 408 will be subjected to certain etching processes later during the process flow. The height of the plugs 408 is defined by the thickness of the 3rd hardmask layer 322. For that reason, the 3rd hardmask layer 322 must be thick enough to allow the plug 408 to survive those etching processes without being entirely etched away. Typically, the thickness of the 3rd hardmask layer 322 is within a range of 50-100 nm and is at least two, three or even four times as thick as the 2nd and 1st hardmask layers 320, 318.

Figure 40:
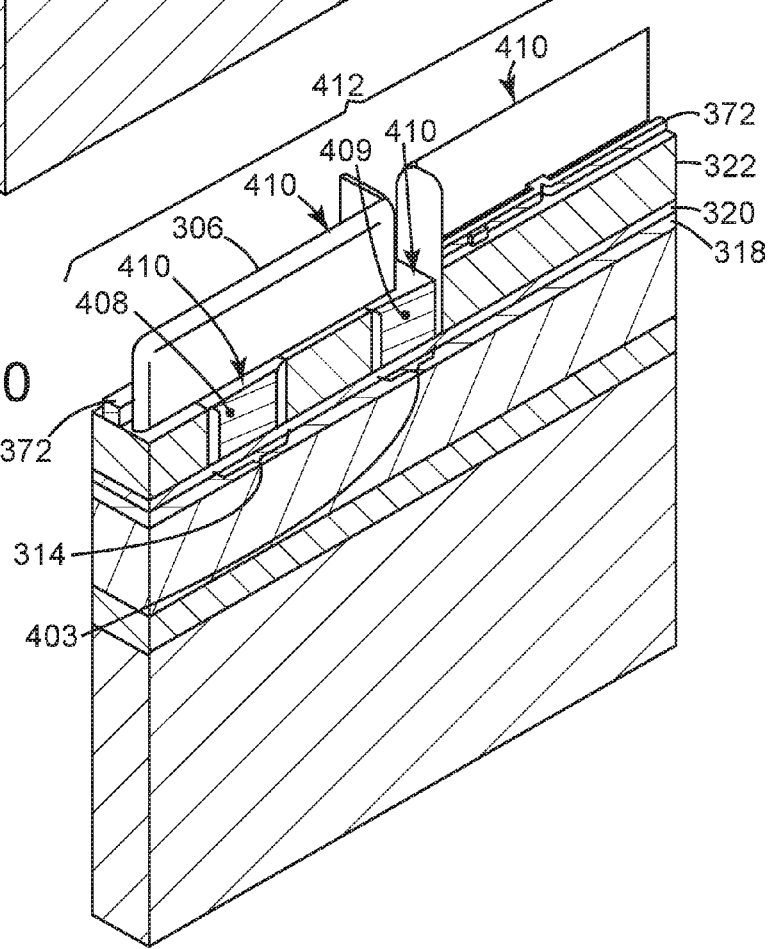
FIG. 40 is a perspective view of FIG. 39 after the 2nd mandrel cells have been removed to reveal a 2nd pattern portion that combines with the 1st pattern portion to form a final pattern in accordance with the present invention.

Referring to FIG. 40, a perspective view of the structure 100 of FIG. 39 after the 2nd mandrel cells 290 have been removed is presented. The 2nd mandrel cells 290 are removed, or stripped, utilizing anyone of several well-known processes, such as a wet etching process, a RIE process or similar As can be seen from FIG. 40, the 2nd mandrel spacers 300-306 have a 2nd spacer width, which is equal to the 2nd mandrel spacer layer thickness 406. Additionally, in this embodiment, the width of the 2nd mandrel spacers 300-306 is set equal to minimum line space width 252 (best seen in FIG. 4).

At this stage of the process flow, the 3rd opening plugs 408 are now fully self-aligned with the sidewalls of the 2nd mandrel spacers 292, 294, 296, 298. This is important because the spacers 300-306 will ultimately define the widths of lines B, H, across which the 3rd opening plugs 408 will be utilized to form self-aligned 3rd continuity cuts 420 (best seen in FIG. 46).

The 2nd mandrel spacers 300-306, the 3rd opening plugs 408 and the ANA plugs collectively form a 2nd pattern portion 410. Additionally, the 2nd pattern portion 410 and the 1st pattern portion 372 combine to form a final pattern 412 (best seen in FIG. 43) which will be utilized to form the lines A, B, C, D, E, F, J, I and continuity cuts 418, 420 of the cells 202A, 202B (best seen in FIG. 46).

Figure 41:
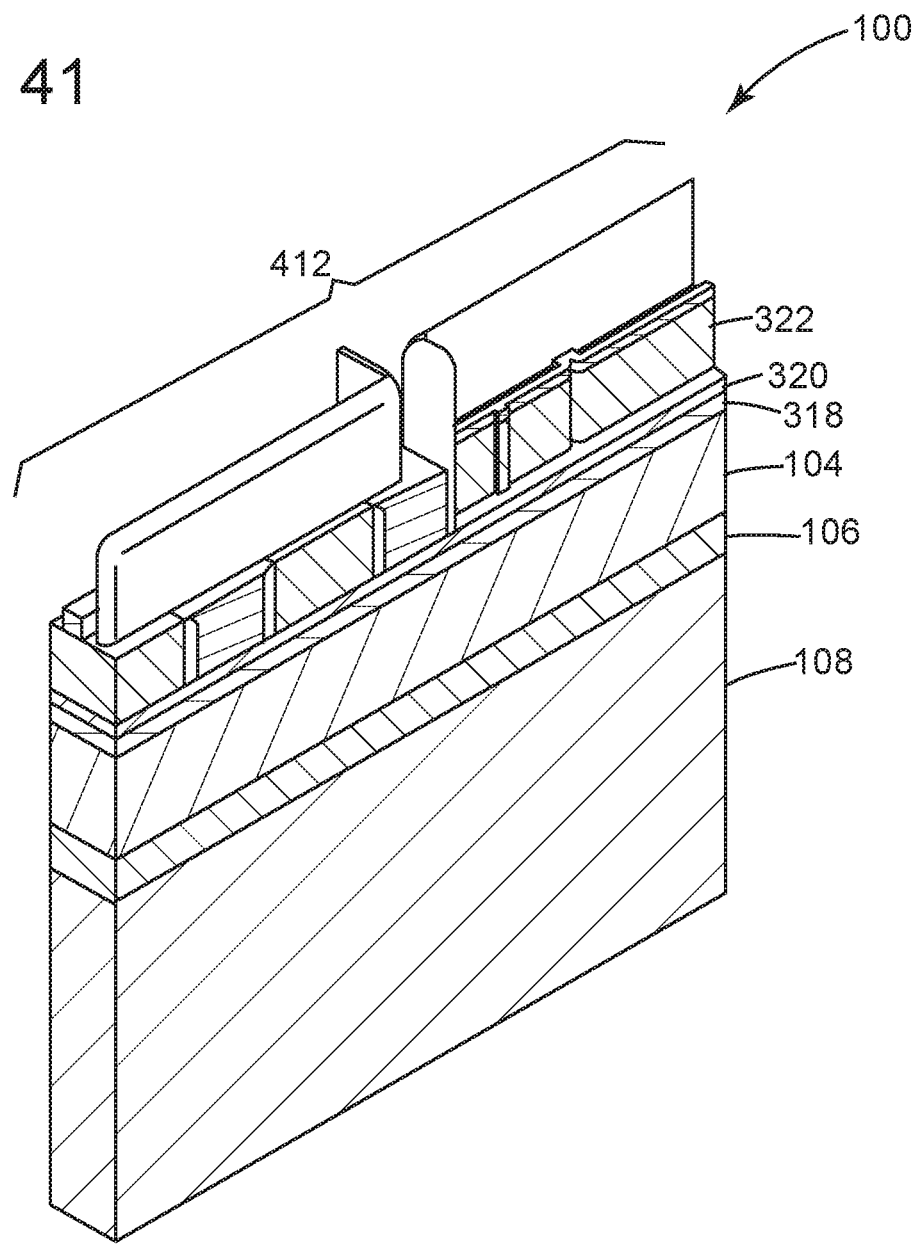
FIG. 41 is a perspective view of FIG. 40 wherein the final pattern is transferred by etching down into the 2nd hardmask layer in accordance with the present invention.

Referring to FIG. 41, the final pattern 412 is next transferred down to the 2nd hardmask layer 320. This is done by anisotropically etching the SiN 3rd hardmask layer 322 with, for example, a RIE process or similar.

Figure 42:
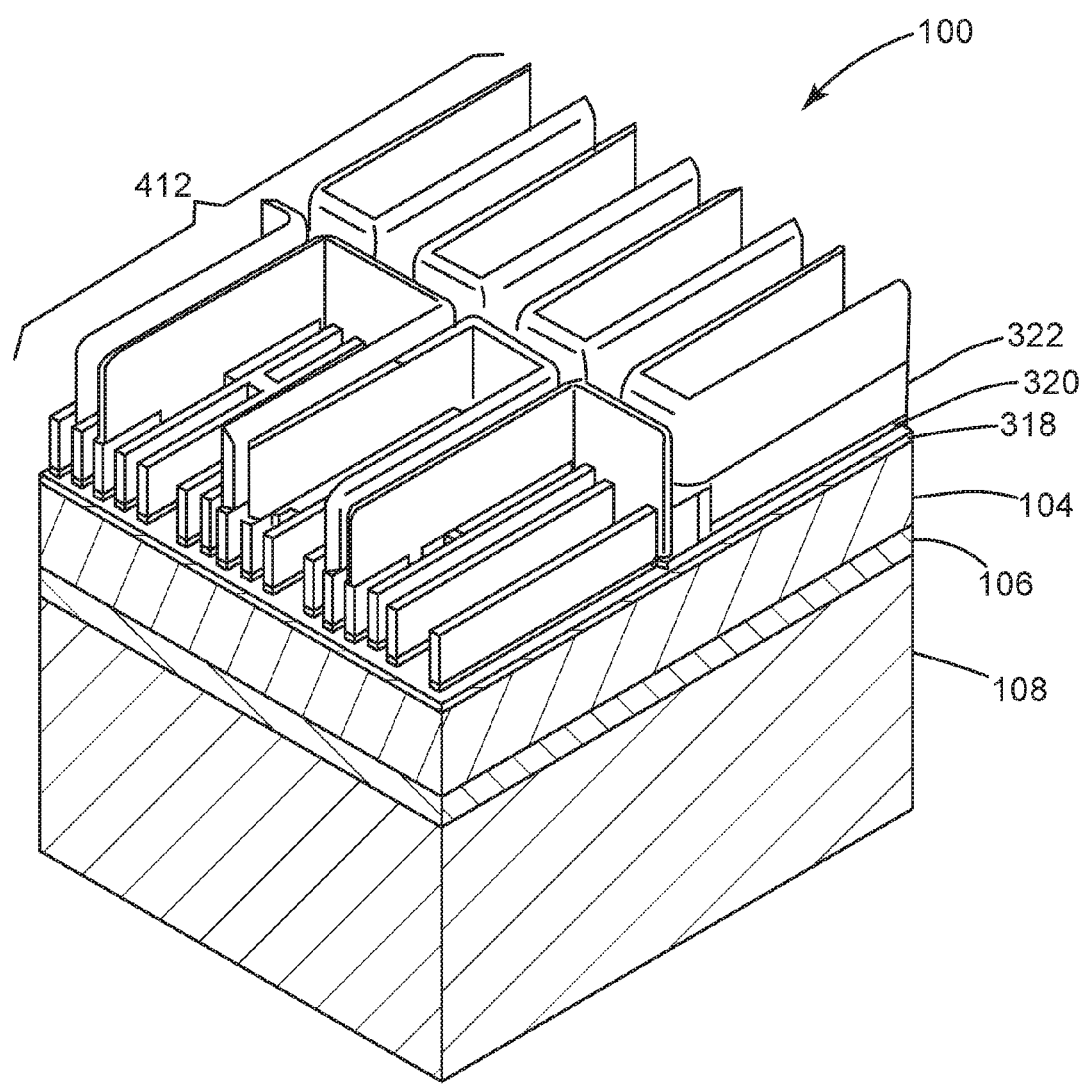
FIG. 42 is a full perspective view of FIG. 41 wherein the final pattern is transferred down to the 1st hardmask layer in accordance with the present invention.

Referring to FIG. 42, the final pattern 412 is next transferred down to the TiN 1st hardmask layer 318. This can also be done by stripping the remnants of the 4th hardmask layer 324 and then anisotropically etching (as by a RIE process or similar) through the 2nd hardmask layer 320.

Figure 43:
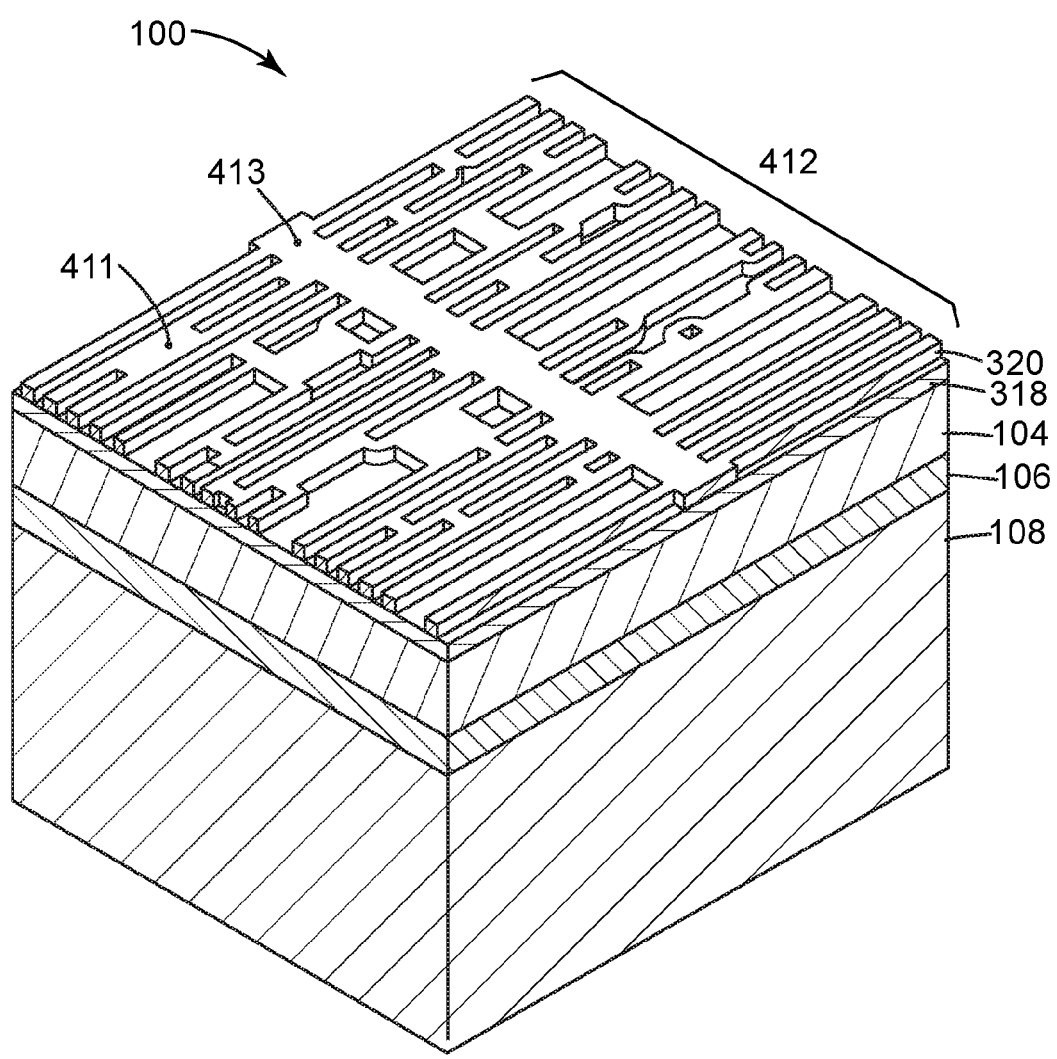
FIG. 43 is a perspective view of the structure of FIG. 42 wherein remnants of the 3rd hardmask layer, the 3rd opening plugs, the ANA opening plug and the 2nd mandrel spacers are removed and the final pattern is now disposed directly over the 1st hardmask layer in accordance with the present invention.

Referring to FIG. 43, the 3rd opening plugs, the ANA opening plugs, the remnants of the 3rd hardmask layer 322 and the 2nd mandrel spacers 300-306 are removed through well known processes. The final pattern 412 now is disposed directly over the TiN 1st hardmask layer 318.

Note that the removal of the 3rd opening plugs 408 forms the 3rd cut (block) masks 411. The 3rd cut masks 411 are fully self-aligned with the positions of the sidewalls of the 2nd mandrels 290A, 290B. Note also that the removal of the ANA opening plug 409 forms the ANA mask 413.

Referring to FIG. 44, the pattern 412 is anisotropically etched into the TiN 1st hardmask layer 318. This can also be done by a RIE process or similar. The pattern 412 is now disposed directly over the dielectric layer 104.

Referring to FIG. 45, the dielectric layer 104 is next anisotropically etched to transfer the final pattern 412 into the dielectric layer 104 in the form of a series of pattern trenches 414. This can be done by a RIE process or similar and then a removal of the remnants of the 1st and 2nd hardmask layers 318, 320 through well know processes. Alternatively, hardmasks 318 and 320 could remain on the wafer at this step (Not illustrated here) and be polished away by subsequent metal CMP.

Referring to FIG. 46, a perspective view of FIG. 45 after structure 100 has been metalized is presented. It is important to note that FIG. 46 is also a perspective view of FIGS. 1-5.

Next during the process flow, the structure 100 is metalized. That is, a metal layer 416 is next disposed over structure 100 to fill the trenches 414. This can be done by PVD, CVD or electroless metal plating or similar. The metal layer 416 may be composed of tungsten, copper, cobalt, ruthenium or similar and may also be a stack composed of a barrier layer like TiN, TaN, Co or Ru and of a fill metal The metal layer 416 is next planarized down to finalize the formation of the cells 202A and 202B into the dielectric layer 104 of the structure 100. This may be done by chemical mechanical polishing or similar. Note that five track cells 102 are also formed into the dielectric layer 104 simultaneously during the same process.

As can be seen, the structure 100 now includes the fully formed metal lines A-E of cells 202A and fully formed the metal lines F-J of cells 202B. The metal line A-E in cells 202A and metal lines cells F-J in cells 202B are substantially identical to each other.

The metal lines A-E of cells 202A are separated by fully formed line spaces 230-238. Additionally, the metal lines F-J of cells 202B are separated by fully formed lines spaces 240-248. The line spaces 230-238 are substantially identical to line spaces 240-248. As discussed in FIGS. 3, 4 and 5, the lines spaces 230-248 are substantially equal in width to each other and to the minimum space width 252. Advantageously, the line spaces are not subject to lithographic variation.

Also, the metal signal lines A-D are set substantially equal in width to each other and to the minimum line width 250. The power lines E and J have widths 218, 228 that are set to be substantially equal to two signal line widths plus one line space width. Advantageously, the widths of the metal lines A-J may vary depending on performance specifications as long as they take into consideration worst case lithographic variation.

However, no matter what the variations of the metal line widths, the widths of the line spaces will not be affected by them. Therefore, the cell structure may be scaled down to minimum pitches of 36 nm, 32 nm, 28 nm, 26 nm or less and still be able to prevent inadvertent electrical shorting between lines.

Additionally, the cells 202A, B include a plurality of large (i.e., greater than the minimum line pitch in both the X and Y directions) self-aligned 1st and 2nd continuity cuts (or continuity blocks) 418 and a plurality of large self-aligned 3rd continuity cuts 420 disposed in the lines A-J. The 1st and 2nd continuity cuts 418 were formed from the 1st and 2nd cut masks 376. The 3rd continuity cuts 420 were formed from the 3rd cut masks 411. The large continuity cuts 418, 420 may be used to provide large cuts through metal lines A-J, remove large sections of multiple metal dummy lines, remove entire dummy lines or similar. All of the cuts 418, 420 may have a length parallel to the metal lines (i.e., the Y direction) that are larger than the minimum line pitch 260. For example, the cuts 418, 420 may be 2, 5, 10, 100 or more times larger than the minimum line pitch 260 in the Y direction.

Further, the structure 100 includes a large ANA region 422 disposed between the six track cells 202A, 202B and the five track cells 102. The ANA region was formed from the ANA mask 413.

Though structure 100 is shown as having cells 102 that are 5 track cells with four metal lines per cell, the cells 102 could be any size track with any even number of metal lines per cell and still be in accordance with the present invention. For example structure 100 could have cells that are 7.5 track cells with 6 metal lines per cell.

Though structure 100 is shown as having cells 202A, 202B that are 6 track cells with five metal lines per cell, the cells 202A, 202B could be any size track with any odd number of metal lines per cell and still be in accordance with the present invention. For example structure 100 could have cells that are 8.5 track cells with 7 metal lines per cell.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
   providing a semiconductor structure having a $1^{st}$ mandrel layer disposed above a hardmask layer, the hardmask layer disposed above a dielectric layer;
   patterning a $1^{st}$ mandrel cell into the 1st mandrel layer, the $1^{st}$ mandrel cell having at least one 1st mandrel;
   patterning and etching an opening into the hardmask layer, the opening being self-aligned with a sidewall of the 1st mandrel;
   disposing a refill layer over the structure;
   recessing the refill layer to a level that is below a top surface of the hardmask layer to form an opening plug that covers a bottom of the opening;
   utilizing the mandrel cell to form a metal line cell into the dielectric layer, the metal line cell having metal lines, metal line spaces, an overall line cell pitch and a minimum line pitch; and utilizing the opening plug to form a continuity cut in a metal line of the metal line cell, the continuity cut having a length parallel to the metal line that is larger than the minimum line pitch.

2. The method of claim 1 wherein:

the opening is one of a $1^{st}$ and a $2^{nd}$ opening;

the opening plug is a $1^{st}$ and $2^{nd}$ opening plug that covers the bottom of the one of a $1^{st}$ and a 2nd opening; and the continuity cut is one of a $1^{st}$ and a $2^{nd}$ continuity cut.

3. The method of claim 2 comprising:

disposing a $2^{nd}$ mandrel layer above the hardmask layer;

patterning a $2^{nd}$ mandrel cell into the $2^{nd}$ mandrel layer, the $2^{nd}$ mandrel cell having at least one $2^{nd}$ mandrel, the $2^{nd}$ mandrel having a pair of opposing sidewalls;

patterning and etching a $3^{rd}$ opening into the hardmask layer, the $3^{rd}$ opening being self-aligned with both opposing sidewalls of the of the $2^{nd}$ mandrel;

disposing another refill layer over the structure;

recessing the another refill layer to a level that is below a top surface of the hardmask layer to form a $3^{rd}$ opening plug that covers a bottom of the $3^{rd}$ opening;

utilizing the $2^{nd}$ mandrel cell to form the metal line cell into the dielectric layer; and utilizing the $3^{rd}$ opening plug to form a $3^{rd}$ continuity cut in a metal line of the metal line cell, the $3^{rd}$ continuity cut having a length parallel to the metal line that is larger than the minimum line pitch.

4. The method of claim 3 comprising:

the $1^{st}$ mandrel cell having at least one $1^{st}$ mandrel space and a mandrel cell pitch;

the $2^{nd}$ mandrel cell having at least one $2^{nd}$ mandrel space and substantially the same mandrel cell pitch;

wherein the overall line cell pitch is substantially equal to the mandrel cell pitch when the metal lines of the metal line cell are an even number, and wherein the overall line cell pitch is substantially equal to half the mandrel cell pitch when the metal lines of the metal line cell are an odd number.

5. The method of claim 3 comprising:

the $1^{st}$ mandrel cell having at least one $1^{st}$ mandrel space and a mandrel cell pitch;

the $2^{nd}$ mandrel cell having at least one $2^{nd}$ mandrel space and substantially the same mandrel cell pitch;

wherein the number of metal lines within the line cell are equal to the sum of the number of $1^{st}$ mandrels within the $1^{st}$ mandrel cell plus the number of 2nd mandrels within the $2^{nd}$ mandrel cell when the metal lines of the metal line cell are an odd number; and wherein the number of metal lines within the line cell are equal to twice the sum of the number of $1^{st}$ mandrels within the $1^{st}$ mandrel cell plus the number of $2^{nd}$ mandrels within the $2^{nd}$ mandrel cell when the metal lines of the metal line cell are an even number.

6. The method of claim 3 comprising:

the $1^{st}$ mandrel cell having at least one $1^{st}$ mandrel space and a mandrel cell pitch;

the $2^{nd}$ mandrel cell having at least one $2^{nd}$ mandrel space and substantially the same mandrel cell pitch; and positioning the 2nd mandrel cell relative to the $1^{st}$ mandrel cell such that the 2nd mandrels entirely overlay the $1^{st}$ mandrel spaces.

7. A method comprising:

providing a semiconductor structure having a $1^{st}$ mandrel layer disposed above a hardmask layer stack, the hardmask layer stack disposed above a dielectric layer;

patterning a plurality of $1^{st}$ mandrel cells into the 1st mandrel layer, the $1^{st}$ mandrel cells each having at least one $1^{st}$ mandrel and a mandrel cell pitch;

etching a plurality of $1^{st}$ openings and $2^{nd}$ openings into the hardmask layer stack, the openings being self-aligned with sidewalls of the $1^{st}$ mandrels;

disposing a $2^{nd}$ refill layer over the structure;

recessing the refill layer to a level that is below a top surface of the hardmask layer stack to form $1^{st}$ and $2^{nd}$ opening plugs that cover bottoms of the openings;

utilizing the $1^{st}$ mandrel cells to form a plurality of metal line cells into the dielectric layer, the metal line cells each having metal lines, an overall line cell pitch and a minimum line pitch; and utilizing the $1^{st}$ and $2^{nd}$ opening plugs to form a plurality of $1^{st}$ and $2^{nd}$ continuity cuts in metal lines of the metal line cells, the continuity cuts having lengths parallel to the metal lines that are larger than the minimum line pitch.

8. The method of claim 7 comprising:

disposing a $2^{nd}$ mandrel layer above the hardmask layer stack;

patterning a plurality of $2^{nd}$ mandrel cells into the $2^{nd}$ mandrel layer, the $2^{nd}$ mandrel cells each having at least one $2^{nd}$ mandrel and substantially the same mandrel cell pitch;

etching a plurality of $3^{rd}$ openings into the hardmask layer stack, the $3^{rd}$ openings being self-aligned with sidewalls of the $2^{nd}$ mandrels;

disposing a $3^{rd}$ refill layer over the structure;

recessing the $3^{rd}$ refill layer to a level that is below a top surface of the hardmask layer stack to form $3^{rd}$ opening plugs that covers the bottoms of the $3^{rd}$ openings; and utilizing the $3^{rd}$ opening plugs to form a plurality of $3^{rd}$ continuity cuts in metal lines of the metal line cells, the $3^{rd}$ continuity cuts having lengths parallel to the metal lines that are larger than the minimum line pitch.

9. The method of claim 8 comprising:

etching an ANA opening into the hardmask layer stack, the ANA opening being adjacent the $1^{st}$ mandrel cells;

disposing the $3^{rd}$ refill layer over the structure to fill the ANA opening;

recessing the $3^{rd}$ refill layer to a level that is below a top surface of the hardmask layer stack to form an ANA opening plug that covers the bottom of the ANA opening; and utilizing the ANA opening plugs to form an ANA region that is adjacent the metal line cells.

10. The method of claim 9 wherein;

the number of metal lines within a line cell are equal to the sum of the number of $1^{st}$ mandrels within a $1^{st}$ mandrel cell plus the number of $2^{nd}$ mandrels within a $2^{nd}$ mandrel cell when the metal lines of the metal line cell are an odd number; and the number of metal lines within a line cell are equal to twice the sum of the number of $1^{st}$ mandrels within a $1^{st}$ mandrel cell plus the number of $2^{nd}$ mandrels within a $2^{nd}$ mandrel cell when the metal lines of the metal line cell are an even number.

11. The method of claim 10 comprising:

the $1^{st}$ mandrel cells having at least one $1^{st}$ mandrel space;

the $2^{nd}$ mandrel cells having at least one $2^{nd}$ mandrel space; and positioning the $2^{nd}$ mandrel cells relative to the $1^{st}$ mandrel cells such that the $2^{nd}$ mandrels entirely overlay the $1^{st}$ mandrel spaces.

12. The method of claim 8 wherein:
the overall line cell pitch is substantially equal to the mandrel cell pitch when the metal lines of the metal line cell are an even number, and
the overall line cell pitch is substantially equal to half the mandrel cell pitch when the metal lines of the metal line cell are an odd number.

13. The method of claim 8 comprising:
disposing a $1^{st}$, $2^{nd}$, $3^{rd}$, $4^{th}$, $5^{th}$ and 6th hardmask layer respectively over the dielectric layer to form the hardmask stack;
etching only the plurality of $1^{st}$ openings into the $6^{th}$ hardmask layer, the $1^{st}$ openings being disposed between $1^{st}$ mandrel spaces and self-aligned with sidewalls of adjacent mandrels;
disposing a $1^{st}$ refill layer over the structure to fill the $1^{st}$ openings; and
recessing the $1^{st}$ refill layer to a level that is below the level of top surfaces of the $1^{st}$ mandrels and above the level of a top surface of the $6^{th}$ hardmask layer.

14. The method of claim 13 comprising:
etching the plurality of $2^{nd}$ openings into the $6^{th}$ hardmask layer, the $2^{nd}$ openings being disposed at least partially across a plurality of $1^{st}$ mandrels and being partially self-aligned at one end with a sidewall of the $1^{st}$ mandrels that the $2^{nd}$ opening are disposed into, the $2^{nd}$ openings also having a non-self-aligned portion at an opposing end that is not self-aligned with a sidewall of the $1^{st}$ mandrels; and
removing the $1^{st}$ refill layer to expose both the $1^{st}$ and $2^{nd}$ openings in the $6^{th}$ hardmask layer.

15. The method of claim 14 comprising:
disposing a $1^{st}$ mandrel spacer layer over the $1^{st}$ mandrel cells; and
performing one of:
first etching back the $1^{st}$ mandrel spacer layer to form $1^{st}$ mandrel spacers on sidewalls of the $1^{st}$ mandrels, then
second executing the steps of disposing and recessing the $2^{nd}$ refill layer to form the $1^{st}$ and $2^{nd}$ opening plugs in the $6^{th}$ hardmask layer, and
first executing the steps of disposing and recessing the $2^{nd}$ refill layer to form the $1^{st}$ and $2^{nd}$ opening plugs in the $6^{th}$ hardmask layer, then
second etching back the $1^{st}$ mandrel spacer layer to form $1^{st}$ mandrels on sidewalls of the $1^{st}$ mandrels.

16. The method of claim 15 comprising:
removing the $1^{st}$ mandrels;
etching exposed portions of the $6^{th}$ hardmask layer down to the level of the $5^{th}$ hardmask layer;
etching exposed portions of the $5^{th}$ hardmask layer down to the level of the $4^{th}$ hardmask layer;
removing the $1^{st}$ and $2^{nd}$ opening plug, the $1^{st}$ mandrel spacers, and any remaining remnants of the $5^{th}$ and $6^{th}$ hardmask layers to reveal a $1^{st}$ pattern portion disposed on the $4^{th}$ hardmask layer, the $1^{st}$ pattern portion having:
$1^{st}$ line space molds formed from the $1^{st}$ mandrel spacers,
$1^{st}$ and $2^{nd}$ cut masks formed from the $1^{st}$ and $2^{nd}$ opening plugs, and
non-self-aligned mask portions formed from the non-self-aligned portions of the $2^{nd}$ openings; and
etching the $4^{th}$ hardmask layer to transfer the $1^{st}$ pattern portion onto the $3^{rd}$ hardmask layer.

17. The method of claim 16 comprising:
disposing the $2^{nd}$ mandrel layer over the $1^{st}$ pattern portion and the $3^{rd}$ hardmask layer of the hardmask layer stack;
patterning the plurality of $2^{nd}$ mandrel cells into the $2^{nd}$ mandrel layer such that only the non-self-aligned mask portions of the $1^{st}$ pattern portion are exposed; and
removing the exposed non-self-aligned mask portions of the $1^{st}$ and $2^{nd}$ cut masks formed from the partially self-aligned $2^{nd}$ openings, wherein those $1^{st}$ and $2^{nd}$ cut masks are now fully self-aligned with sidewalls of both the $1^{st}$ mandrels and $2^{nd}$ mandrels.

18. The method of claim 17 comprising:
etching the $3^{rd}$ openings into the $3^{rd}$ hardmask layer of the hardmask layer stack;
disposing a $2^{nd}$ mandrel spacer layer over the $2^{nd}$ mandrel cells;
performing one of:
first etching back the $2^{nd}$ mandrel spacer layer to form $2^{nd}$ mandrel spacers on sidewalls of the $2^{nd}$ mandrels, then
second executing the steps of disposing and recessing the $3^{rd}$ refill layer to form the $3^{rd}$ opening plugs in the 3rd hardmask layer, and
first executing the steps of disposing and recessing the $3^{rd}$ refill layer to form the $3^{rd}$ opening plugs in the $3^{rd}$ hardmask layer, then
second etching back the $2^{nd}$ mandrel spacer layer to form $2^{nd}$ mandrels spacers on sidewalls of the $2^{nd}$ mandrels; and
removing the $2^{nd}$ mandrels to reveal a $2^{nd}$ pattern portion, the $2^{nd}$ pattern portion including $3^{rd}$ cut masks formed from the $3^{rd}$ opening plugs, the $2^{nd}$ pattern portion combining with the $1^{st}$ pattern portion to form a final pattern.

* * * * *